United States Patent
Danesh et al.

(10) Patent No.: US 10,998,465 B2
(45) Date of Patent: May 4, 2021

(54) LIGHT EMITTING DIODES WITH INTEGRATED REFLECTOR FOR A DIRECT VIEW DISPLAY AND METHOD OF MAKING THEREOF

(71) Applicant: GLO AB, Lund (SE)

(72) Inventors: Fariba Danesh, Los Altos Hills, CA (US); Cameron Dean Danesh, Los Altos Hills, CA (US); Tsun Lau, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 16/679,580

(22) Filed: Nov. 11, 2019

(65) Prior Publication Data

US 2020/0075803 A1 Mar. 5, 2020

Related U.S. Application Data

(63) Continuation-in-part of application No. 15/864,080, filed on Jan. 8, 2018, now Pat. No. 10,553,767.
(Continued)

(51) Int. Cl.
*H01L 33/10* (2010.01)
*H01L 33/60* (2010.01)
(Continued)

(52) U.S. Cl.
CPC .......... *H01L 33/10* (2013.01); *H01L 33/504* (2013.01); *H01L 33/60* (2013.01); *H01L 33/62* (2013.01)

(58) Field of Classification Search
CPC ....... H01L 33/10; H01L 33/504; H01L 33/60; H01L 33/62
See application file for complete search history.

(56) References Cited

U.S. PATENT DOCUMENTS 8,309,439 B2   11/2012   Seifert et al.
8,669,574 B2    3/2014   Konsek et al.
(Continued)

FOREIGN PATENT DOCUMENTS

JP    200214192 A    5/2002
JP   2006108698 A    4/2006
(Continued)

OTHER PUBLICATIONS

Jung, B. O. et al., "Emission Characteristics of InGaN/GaN Core-Shell Nanorods Embedded in a 3D Light-Emitting Diode," Nanoscale Research Letters, vol. 11, No. 215, pp. 1-10, (2016).
(Continued)

*Primary Examiner* — Fernando L Toledo
*Assistant Examiner* — Valerie N Newton
(74) *Attorney, Agent, or Firm* — The Marbury Law Group PLLC

(57) ABSTRACT

A light emitting device includes a substrate including a doped compound semiconductor layer, a mesa structure located on the doped compound semiconductor layer and containing a first-conductivity-type compound semiconductor layer, an active layer stack configured to emit light at a peak wavelength, a second-conductivity-type compound semiconductor layer, and a transparent conductive oxide layer, and a dielectric material layer laterally surrounding the mesa structure and including an upper portion that overlies a peripheral region of the mesa structure and extending above the transparent conductive oxide layer, wherein an opening in the upper portion of the dielectric material layer is located over a center region of the mesa structure.

26 Claims, 64 Drawing Sheets

Related U.S. Application Data

(60) Provisional application No. 62/444,010, filed on Jan. 9, 2017.

(51) Int. Cl.
*H01L 33/62* (2010.01)
*H01L 33/50* (2010.01)

(56) References Cited

U.S. PATENT DOCUMENTS

| | | | |
|---|---|---|---|
| 9,281,442 | B2 | 3/2016 | Romano et al. |
| 9,287,443 | B2 | 3/2016 | Konsek et al. |
| 9,595,649 | B2 | 3/2017 | Konsek et al. |
| 9,664,636 | B2 | 5/2017 | Wen et al. |
| 2004/0188496 | A1 | 9/2004 | Liu |
| 2008/0224158 | A1 | 9/2008 | Sun |
| 2009/0169828 | A1* | 7/2009 | Hersee .................. C30B 29/60 428/172 |
| 2011/0143472 | A1 | 6/2011 | Seifert et al. |
| 2011/0163292 | A1 | 7/2011 | Wang et al. |
| 2011/0254034 | A1* | 10/2011 | Konsek .................. H01L 33/60 257/98 |
| 2012/0181561 | A1* | 7/2012 | Fujimori ............... H01L 33/42 257/98 |
| 2012/0313078 | A1 | 12/2012 | Fukui et al. |
| 2013/0148329 | A1 | 6/2013 | Zhou et al. |
| 2013/0187179 | A1 | 7/2013 | Tan et al. |
| 2014/0159043 | A1 | 6/2014 | Sakariya et al. |
| 2014/0239327 | A1 | 8/2014 | Konsek et al. |
| 2014/0246650 | A1 | 9/2014 | Konsek et al. |
| 2015/0177173 | A1 | 6/2015 | Wen et al. |
| 2015/0207028 | A1 | 7/2015 | Romano et al. |
| 2015/0236202 | A1 | 8/2015 | Chun et al. |
| 2016/0013366 | A1 | 1/2016 | Hwang et al. |
| 2016/0013388 | A1* | 1/2016 | Lee ..................... H01L 27/156 257/13 |
| 2016/0093556 | A1 | 3/2016 | Tu et al. |
| 2016/0093665 | A1 | 3/2016 | Schubert et al. |
| 2017/0227488 | A1 | 8/2017 | Wen et al. |
| 2017/0345969 | A1 | 11/2017 | Romano et al. |

FOREIGN PATENT DOCUMENTS

| | | |
|---|---|---|
| JP | 5464458 B2 | 1/2014 |
| WO | WO2008140611 A2 | 11/2008 |

OTHER PUBLICATIONS

International Search Report and Written Opinion of the International Searching Authority for International Application No. PCT/US2018/012732, dated May 9, 2018, 12 pages.
Notification Concerning Transmittal of International Preliminary Report on Patentability and Written Opinion of the International Searching Authority for International Application No. PCT/US2018/012732, dated Jul. 18, 2019, 9 pages.
EPO Office Communication, Supplemental European Search Report and European Search Opinion, for European Patent Application 18736424.5-1211, dated May 25, 2020, 9 pages.
JPO Office Communication, First Office Action from the Japan Patent Office for Japanese Patent Application No. 2019-537128, dated Jan. 22, 2021, 3 pages.
KIPO Office Communication, Notification of Preliminary Amendment from the Korean Intellectual Property Office for Korean Patent Application No. 10-2019-7020206, dated Mar. 2, 2021, 3 pages.

* cited by examiner

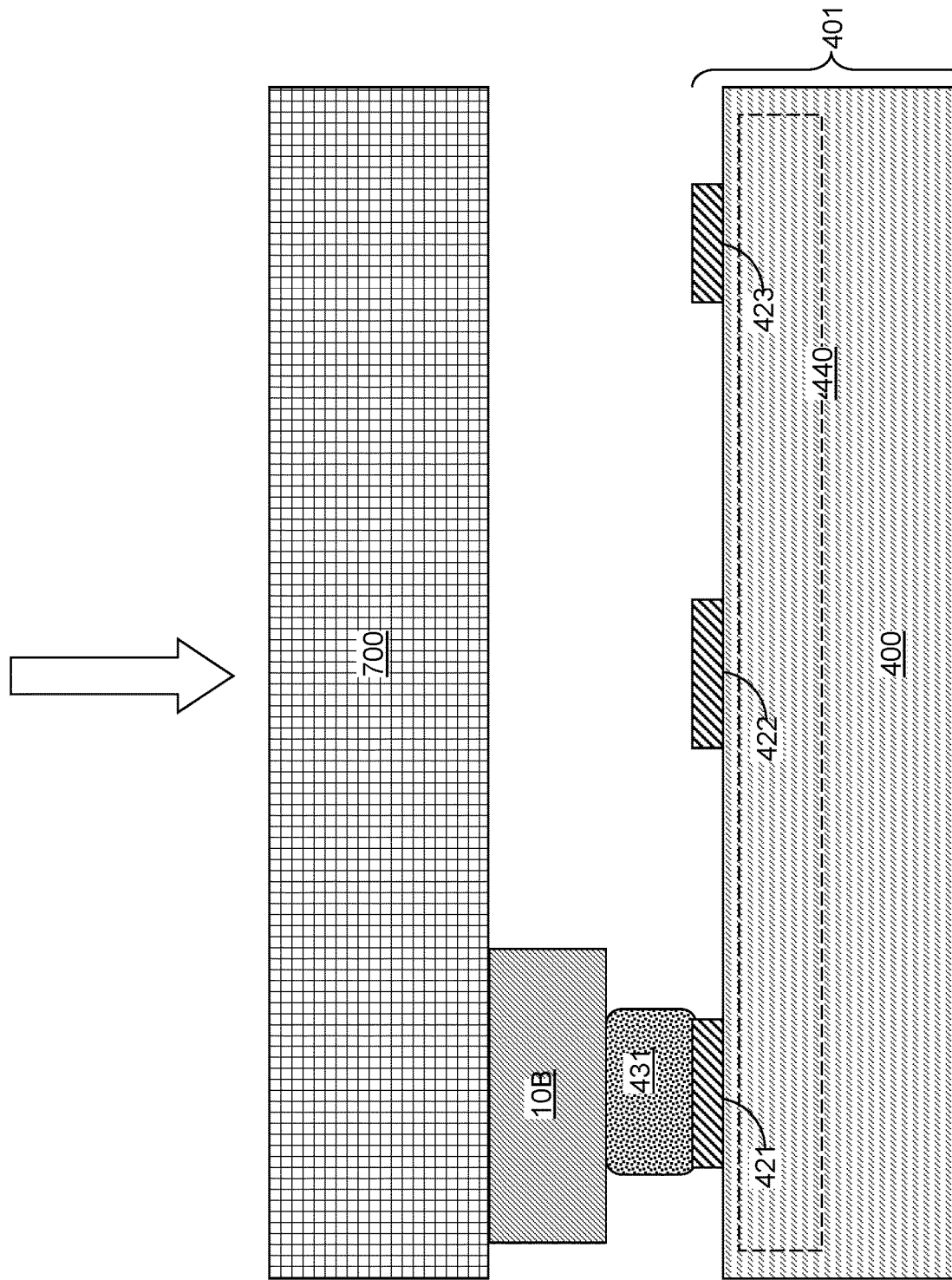

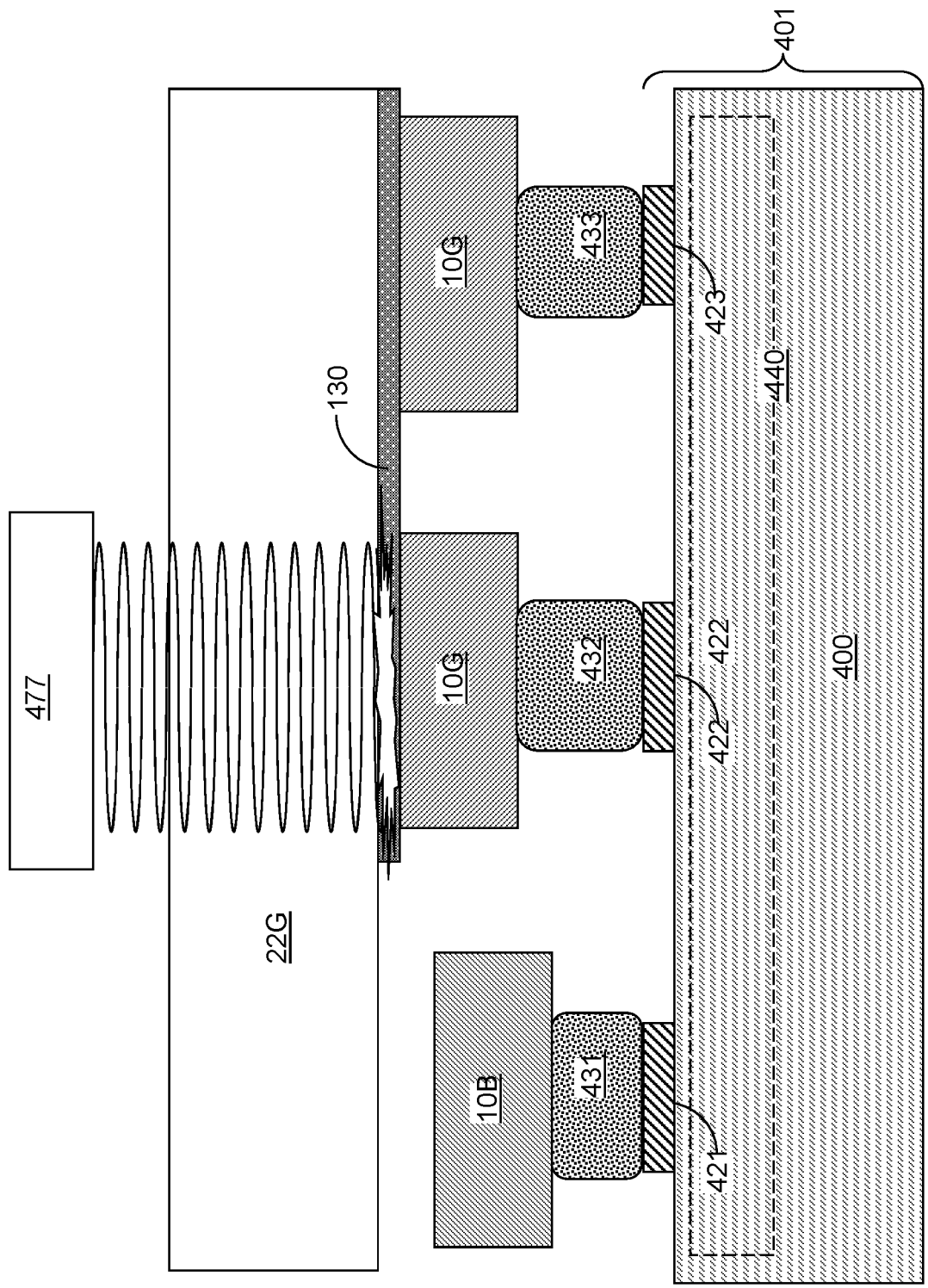

LIGHT EMITTING DIODES WITH INTEGRATED REFLECTOR FOR A DIRECT VIEW DISPLAY AND METHOD OF MAKING THEREOF

RELATED APPLICATIONS

This application is a continuation-in-part application of U.S. application Ser. No. 15/864,080 filed on Jan. 8, 2018, which claims the benefit of priority from U.S. Provisional Application Ser. No. 62/444,010 filed on Jan. 9, 2017, the entire contents of which are incorporated herein by reference.

FIELD

The present invention relates to light emitting devices, and particularly to a nanowire light emitting diode including an integrated reflector and methods of fabricating the same.

BACKGROUND

Light emitting devices such as light emitting devices are used in electronic displays, such as backlights in liquid crystal displays located in laptops or televisions. Light emitting devices include light emitting diodes (LEDs) and various other types of electronic devices configured to emit light.

For light emitting devices, such as light emitting diodes (LED), the emission wavelength is determined by the band gap of the active region of the LED together with thickness determined confinement effects. Often the active region includes one or more bulk semiconductor layers or quantum wells (QW). For III-nitride based LED devices, such as GaN based devices, the active region (e.g., bulk semiconductor layer or QW well layer) material is preferably ternary, such as $In_xGa_{1-x}N$, where $0<x<1$.

The band gap of such III-nitride is dependent on the amount of In incorporated in the active region. Higher indium incorporation will yield a smaller band gap and thus longer wavelength of the emitted light. As used herein, the term "wavelength" refers to the peak emission wavelength of the LED. It should be understood that a typical emission spectra of a semiconductor LED is a narrow band of wavelength centered around the peak wavelength.

SUMMARY

According to an aspect of the present disclosure, a light emitting device is provided, which comprises: a substrate including a doped compound semiconductor layer; a mesa structure located on the doped compound semiconductor layer and comprising a first-conductivity-type compound semiconductor layer, an active layer stack configured to emit light at a peak wavelength, a second-conductivity-type compound semiconductor layer, and a transparent conductive oxide layer; and a dielectric material layer laterally surrounding the mesa structure and including an upper portion that overlies a peripheral region of the mesa structure and extending above the transparent conductive oxide layer, wherein an opening in the upper portion of the dielectric material layer is located over a center region of the mesa structure.

According to another aspect of the present disclosure, a method of forming a light emitting device is provided, which comprises: forming a doped compound semiconductor layer on a substrate; forming a mesa structure over the doped compound semiconductor layer, wherein the mesa structure comprises a first-conductivity-type compound semiconductor layer, an active layer stack configured to emit light at a peak wavelength, a second-conductivity-type compound semiconductor layer, and a transparent conductive oxide layer; forming a dielectric material layer laterally surrounding the mesa structure and including an upper portion that overlies a peripheral region of the mesa structure; and forming an opening through the upper portion of the dielectric material layer over a center region of the mesa structure to expose the transparent conductive oxide layer; forming a continuous reflector layer over the continuous dielectric material layer and in the opening such that the continuous reflector layer electrically contacts the transparent conductive oxide layer; and patterning the continuous reflector layer to form a reflector layer that laterally surrounds the mesa structure and the dielectric material layer.

According to an aspect of the present disclosure, a direct view display device is provided, which comprises: a backplane, and an array of pixels on the backplane, each pixel comprising a red light emitting diode, a green light emitting diode, and a blue light emitting diode. Each of the red light emitting diodes comprises a respective instance of the light emitting device of embodiments of the present disclosure and has a respective peak wavelength in a range from 625 nm to 740 nm. Each of the green light emitting diodes comprises a respective instance of the light emitting device of embodiments of the present disclosure and has a respective peak wavelength in a range from 500 nm to 565 nm. Each of the blue light emitting diodes comprise a respective instance of the light emitting device of embodiments of the present disclosure and has a respective peak wavelength in a range from 430 nm to 485 nm.

According to an aspect of the present disclosure, a light emitting device is provided, which comprises: a substrate including a doped compound semiconductor layer; an array of nanowires extending vertically from a top surface of the doped compound semiconductor layer, wherein each nanowire within the array includes a nanowire core having a doping of a first conductivity type and an active shell including an active light emitting layer; a second-conductivity-type semiconductor material layer contacting sidewalls of each nanowire within the array of nanowires; a reflector layer including a laterally extending portion that overlies the array of nanowires and a sidewall portion that laterally surrounds the array of nanowires; and a conductive bonding structure overlying the reflector layer and comprising a solder material.

According to another aspect of the present disclosure, a light emitting device is provided, which comprises a substrate including a doped compound semiconductor layer, an active light emitting layer, a second-conductivity-type semiconductor material layer, a reflector layer, and a conductive bonding structure overlying the reflector layer and comprising a solder material. The solder material includes a noble metal and tin as an alloy or a layer stack and the solder material is compressible by 5 to 20% of its thickness.

According to yet another aspect of the present disclosure, a method of forming a light emitting device is provided. An array of nanowires is formed over a substrate including a doped compound semiconductor layer. Each nanowire within the array extends vertically from a top surface of the doped compound semiconductor layer, and each nanowire within the array includes a nanowire core having a doping of a first conductivity type and an active shell including an active light emitting layer. A second-conductivity-type semiconductor material layer is formed on sidewalls of the nanowires. A reflector layer is formed over the second-conductivity-type semiconductor material layer. The reflector layer includes a laterally extending portion that overlies the array of nanowires and a sidewall portion that laterally surrounds the array of nanowires. A conductive bonding structure is formed over the reflector layer.

According to another aspect of the present disclosure, a direct view display device comprises a backplane, an array of pixels on the backplane, each pixel comprising a red light emitting diode, a green light emitting diode, and a blue light emitting diode, a dielectric matrix layer laterally surrounding each of the red light emitting diodes, the green light emitting diodes, and the blue light emitting diodes within the array of pixels, and a common transparent conductive oxide layer located on the dielectric matrix layer and electrically connected to contact nodes of the red light emitting diode, the green light emitting diode, and the blue light emitting diode in each pixel.

DETAILED DESCRIPTION

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. A traditional arrangement is to have red, green, and blue (RGB) subpixels within each pixel. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., nanowire) or bulk (e.g., planar) LEDs may be used. Each LED may have a respective blue, green and red light emitting active region to form blue, green and red subpixels in each pixel. In an alternative embodiment, a red emitting active region can be formed over a blue or green active region in one of the LEDs to form a red emitting subpixel in each pixel. In another embodiment, a down converting element (e.g., red emitting phosphor, dye or quantum dots) can be formed over a blue or green light emitting LED to form a red emitting subpixel. In another embodiment, a blue or green light emitting nanowire LED in each pixel is replaced with a regrown red emitting planar LED, such as an organic or inorganic red emitting planar LED to form a red emitting subpixel.

Preferably, the arrays of semiconductor LEDs include nanostructured (e.g., nanowire or nanopyramid) cores, herein referred to as templates, surrounded by shells comprising an active region and a volume element. Such nanostructured LEDs may be considered as "point sources" of light or UV radiation, which are different from bulk (e.g., planar) LED structures comprising elongated stripes or planar bulk semiconductor layers. The templates may comprise a single grown layer, such as a nanowire core, but also be formed from multiple layers as will be described below.

Figure 1B:
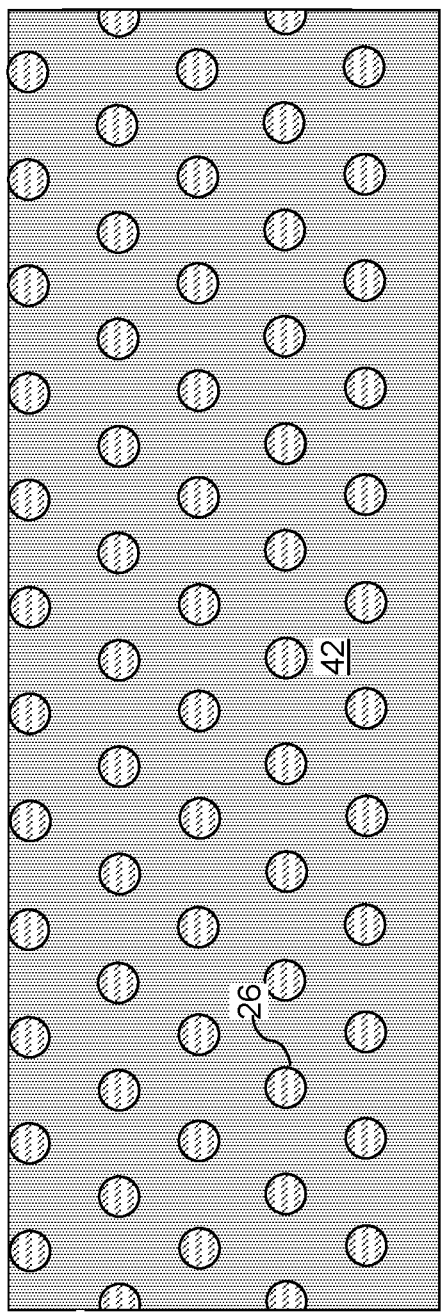
FIG. 1B is a vertical cross-sectional view of the first exemplary structure of FIG. 1A.
Figure 1A:
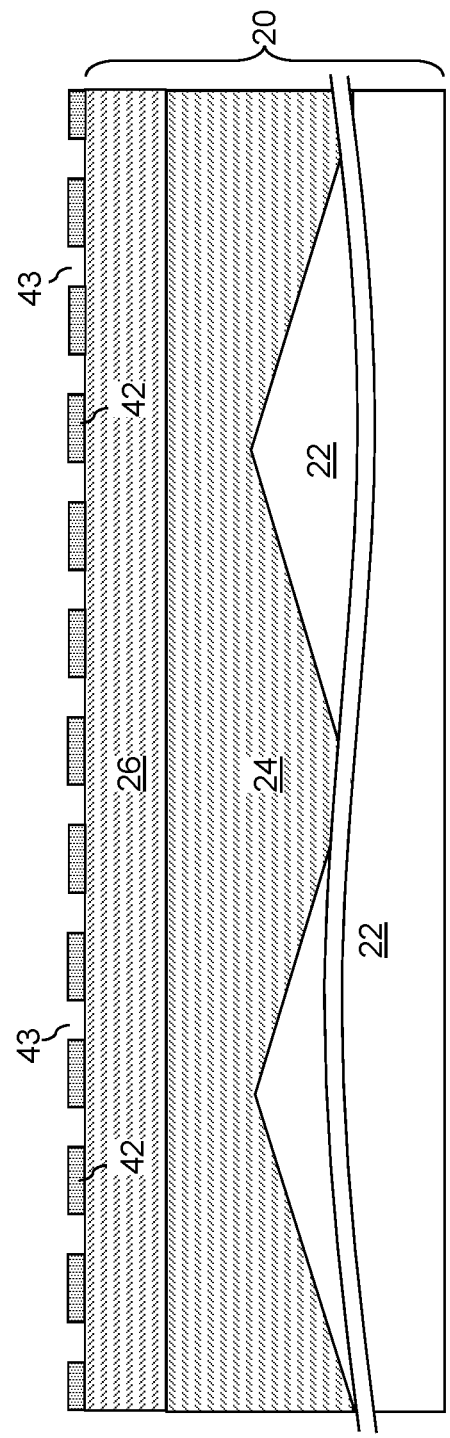
FIG. 1A is a plan view of a first exemplary structure including a substrate and a patterned dielectric mask layer according to an embodiment of the present disclosure.

Referring to FIGS. 1A and 1B, a first exemplary structure includes a substrate 20, which includes a stack, from bottom to top, of a support substrate 22, a buffer layer 24, and a doped compound semiconductor layer 26. The support substrate 22 can include a single crystalline material layer that functions as a template for growing a single crystalline semiconductor material of the buffer layer 24. Any single crystalline material layer can be employed for the support substrate 22 provided that epitaxial growth of a compound semiconductor material, such as a III-V compound semiconductor material, from the top surface of the single crystalline material layer is possible. The support substrate 22 can include a single crystalline material such as $Al_2O_3$ (sapphire) using either basal plane or r-plane growing surfaces, diamond, Si, Ge, GaN, AlN, SiC in both wurtzite ($\alpha$) and zincblende ($\beta$) forms, InN, GaP, GaAsP, GaAs, InP, ZnO, ZnS, and ZnSe. For example, the support substrate 22 can include sapphire (i.e., single crystalline aluminum oxide) with a suitable surface orientation.

The support substrate 22 may comprise a patterned sapphire substrate (PSS) having a patterned (e.g., rough) growth surface. Bumps, dimples, and/or angled cuts may, or may not, be provided on the top surface of the support substrate 22 to facilitate epitaxial growth of the single crystalline compound semiconductor material of the buffer layer, to facilitate separation of the buffer layer 24 from the support substrate 22 in a subsequent separation process and/or to improve the light extraction efficiency through the buffer layer 24. If bumps and/or dimples are provided on the top surface of the support substrate 22, the lateral dimensions of each bump or each dimple can be in a range from 1.5 micron to 6 micron although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The buffer layer 24 includes a single crystalline compound semiconductor material such as a III-V compound semiconductor material. The deposition process for forming the buffer layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The buffer layer 24 can have a constant or a graded composition such that the composition of the buffer layer 24 at the interface with the support substrate 22 provides a substantial lattice matching with the two-dimensional lattice structure of the top surface of the support substrate 22. The composition of the buffer layer 24 can be gradually changed during the deposition process. If a PSS support substrate 22 is used, then the bottom surface of the buffer layer 24 may be a patterned (i.e., rough) surface.

The materials that can be employed for a bottom portion of the buffer layer 24 can be, for example, $Ga_{1-w}In_wAs_1N_{1-y}$ in which w and y can be zero (i.e., GaN) and are selected to match the lattice constant of the top surface of the support substrate 22. Optionally, Al or P may also be employed for the material for the bottom portion of the buffer layer, in which case the bottom portion of the buffer layer 24 can include $Ga_{1-w-z}In_wP_zN_{1-x-y}As_yP_x$ that matches the lattice constant of the top surface of the support substrate 22. The materials that can be employed for an top portion of the buffer layer 24 include, but are not limited to, direct band gap III-V compound materials such as gallium nitride (GaN), aluminum nitride (AlN), gallium phosphide (GaP), gallium arsenide (GaAs), gallium antimonide (GaSb), indium nitride (InN), indium phosphide (InP), indium arsenide (InAs), and indium antimonide (InSb). The composition of the buffer layer 24 can gradually change between the bottom portion of the buffer layer 24 and the top portion of buffer layer 24 such that dislocations caused by a gradual lattice parameter change along the growth direction (vertical direction) does not propagate to the top surface of the buffer layer 24. In one embodiment, a thin bottom portion of the buffer layer 24 less than 1 micron in thickness may be undoped or doped at a low concentration of silicon.

A high quality single crystalline surface with low defect density can be provided at the top surface of the buffer layer 24. Optionally, the top surface of the buffer layer 24 may be planarized to provide a planar top surface, for example, by chemical mechanical planarization. A suitable surface clean process can be performed after the planarization process to remove contaminants from the top surface of the buffer layer 24. The average thickness of the buffer layer 24 may be in a range from 2 microns to 20 microns, although lesser and greater thicknesses can also be employed.

The doped compound semiconductor layer 26 is subsequently formed directly on the top surface of the buffer layer 24. The doped compound semiconductor layer 26 includes a doped compound semiconductor material having a doping of a first conductivity type. The first conductivity type can be n-type or p-type. In one embodiment, the first conductivity type can be n-type.

The doped compound semiconductor layer 26 can be lattice matched with the single crystalline compound semiconductor material of the top portion of the buffer layer 24. The doped compound semiconductor layer 26 may, or may not, include the same compound semiconductor material as the top portion of the buffer layer 24. In one embodiment, the doped compound semiconductor layer 26 can include an n-doped direct band gap compound semiconductor material. In one embodiment, the doped compound semiconductor layer 26 can include n-doped gallium nitride (GaN). The deposition process for forming doped compound semiconductor layer 26 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The thickness of the doped compound semiconductor layer 26 can be in a range from 100 nm to 2 microns, although lesser and greater thicknesses can also be employed.

A patterned dielectric mask layer 42 can be formed on the top surface of the substrate 20. The patterned dielectric mask layer 42 can be formed, for example, by depositing a dielectric material layer and patterning the dielectric material layer to form openings therein. For example, a silicon nitride layer, a silicon oxide layer, or a dielectric metal oxide layer (such as an aluminum oxide layer) can be formed on the top surface of the substrate 20. In one embodiment, the dielectric material layer can include a silicon nitride layer. The thickness of the dielectric material layer can be in a range from 3 nm to 100 nm, although lesser and greater thicknesses can also be employed.

A photoresist layer (not shown) can be applied over the top surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of nanowires to be subsequently formed. The pattern of the openings in the photoresist layer can be transferred through the dielectric material layer to form the patterned dielectric mask layer 42. The photoresist layer can be subsequently removed, for example, by ashing.

The patterned dielectric mask layer 42 includes openings 43, which may, or may not, be arranged as a two-dimensional periodic array. The shape of each opening 43 may be circular, elliptical, or polygonal (such as hexagonal). The maximum lateral dimension of each opening 43 in the patterned dielectric mask layer 42 can be in a range from 10 nm to 1,000 nm, such as from 30 nm to 300 nm, although lesser and greater maximum lateral dimensions can also be employed. A portion of the top surface of the doped compound semiconductor layer 26 is physically exposed underneath each opening 43 through the patterned dielectric mask layer 42.

While a region of the first exemplary structure is illustrated herein, it is understood that the first exemplary structure can laterally extend along two independent horizontal directions as a two-dimensional array. Thus, multiple instances of the illustrated structures in the drawings can be formed in the first exemplary structure, which is typically the case during commercial production of the devices of the present disclosure.

Figure 2:
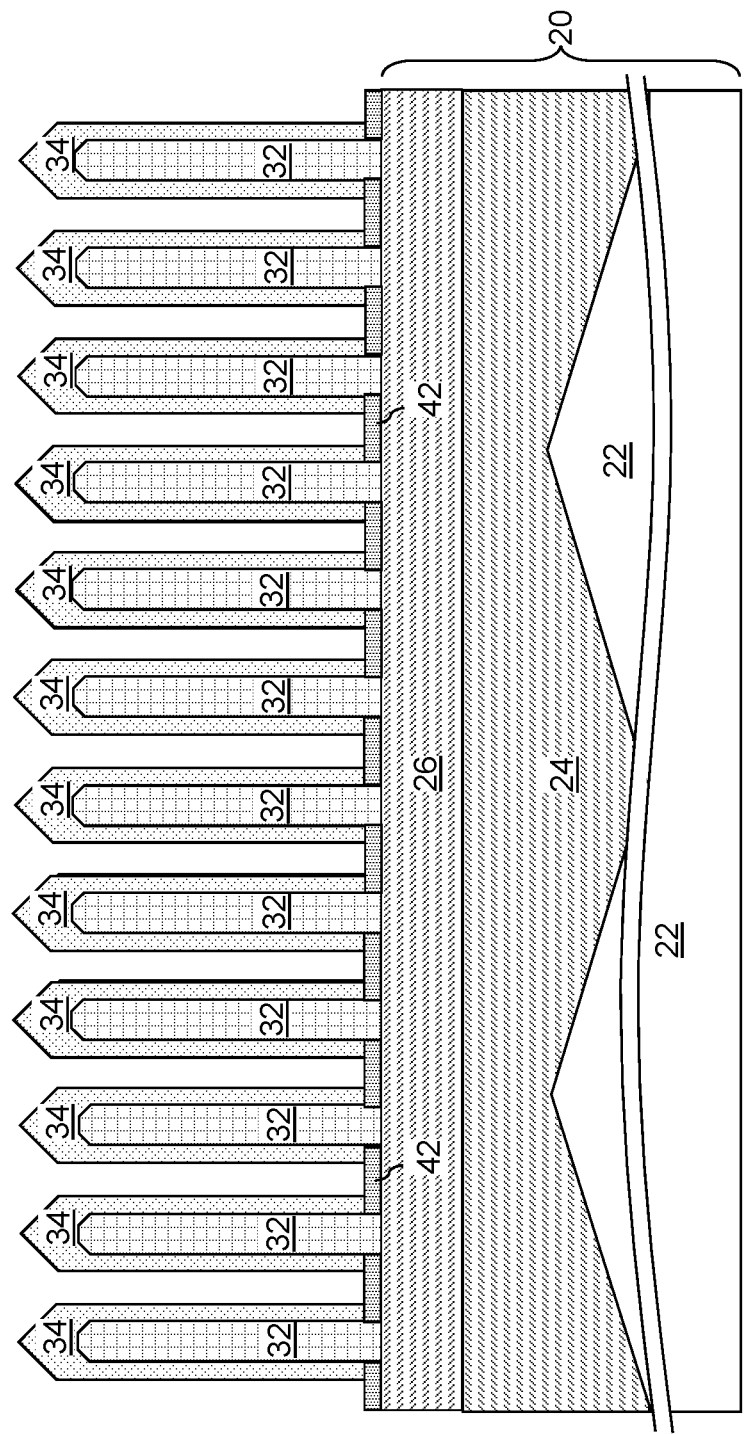
FIG. 2 is a vertical cross-sectional view of the first exemplary structure after formation of nanowires according to an embodiment of the present disclosure.

Referring to FIG. 2, an array of nanowires cores 32 is grown through the openings 43 in the patterned dielectric mask layer 42. Each nanowires core 32 includes a doped compound semiconductor material having a doping of the first conductivity type, i.e., the conductivity type of doping of the doped compound semiconductor layer 26. The material of the nanowires cores 32 may be the same as, or may be different from, the material of the doped compound semiconductor layer 26. In one embodiment, the first conductivity type can be n-type, and each nanowires core 32 includes an n-doped compound semiconductor material such as n-doped gallium nitride. Alternatively, any other suitable III-V or II-VI material may be used.

Each of the nanowires cores 32 can be formed with a set of substantially vertical sidewalls and a tip portion having angled facets, i.e., facets that are not horizontal and not vertical. The nanowires cores 32 can be grown, for example, by selective epitaxial growth of an n-doped compound semiconductor material. The process parameters of the selective epitaxial growth process can be selected such that an n-doped compound semiconductor material grows upward with substantially vertical sidewalls and angled facets from each opening 43 through the patterned dielectric mask layer 42. Methods for growing the nanowires cores 32 through the openings 43 in the patterned dielectric mask layer 42 with substantially vertical sidewalls and faceted tip portion are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB. The height of the nanowires cores 32 can be in a range from 2 micron to 40 microns, although lesser and greater heights can also be employed.

Subsequently, an active shell 34 is formed on each nanowires core 32. The active shell 34 includes at least one semiconductor material that emits light upon application of a suitable electrical bias. For example, each active shell 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active shell 34 can include any other suitable semiconductor layers or stack of layers for light emitting diode applications provided that it can be grown on the surfaces of the nanowires cores 32. The set of all layers within an active shell 34 is herein referred to as an active layer. The active shell may emit any color light, such as blue, green or red light. In one embodiment, the active shell 34 can include an additional semiconductor volume element of a second conductivity type (e.g., p-type) surrounding the light emitting material (e.g., MQW). The volume element may comprise p-type doped gallium nitride and/or aluminum gallium nitride shell(s).

A selective epitaxy process can be employed to grow the active shells 34. The process parameters of the selective epitaxy process can be selected such that the active shells 34 are grown as conformal structures having a same thickness throughout. In another embodiment, the active shells 34 can be grown as a pseudo-conformal structure in which the vertical portions have the same thickness throughout, and faceted portions over the tips of the nanowires cores 32 have thicknesses that differ from the thickness of the vertical portions. Methods for growing the active shells 34 on the nanowires cores 32 are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB. The thickness of the vertical portions of the active shells 34 can be selected such that the active shells 34 do not merge among one another. The thickness of the vertical portions of the active shells 34 can be in a range from 100 nm to 2 microns, although lesser and greater thicknesses can also be employed.

Each set of a nanowires core 32 and an active shell 34 that contacts, surrounds, and overlies the nanowires core 32 constitutes a nanowire (32, 34). In one embodiment, the set of all nanowires (32, 34) formed on the substrate 20 can include a group of nanowires (32, 34) that remain in a final device structure, and additional nanowires (32, 34) that are located outside the area of the group of nanowires (32, 34) and are subsequently removed, and thus, are not incorporated into the final device structure. All nanowires (32, 34), including the array of nanowires (32, 34) and the additional nanowires (32, 34) can be grown through openings 43 in the patterned dielectric mask layer 42 employing at least one selective epitaxy process, which can be at least two selective epitaxy processes including a first selective epitaxy process that forms the nanowires cores 32 and at least one second selective epitaxy process that forms the active shells 34.

The nanowires (32, 34) can be formed as a two-dimensional array having periodicity along two independent directions. Each nanowire (32, 34) within the array extends vertically from the top surface of the doped compound semiconductor layer 26. Each nanowire (32, 34) within the array includes a nanowire core 32 having a doping of the first conductivity type and an active shell 34 including a preferably undoped active layer emitting light upon application of electrical bias therethrough, and optionally a volume element of a second conductivity type surrounding the active layer.

Figure 3:
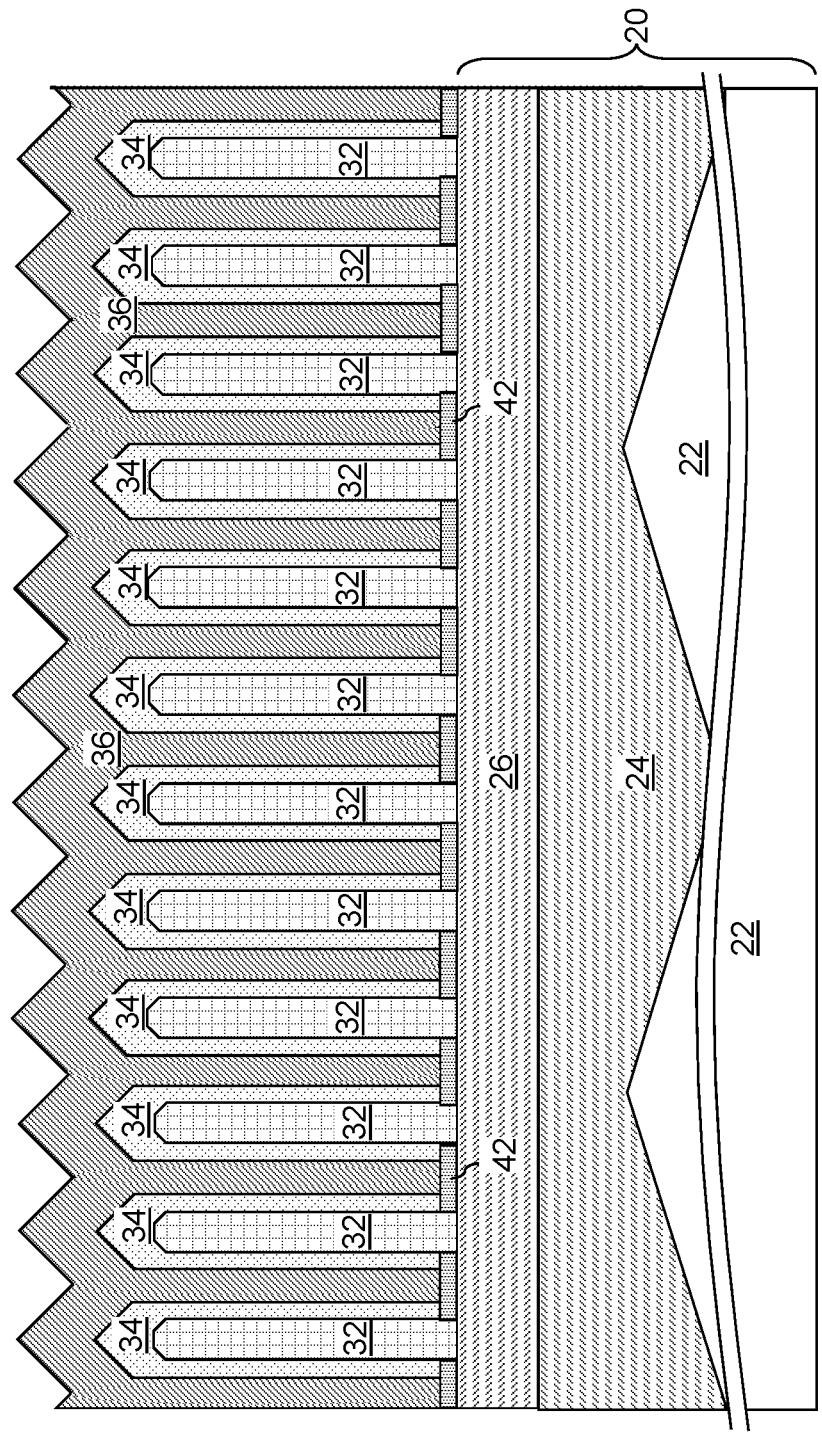
FIG. 3 is a vertical cross-sectional view of the first exemplary structure after formation of a second-conductivity-type semiconductor material layer according to an embodiment of the present disclosure.

Referring to FIG. 3, a second-conductivity-type semiconductor material layer 36 is formed on the sidewalls and faceted outer surfaces of the nanowires (32, 34). The second-conductivity-type semiconductor material layer 36 includes a doped semiconductor material having a doping of a second conductivity type, which is the opposite of the first conductivity type. For example, if the first conductivity type is n-type, the second conductivity type is p-type. If the first conductivity type is p-type, the second conductivity type is n-type.

The second-conductivity-type semiconductor material layer 36 can include a compound semiconductor material having a doping of the second conductivity type. The compound semiconductor material of the second-conductivity-type semiconductor material layer 36 can be any suitable semiconductor material, such as p-type gallium nitride or aluminum gallium nitride. In one embodiment, the nanowires cores 32 can include n-doped GaN, and the second-conductivity-type semiconductor material layer 36 can include p-doped GaN.

In one embodiment, the thickness of the deposited compound semiconductor material of the second-conductivity-type semiconductor material layer 36 can be selected so that the volumes between neighboring pairs of nanowires (32,34) are filled with vertical portions of the second-conductivity-type semiconductor material layer 36. The second-conductivity-type semiconductor material layer 36 includes a horizontally extending portion that continuously extends horizontally and overlies the array of nanowires (32, 34) and vertical portions that are located between neighboring pairs of nanowires (32, 34). The horizontally extending portion of the second-conductivity-type semiconductor material layer 36 contacts faceted surfaces of the nanowires (32, 34) and overlies the vertical portions of the second-conductivity-type semiconductor material layer 36. Each vertical portion of the second-conductivity-type semiconductor material layer 36 can contact a portion of the top surface of the patterned dielectric mask layer 42 and can be adjoined to the horizontally extending portion of the second-conductivity-type semiconductor material layer 36. The thickness of the horizontally extending portion of the second-conductivity-type semiconductor material layer 36 (as measured along the vertical direction) can be in a range from 100 nm to 2 microns, such as from 200 nm to 1 micron, although lesser and greater thicknesses can also be employed. Alternatively, instead of a continuous layer 36, the second conductivity type material may comprise a plurality of discrete shells around respective nanowire cores.

Figure 4:
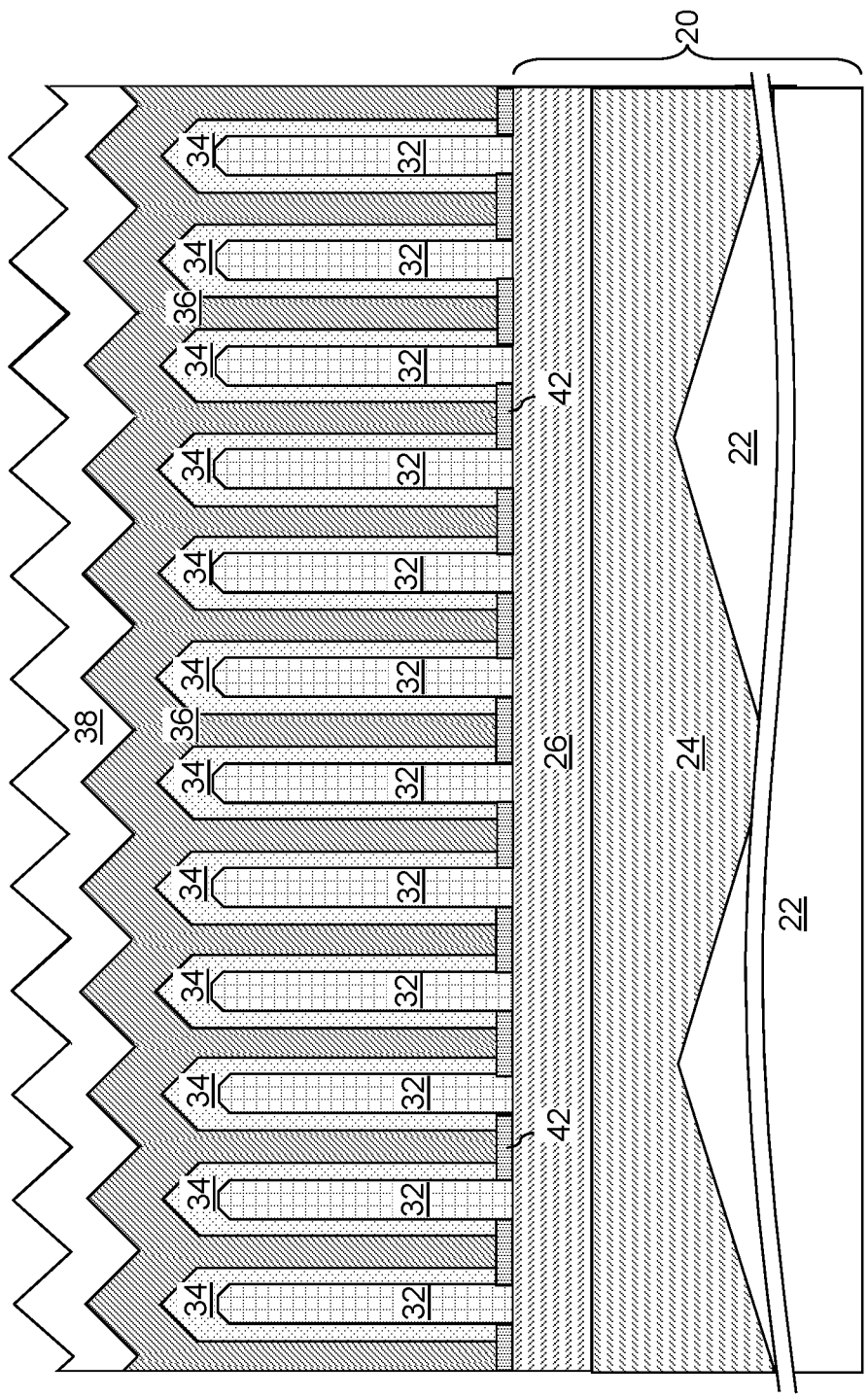
FIG. 4 is a vertical cross-sectional view of the first exemplary structure after formation of a transparent conductive oxide layer according to an embodiment of the present disclosure.

Referring to FIG. 4, an optional transparent conductive oxide layer 38, such as a transparent conductive oxide layer can be deposited over the horizontally extending portion of the second-conductivity-type semiconductor material layer 36. The transparent conductive oxide layer 38 includes a transparent conductive oxide material such as indium tin oxide or aluminum doped zinc oxide. The transparent conductive oxide layer 38 can be deposited as a continuous material layer that extends across the entire area of the second-conductivity-type semiconductor material layer 36, i.e., across the entire area of the array of nanowires (32, 34). The thickness of the transparent conductive oxide layer 38 can be in a range from 100 nm to 2 microns, such as from 200 nm to 1 micron, although lesser and greater thicknesses can also be employed.

Alternatively, the transparent conductive oxide layer 38 may be replaced with a silver layer, which can be deposited by physical vapor deposition and annealed to provide a contact to a p-type semiconductor material. In this case, the silver layer can function as a reflector material layer and subsequent deposition of a reflector material layer can be omitted.

Figure 5:
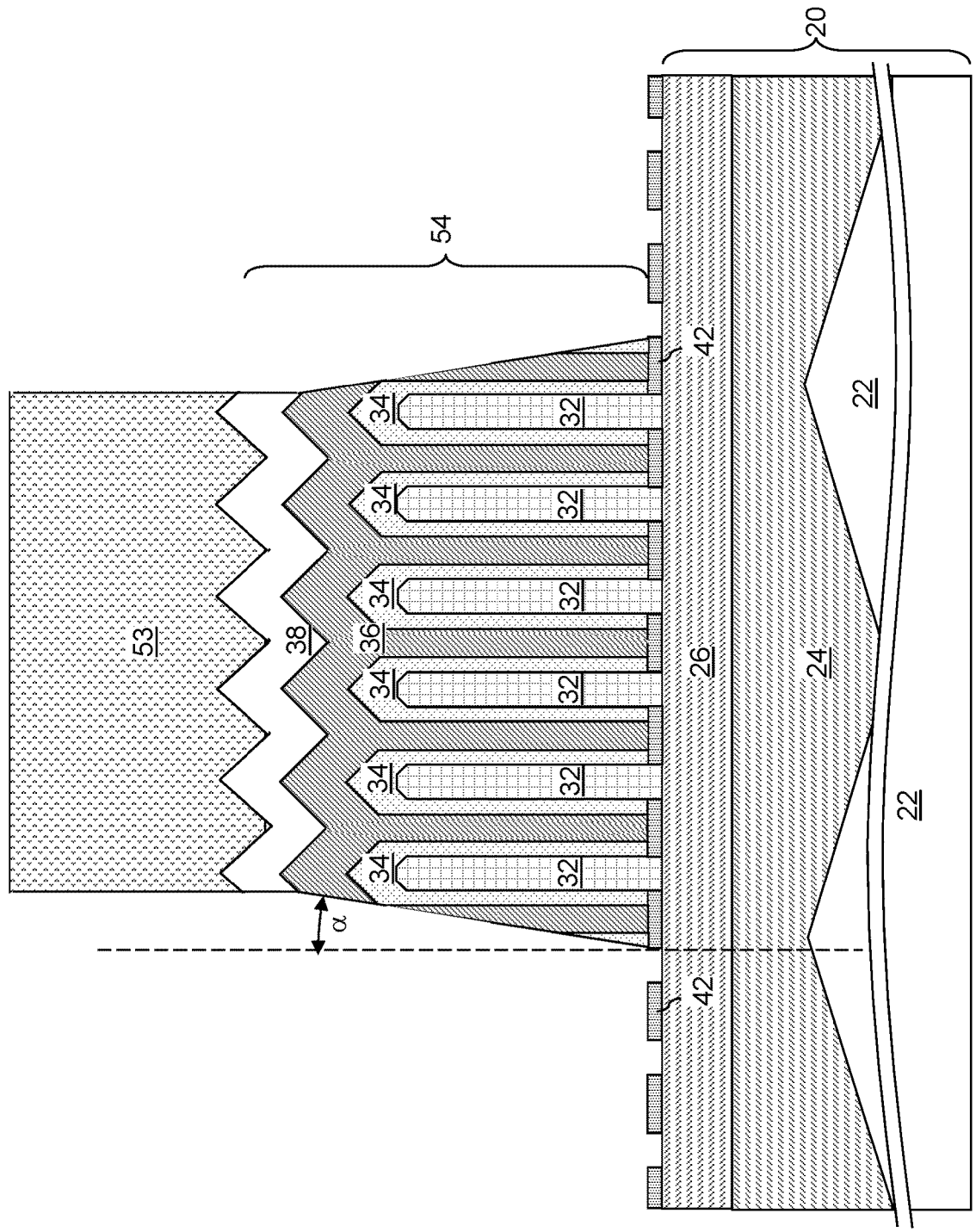
FIG. 5 is a vertical cross-sectional view of the first exemplary structure after patterning the stack of the transparent conductive oxide layer, the second-conductivity-type semiconductor material layer, and the nanowires according to an embodiment of the present disclosure.

Referring to FIG. 5, a photoresist layer 53 can be applied over the transparent conductive oxide layer 38, and can be patterned to mask at least one group of nanowires (32, 34) to be incorporated into a final device structure. The photoresist layer 53 is applied over the transparent conductive oxide layer 38 and is subsequently patterned by lithographic methods (i.e., by lithographic exposure and development).

At least one etch process can be performed to remove the materials of the transparent conductive oxide layer 38, the second-conductivity-type semiconductor material layer 36, and the nanowires (32, 34) from outside the area of the patterned photoresist layer 53. In one embodiment, the at least one anisotropic etch process can include a first etch process that etches physically exposed portions (i.e., portions that are not masked by the photoresist layer 53) of the transparent conductive oxide layer 38, and a second etch process that etches physically exposed portions of the second-conductivity-type semiconductor material layer 36 and the nanowires (32, 34). The first etch process can be a wet etch process or a dry etch process (such as a reactive ion etch process). The second etch process can be an anisotropic etch process such as a reactive ion etch process. Each group of nanowires (32, 34) and portions of the second-conductivity-type semiconductor material layer 36 and the transparent conductive oxide layer that underlie a portion of the patterned photoresist layer 53 remains intact as a mesa structure 54, while additional nanowires (32, 34) that are not covered by the patterned photoresist layer 53 are removed by the second etch process. In one embodiment, the second etch process may include a plurality of mask and etch processes.

The sidewalls of the remaining portions of the mesa structures containing second-conductivity-type semiconductor material layer 36 and optionally physically exposed sidewall of the nanowires cores 32 and/or the active shells 34 may be substantially vertical (i.e., having less than, or up to, 1 degree of deviation from the vertical direction), or may be tapered (i.e., having a taper angle greater than 1 degree such as from 1 degree to 15 degrees). In one embodiment, the sidewalls of the remaining portions of the second-conductivity-type semiconductor material layer 36 and physically exposed sidewall of the nanowires cores 32 and the active shells 34 can be tapered with a taper angle at, which can be in a range from 1 degree to 45 degrees. In one embodiment, the taper angle $\alpha$, at can be in a range from 2 degrees to 30 degrees. The taper angle $\alpha$ can be in a range from 2 degrees to 10 degrees. In one embodiment, the taper angle can be in a range from 10 degrees to 20 degrees. In one embodiment, the taper angle can be in a range from 200 degrees to 30 degrees. In one embodiment, the taper angle can be selected in order to optimize the reflection characteristics of a reflective layer to be subsequently formed.

The tapered sidewalls of the remaining portions of the second-conductivity-type semiconductor material layer 36 and optionally physically exposed sidewall of the nanowires cores 32 and the active shells 34 is affected by the anisotropy of the reactive ion etch. Generally speaking, the lesser the anisotropy (i.e., the greater the isotropy) of the reactive ion etch process, the greater the taper angle. A parameter that controls the degree of anisotropy in a reactive ion etch is the degree of polymer generation. The polymers can be formed, for example, by employing hydrogen gas in conjunction with an etchant gas (such as a fluorocarbon gas), and by employing a high density plasma. For example, a reactive ion etch employing high density plasma of $CF_4$, $CHF_3$, or $C_3F_8$ with high hydrogen gas flow and a high processing pressure tends to be effective in generating hydrofluorocarbon polymers, and tends to increase the anisotropy of the reactive ion etch process. In contrast, generation of polymers can be minimized, for example, by employing oxygen gas in conjunction with an etchant gas, and employing a low pressure setting for the reactive ion etch process.

The anisotropic etch process that etches the materials of the second-conductivity-type semiconductor material layer 36 and the nanowires (32, 34) may, or may not, be selective to the material of the patterned dielectric mask layer 42. In one embodiment, the patterned dielectric mask layer 42 may be present outside the area of the photoresist layer 53. In another embodiment, the patterned dielectric mask layer 42 may be collaterally etched outside the area of the photoresist layer 53. In this case, the patterned dielectric mask layer 42 may remain only under the mesa structure 54 within the area of the photoresist layer 53. The top surface of the doped compound semiconductor layer 26 can be physically exposed outside the mesa structure 54, i.e., outside the area of the photoresist layer 53.

Figure 6:
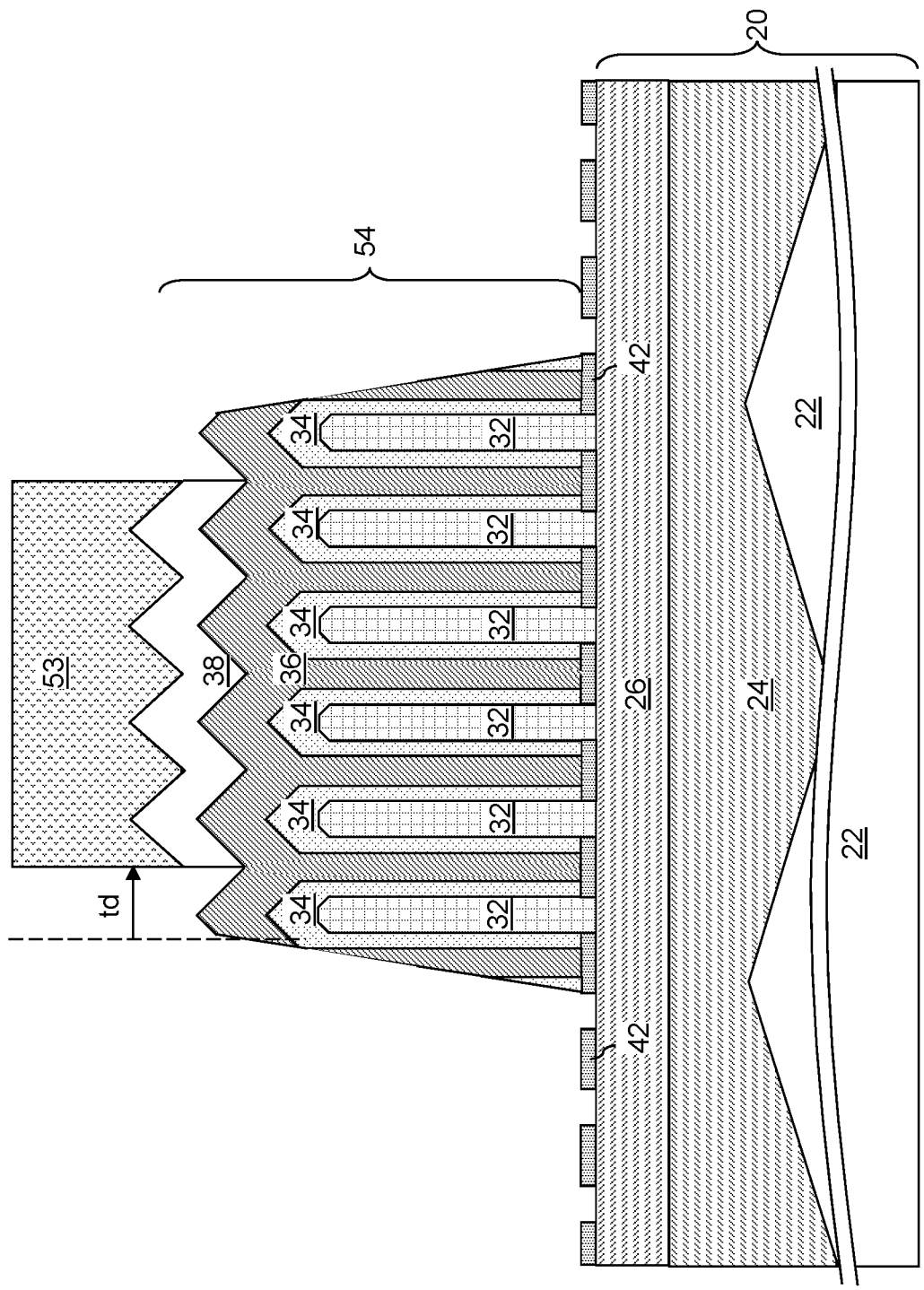
FIG. 6 is a vertical cross-sectional view of the first exemplary structure after trimming a masking layer and etching physically exposed portions of the transparent conductive oxide layer according to an embodiment of the present disclosure.

Referring to FIG. 6, the photoresist layer 53 can be trimmed. The sidewalls of the photoresist layer 53 are laterally recessed with respect the sidewalls of the remaining portions of the mesa structure 54 (i.e., outside the transparent conductive oxide layer 38 and the second-conductivity-type semiconductor material layer 36) by a trimming distance, which can be in a range from 300 nm to 4 microns, such as from 600 nm to 2 microns. In one embodiment, a controlled baking process can be employed to shrink the photoresist material of the photoresist layer 53.

After trimming of the photoresist layer 53, an isotropic etch process can be performed to remove physically exposed portions of the transparent conductive oxide layer 38. An isotropic etch process or an anisotropic etch process can be employed provided that the etch process is selective to the material of the second-conductivity-type semiconductor material layer 36. In one embodiment, a wet etch process that etches the material of the transparent conductive oxide layer 38 selective to the material of the second-conductivity-type semiconductor material layer 36 can be employed to remove the physically exposed edge portions of the transparent conductive oxide layer 38 to reduce current leakage at the edge of the mesa structure. Thus, the transparent conductive oxide layer 38 has a shorter length than the second-conductivity-type semiconductor material layer 36, such that edge portions of the second-conductivity-type semiconductor material layer 36 are exposed below the transparent conductive oxide layer 38. The photoresist layer 53 can be subsequently removed selective to the transparent conductive oxide layer 38 and the second-conductivity-type semiconductor material layer 36. For example, the photoresist layer 53 can be removed by ashing.

Figure 7:
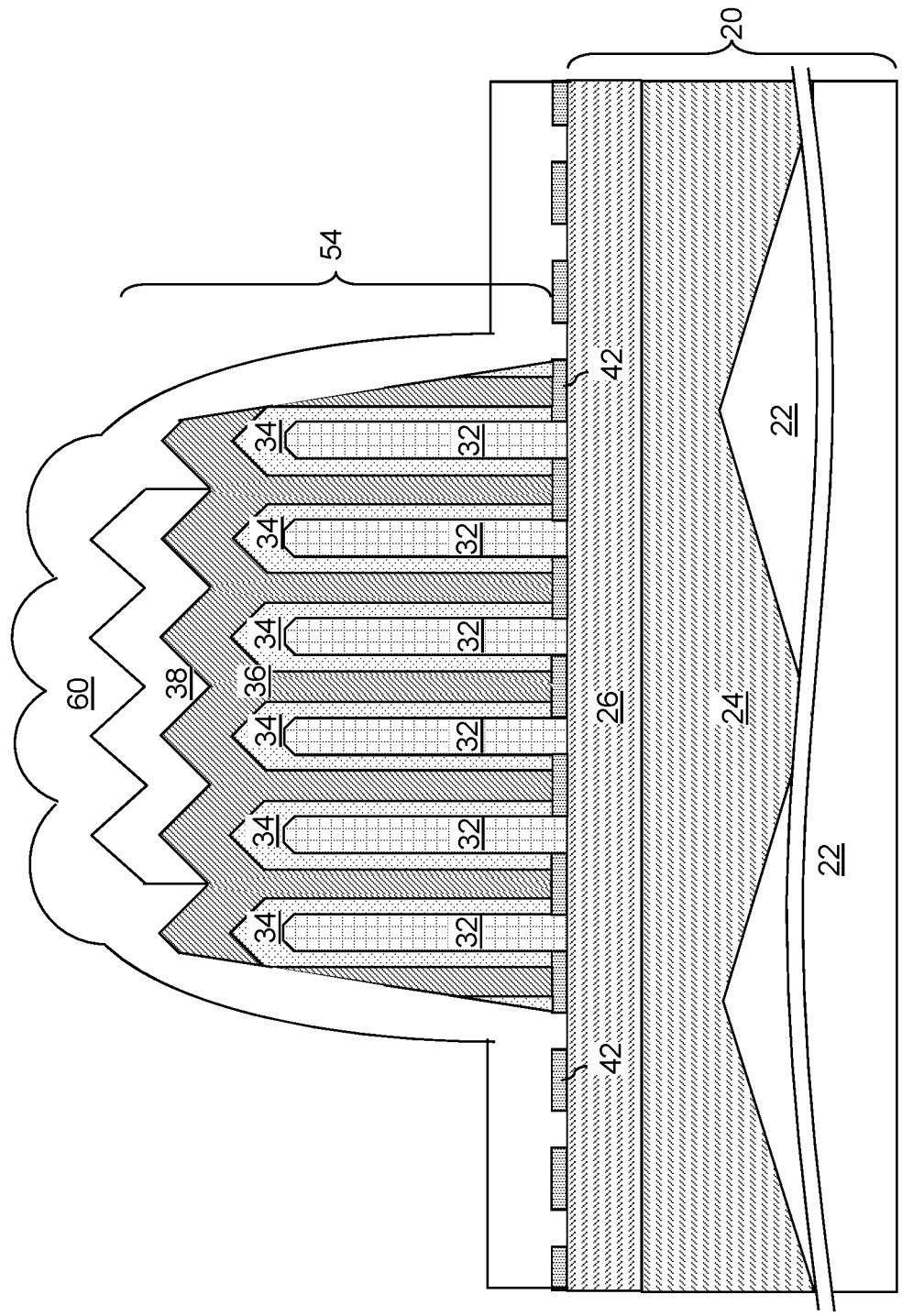
FIG. 7 is a vertical cross-sectional view of the first exemplary structure after formation of a dielectric material layer according to an embodiment of the present disclosure.

Referring to FIG. 7, an optional dielectric material layer 60 may be deposited over the transparent conductive oxide layer 38 and the second-conductivity-type semiconductor material layer 36. The dielectric material layer 60 includes a transparent dielectric material such as silicon oxide, silicon nitride, a dielectric metal oxide (such as aluminum oxide), organosilicate glass, or porous variants thereof. The dielectric material layer 60 can be deposited by a conformal deposition method (such as low pressure chemical vapor deposition (LPCVD) or atomic layer deposition (ALD)) or by a non-conformal deposition method (such as plasma enhanced chemical vapor deposition (PECVD) or physical vapor deposition (such as sputtering or e-beam deposition).

The dielectric material layer 60 can be formed over the mesa structure 54 (i.e., over the second-conductivity-type semiconductor material layer 36 and around each remaining group of nanowires (32, 34)). In one embodiment, at least one remaining group of nanowires (32, 34) in the mesa structure 54 can constitute an array of nanowires (32, 34). The dielectric material layer 60 can include a first horizontally extending portion that overlies a transparent conductive oxide layer 38 and an underlying array of nanowires (32, 34), sidewall (i.e., non-horizontal) portions that are adjoined to the periphery of the horizontally extending portion of the dielectric material layer 60 and laterally surrounding the mesa structure 54 containing the array of nanowires (32, 34), and a second horizontal portion located outside an area of the array of nanowires (32, 34), overlying the top surface of the substrate 20, and adjoined to the sidewall portions of the dielectric material layer 60. The thickness of the dielectric material layer 60, as measured above a planar region such as the region outside the array of nanowires (32, 34), can be in a range from 100 nm to 4 microns, such as from 200 nm to 2 microns, although lesser and greater thicknesses can also be employed.

Figure 8:
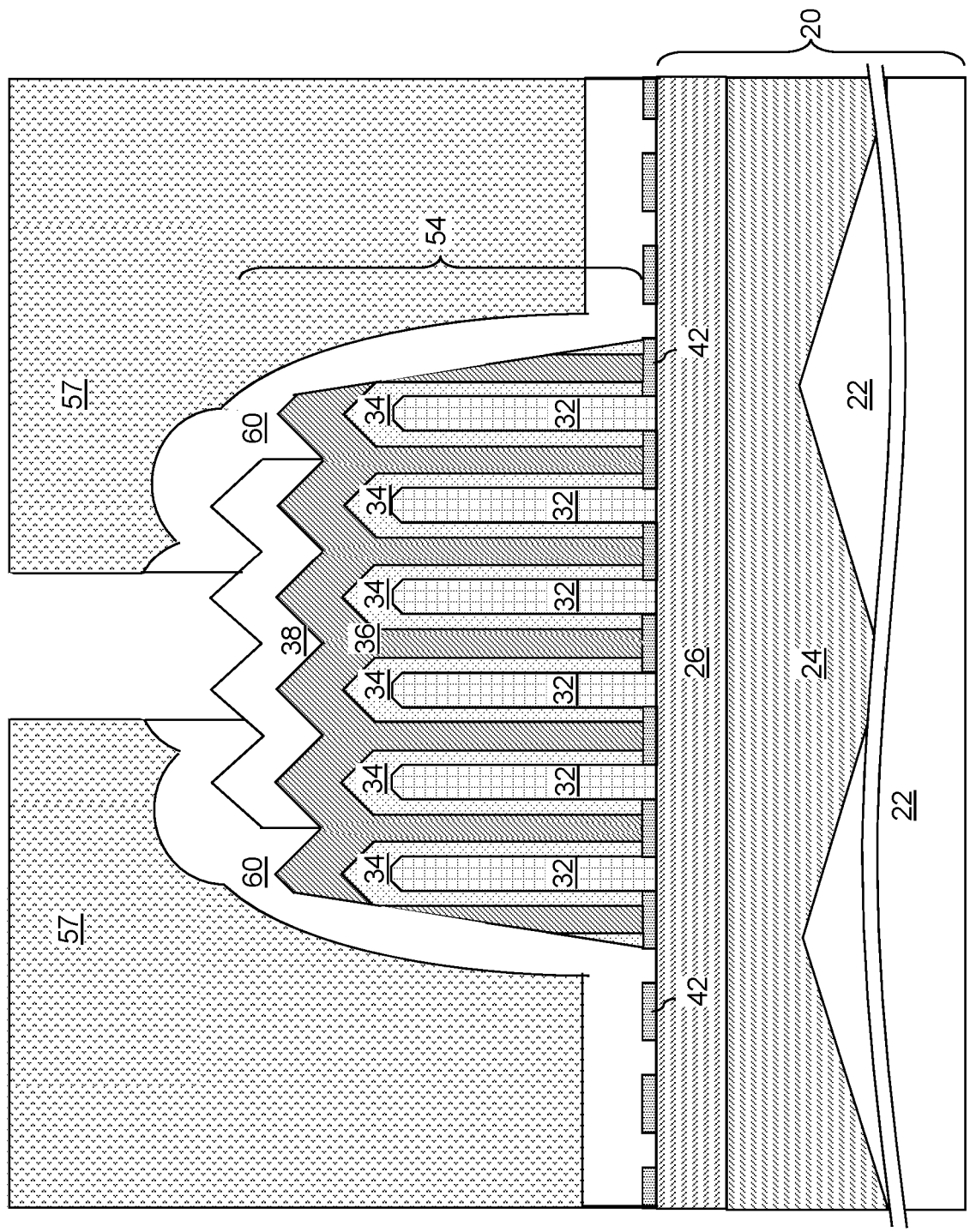
FIG. 8 is a vertical cross-sectional view of the first exemplary structure after forming an opening through the dielectric material layer according to an embodiment of the present disclosure.

Referring to FIG. 8, a photoresist layer 57 can be applied over the dielectric material layer 60. The photoresist material of the photoresist layer 57 can be applied by a self-planarizing process such as spin coating. The amount of the applied photoresist material can be selected such that a planar top surface of the photoresist material is located above the topmost surface of the dielectric material layer 60.

An opening is formed through the photoresist layer 57 by lithographic exposure and development above each mesa structure 54 containing the array of nanowires (32, 34), i.e., above each instance of the transparent conductive oxide layer 38 that overlies a respective array of nanowires (32, 34). The area of each opening may be entirely within the area of the underlying transparent conductive oxide layer 38, or may be larger than the area of the transparent conductive oxide layer 38, thereby exposing the semiconductor material of the second-conductivity-type semiconductor material layer 36 underneath to a metallic mirror material to be subsequently deposited. In one embodiment, each opening through the photoresist layer 57 can be laterally offset from the periphery of the underlying transparent conductive oxide layer 38 by a predetermined minimum lateral offset distance, which can be, for example, in a range from 100 nm to 2 microns.

The pattern of the opening(s) through the photoresist layer 57 can be transferred through the dielectric material layer 60 by an etch process, which can be an isotropic etch process or an anisotropic etch process. The etch process that forms at least one opening through the dielectric material layer 60 can be selective to the transparent conductive oxide layer 38, i.e., does not significantly etch the material of the transparent conductive oxide layer 38. For example if the dielectric material layer 60 includes silicon oxide, a wet etch including hydrofluoric acid or a dry etch including a hydrofluoric acid vapor can be employed. Alternatively, a reactive ion etch employing a chlorocarbon gas as an etchant can be employed to etch silicon oxide. An opening is formed through each portion of the dielectric material layer 60 that overlies and exposes a center region of a transparent conductive oxide layer 38.

Figure 9:
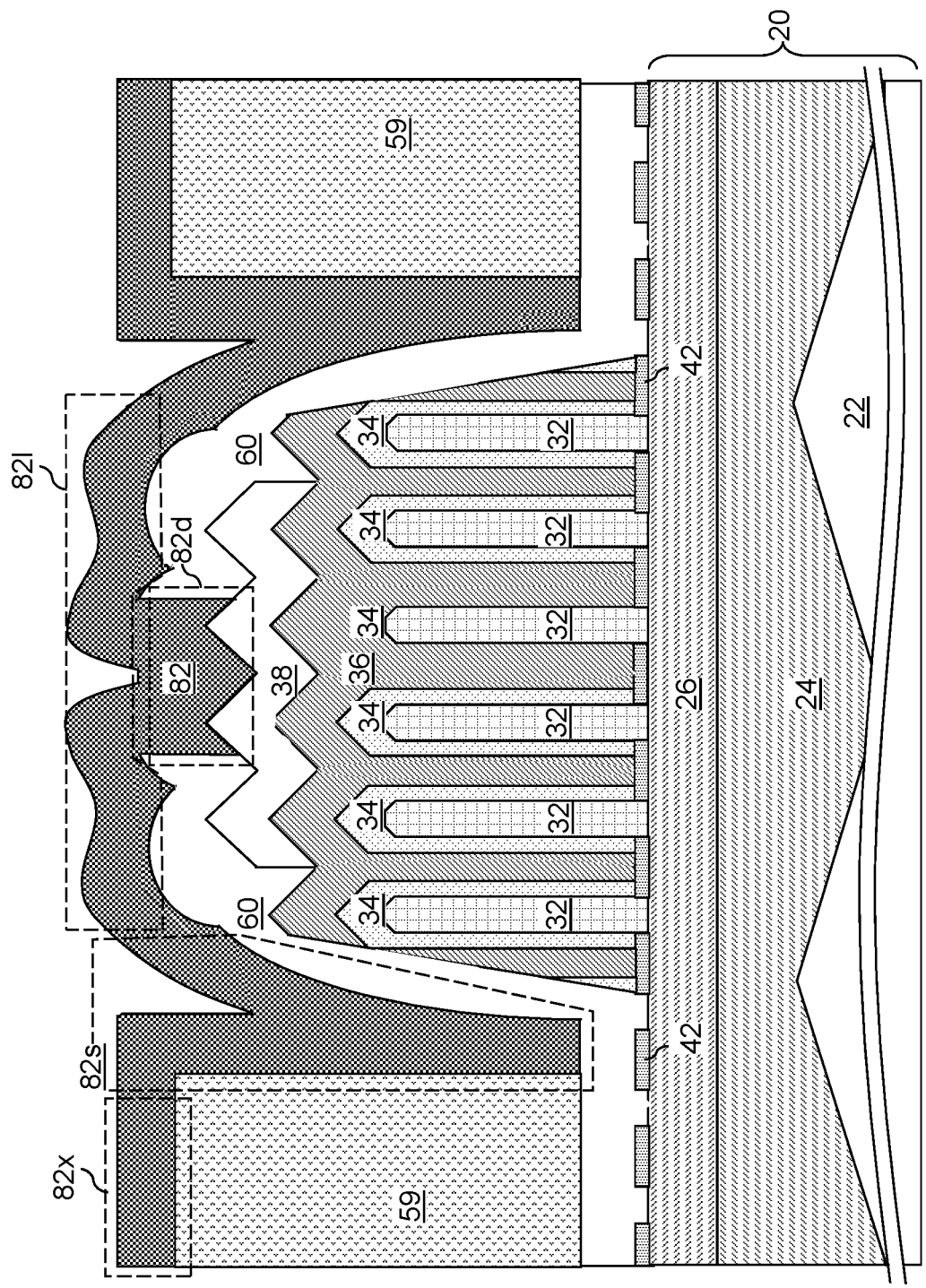
FIG. 9 is a vertical cross-sectional view of the first exemplary structure after forming a lift-off mask layer and depositing a reflector material according to an embodiment of the present disclosure.

Referring to FIG. 9, the photoresist layer 57 can be lithographically exposed and developed to form a lift-off mask layer 59. Alternatively, the photoresist layer 57 can be removed, for example, by ashing, and a new photoresist layer can be applied over the dielectric material layer 60 and lithographically patterned to form the lift-off mask layer 59.

The lift-off mask layer 59 is patterned such that the lift-off mask layer 59 is located only outside the areas of the mesa structures 54 containing each array of nanowires (32, 34). The sidewalls of the lift-off mask layer 59 are laterally spaced outward from each sidewall of the dielectric material layer 60. A set of sidewalls of the lift-off mask layer 59 can laterally surround each set of sidewalls of the dielectric material layer 60 that laterally surrounds the mesa structure 54 containing the array of nanowires (32, 34).

A reflector material can be deposited over the dielectric material layer 60 and over the lift-off mask layer 59. The reflecting material can be a thin film distributed Bragg reflector (DBR) encapsulating the mesa. The deposited reflector material forms a conductive reflector layer 82 that continuously extends over, and laterally surrounds, the mesa structure containing the array of nanowires (32, 34).

The conductive reflector layer 82 includes a laterally extending portion 82l that overlies the mesa structure containing the array of nanowires (32, 34); a downward-protruding portion 82d that extends through an opening in the dielectric material layer 60, contacts the transparent conductive oxide layer 38, and adjoined to an inner periphery of the laterally extending portion 82l; and a sidewall portion 82s that laterally surrounds the sidewall portions of the dielectric material layer 60 and the mesa structure containing the array of nanowires (32, 34) and adjoined to an outer periphery of the laterally extending portion 82l. A residual reflector material portion 82x can be formed above the top surface of the lift-off mask layer 59 away from the mesa structure 54.

The conductive reflector layer 82 is electrically shorted to the second-conductivity-type semiconductor material layer 36 through the transparent conductive oxide layer 38. The conductive reflector layer 82 is laterally spaced from the array of nanowires (32, 34) by sidewall portions of the dielectric material layer 60. The conductive reflector layer 82 includes a reflective material such as a metal. In one embodiment, the conductive reflector layer 82 includes at least one material selected from silver, aluminum, copper, and gold. In one embodiment, the reflector material can be a thin film DBR with small index changes to provide better reflectivity.

In one embodiment, the reflector material can be deposited by a directional deposition method such as physical vapor deposition (sputtering) or vacuum evaporation. A directional deposition can deposit the reflector material non-conformally. Thus, horizontal portions of the deposited material can have a greater thickness than vertical portions of the deposited material. Thus, the greater the taper angle of the interface between the sidewalls of the second-conductivity-type semiconductor material layer 36 of the inner sidewalls of the dielectric material layer 60, the greater the thickness of the sidewall portions of the conductive reflector layer 82. The thickness of horizontal portions of the conductive reflector layer 82 can be in a range from 5 nm to 500 nm, such as from 10 nm to 250 nm, although lesser and greater thicknesses can also be employed.

The conductive reflector layer 82 can be employed to reflect light emitted from the active shells 34 downward (i.e., toward the buffer layer 24) with a controlled viewing angle, which can be in a range from 30 degrees to 150 degrees, and may be from 60 degrees to 120 degrees. The effective viewing angle can be determined by the taper angle of the sidewalls of the mesa structure 54 containing the assembly of the nanowires (32, 34) and the second-conductivity-type semiconductor material layer 36. Therefore, by choosing an optimal taper angle, the effective viewing angle for the light emitted from the active regions 34 of the array of nanowires (32, 34) can be optimized.

Figure 10:
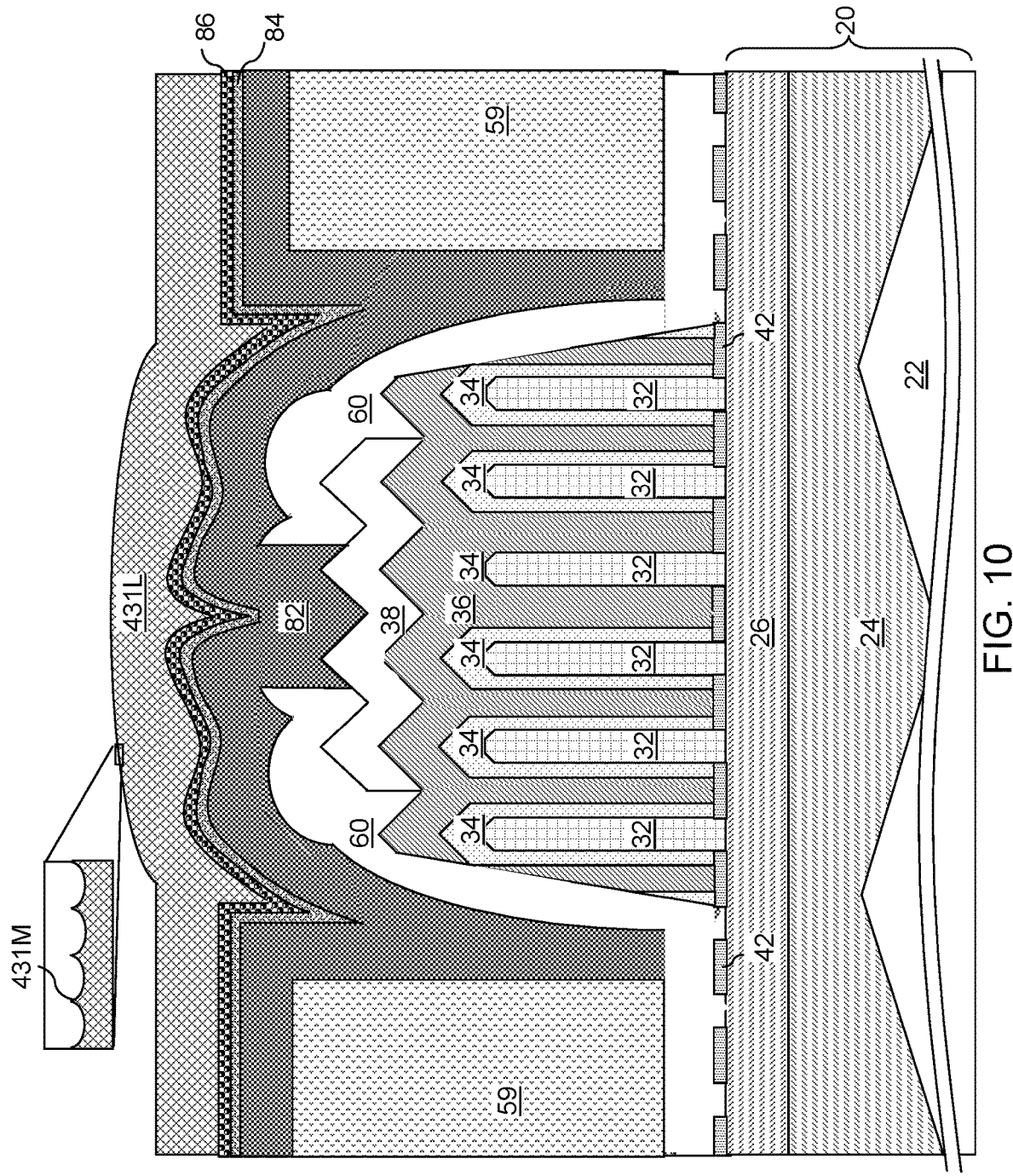
FIG. 10 is a vertical cross-sectional view of the first exemplary structure after formation of at least one metallic barrier layer and a bonding material layer according to an embodiment of the present disclosure.

Referring to FIG. 10, at least one metallic (i.e., electrically conductive) barrier layer (84, 86) can be formed as at least one continuous material layer on the conductive reflector layer 82. The at least one metallic barrier layer (84, 86) can be formed directly on a region of the laterally extending portion 82*l* of the conductive reflector layer 82 and directly on the sidewalls and recessed top surfaces of the downward-protruding portion 82*d* of the conductive reflector layer 82.

The recessed top surfaces of the downward-protruding portion 82*d* of the conductive reflector layer 82 may be non-planar surfaces that follow the contour of the non-planar top surface of the transparent conductive oxide layer 38. The at least one metallic barrier layer (84, 86) is electrically shorted to the conductive reflector layer 82, the transparent conductive oxide layer 38, and the second-conductivity-type semiconductor material layer 36.

The at least one metallic barrier layer (84, 86) includes a metal or metal alloy (i.e., metallic) material layers that can be employed for under-bump metallurgy (UBM), i.e., a set of metal layers provide between a conductive bonding structure and a die. In one embodiment, the at least one metallic barrier layer (84, 86) can include a diffusion barrier layer 84 and an adhesion promoter layer 86.

Exemplary materials that can be employed for the diffusion barrier layer 84 include titanium, titanium-tungsten, titanium-platinum or tantalum. Exemplary materials that can be employed for the adhesion promoter layer 86 include tungsten, platinum, or a stack of tungsten and platinum. Any other under-bump metallurgy known in the art can also be employed.

A bonding material layer 431L can be formed on the at least one metallic barrier layer (84, 86). The bonding material layer 431L includes a solder material, which can include tin, and optionally includes an alloy of tin and silver, gold, copper, bismuth, indium, zinc, and/or antimony. It is understood that shape of the bonding material layer 431L as illustrated is only schematic, and may not represent a true shape of a bonding material layer 431L. The bonding material layer 431L can be 2 to 10 microns thick, such as 5 to 7 microns thick.

According to an aspect of the present disclosure, the bonding material layer 431L can include a tin-containing solder material. In one embodiment, the tin-containing solder material can be a noble metal-tin alloy such as a tin-silver alloy, a tin-gold alloy, a tin-silver-copper alloy. Non-limiting examples of the noble metal-tin alloy include Sn96.5/Ag3.5, Sn95/Ag5, SAC105 (silver 1%, copper 0.5%, the balance tin), and SAC0307 (silver 0.3%, copper 0.7%, the balance tin). The atomic concentration of tin can be in a range from 90% to 99.5%. The balance of the composition of the bonding material layer 431L can include at least one metal such as Au, Ag, and/or Cu. In this case, tin and at least one of Au, Cu and Ag can be co-evaporated in a vacuum environment during deposition of the bonding material layer 431L. In one embodiment, the vacuum evaporation of the materials of the bonding material layer 431L can be performed employing at least one effusion cell with a respective temperature controller, and/or at least one electron beam (e-beam) evaporation source. The flux of tin and the at least one noble metal can be controlled to provide a tin alloy including at least 90 at. %, but less than 99.5 at. %, of tin in atomic concentration, of the tin alloy that is deposited. In case a tin-silver alloy or a tin-silver-copper is employed, the tin alloy can include tin at an atomic concentration in a range from 90 at. % to 99 at. %, the balance consisting essentially of Ag and optionally Cu. In one embodiment, the noble metal-tin alloy can include tin at an atomic concentration in a range from 98 at. % to 99.5 at. %, and at least one of Au, Ag, and Cu at a total atomic concentration that is the balance of the atomic concentration of tin.

Alternatively, the bonding material layer 431L may be formed as a layer stack of a tin layer and at least one noble metal layer including Au, Ag, or Cu. In this case, the number of tin atoms within the bonding material layer 431L may be in a range from 98% to 99.5% of the total number of atoms within the bonding material layer 431L, and the total number of Au atoms, Ag atoms, and Cu atoms may be the balance of the percentage of the tin atoms with respect to the total number of atoms within the bonding material layer 431L. In case the bonding material layer 431L includes a layer stack, tin and Ag, Au and/or Cu can be mixed during a laser irradiation that bonds the material of the bonding material layer 431L to a bonding pad on a backplane, as will be discussed in more detail below.

The inventors of the present disclosure recognized that a noble-metal tin alloy formed by vacuum evaporation includes micropores therein. The volume of the micropores may be in a range from 5% to 20% depending on the evaporation conditions and the composition of the alloy. The porous tin alloy has a lower density than a compressed bulk alloy having the same composition due to the micropores, and has enhanced compressibility and/or malleability. For example, the conductive bonding structures can be compressed by 5 to 20%, such as 10 to 15% of their thickness not counting any lateral expansion (i.e., not counting bonding material spreading out horizontally between the LED and the backplane). Thus, conductive bonding structures which include the bonding material layer portions can provide enhanced conformity during bonding to a bonding pad in a subsequent processing step. The bonding material layer 431L can have a microstructured surface containing micro-bumps 431M, as illustrated within an inset in FIG. 10.

Figure 11:
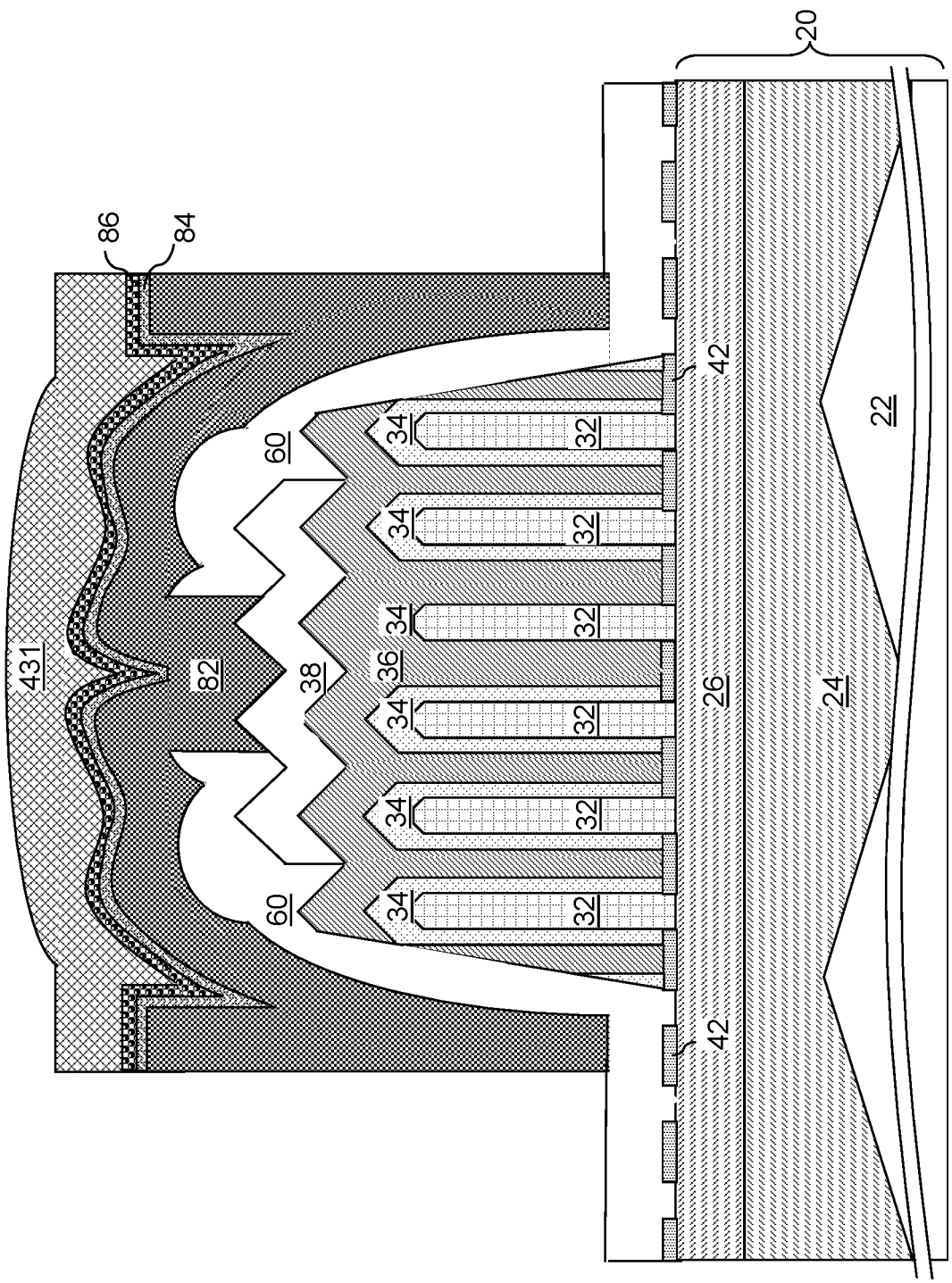
FIG. 11 is a vertical cross-sectional view of the first exemplary structure after lifting off the lift-off mask layer according to an embodiment of the present disclosure.

Referring to FIG. 11, the lift-off mask layer 59, residual reflector material portion 82*x* (shown in FIG. 9), and peripheral portions of the at least one metallic barrier layer (84, 86) and the bonding material layer 431L (shown in FIG. 10) can be lifted off from the dielectric material layer 60, for example, by dissolving the material of the lift-off mask layer 59 in a solvent. A suitable clean process (such as a megasonic clean process) can be performed to remove any remaining portions of the residual reflector material portion 82*x* (and optionally the metallic barrier layer (84, 86) and/or conductive bonding structure 431) from the surface of the dielectric material layer 60 and the conductive reflector layer 82. Each remaining portion of the bonding material layer 431L on a mesa structure constitutes a conductive bonding structure 431.

Figure 12:
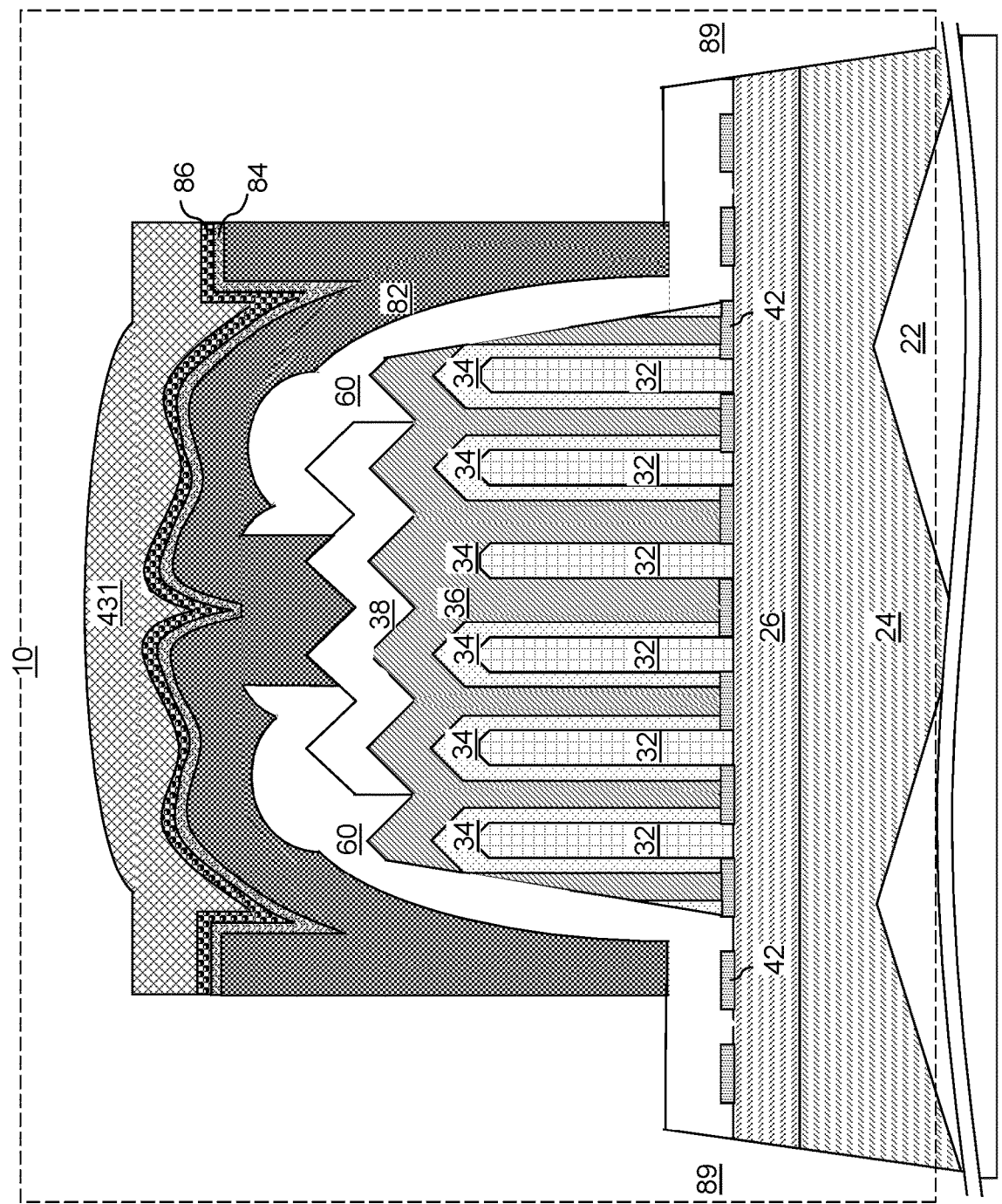
FIG. 12 is a vertical cross-sectional view of the first exemplary structure after formation of moat trenches according to an embodiment of the present disclosure.

Referring to FIG. 12, moat trenches 89 are formed through the dielectric material layer 60, the buffer layer 24 and the doped compound semiconductor layer 26 of the first conductivity type around each region including an array of nanowires (32, 34) and an overlying conductive bonding structure 431. The moat trenches 89 can be formed, for example, by masking each mesa structure and the overlying conductive bonding structure 431 with a mask layer (not shown) and by anisotropically etching portions of the dielectric material layer 60, the doped compound semiconductor layer 26, and the buffer layer 24 that are not masked by the masking layer. The etch can be at least one anisotropic etch process such that sidewalls of the dielectric material layer 60, the doped compound semiconductor layer 26, and the buffer layer 24 that are formed by the at least one anisotropic etch process have a taper angle with respect to the vertical direction that is perpendicular to the top surface of the substrate 20. The taper angle can be in a range from 3 degrees to 30 degrees.

Figure 16A:
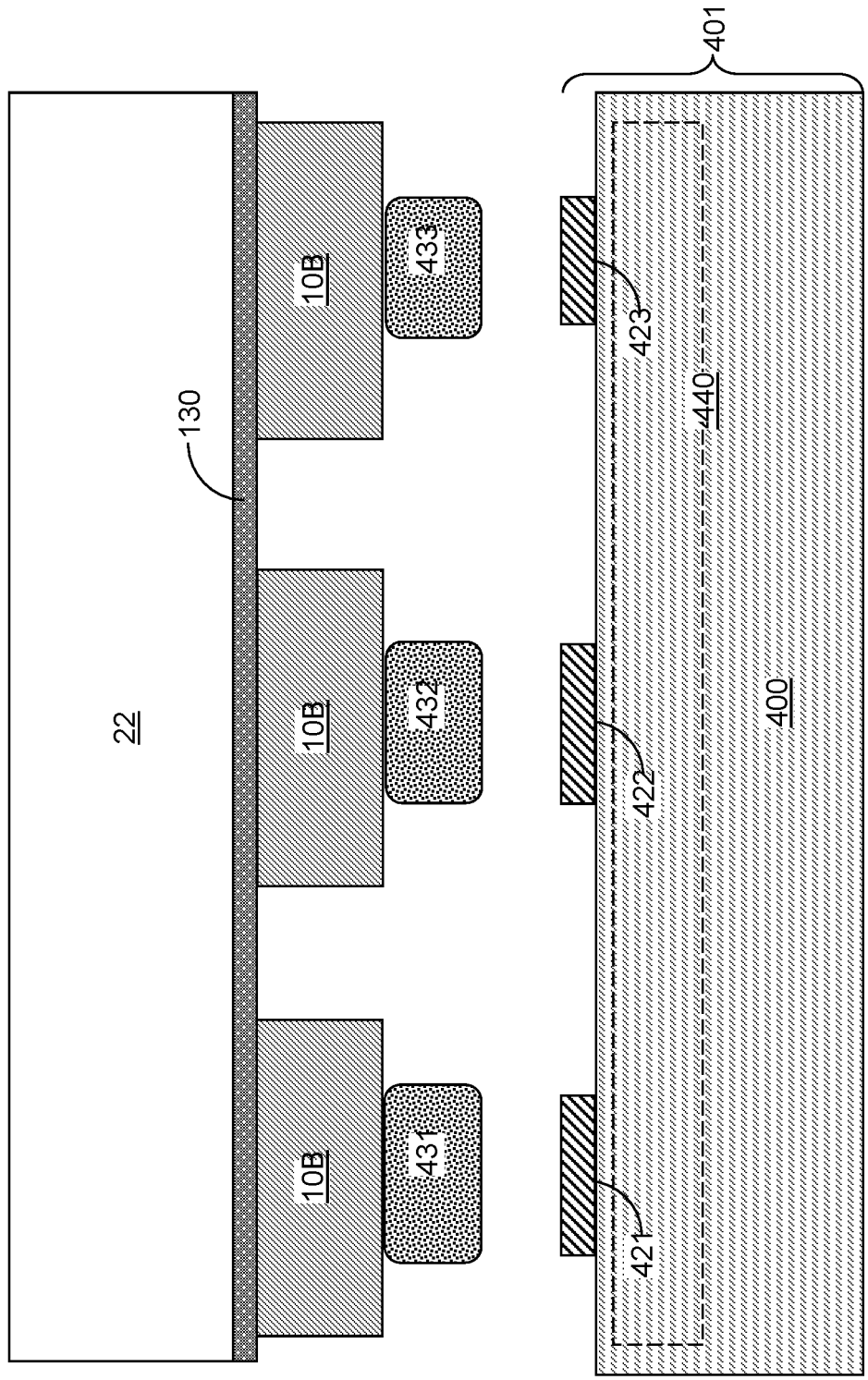
FIGS. 16A to 16P are schematic vertical cross-sectional views of steps in a method of incorporating LEDs into a display panel according to an embodiment of the present disclosure.

In one embodiment, the masking layer can be a photoresist layer or a polyimide layer. The patterned mask layer covers each combination of the mesa structure containing an array of nanowires (32, 34) and an overlying conductive bonding structure 431, while channels between neighboring arrays of nanowires (32, 34) are physically exposed. A series of anisotropic etch processes can be employed to form the moat trenches 89 while the patterned mask layer protects the conductive bonding structures 431 and the underlying array of nanowires (32, 34). In one embodiment, the support substrate 22 can be employed as an etch stop layer for the last anisotropic etch process among the at least one anisotropic etch process. The masking layer (if present) can be subsequently removed, for example, by ashing. In an alternative embodiment, the dielectric material layer 60, the buffer layer 24 and the doped compound semiconductor layer 26 of the first conductivity type are exposed after removal of the lift-off mask layer 59. The exposed dielectric material layer 60, buffer layer 24 and doped compound semiconductor layer 26 are etched to form the moat trenches 89 therein using the conductive bonding structure 431, the metallic barrier layer (84, 86), the conductive reflector layer 82 and the mesa structure 54 as a mask. In this alternative embodiment, the masking layer can be omitted. Each continuous set of elements laterally surrounded by the moat trenches 89 constitutes a discrete die (24, 26, 43, 32, 34, 36, 38, 60, 82, 84, 86, 431) of light emitting devices 10 (i.e., the moat trenches 89 separate adjacent LEDs 10). Each light emitting device 10 die is attached to the support substrate 22. Each light emitting device 10 can emit light of the same or different color. For example, the light emitting devices 10 can be light emitting diodes (LEDs), including blue light emitting LEDs 10B, green light emitting LEDs 10G or red light emitting LEDs 10R (which are shown in FIG. 16A). Thus, an array of dies can be transported while being attached to the support substrate 22 for further processing.

Figure 13:
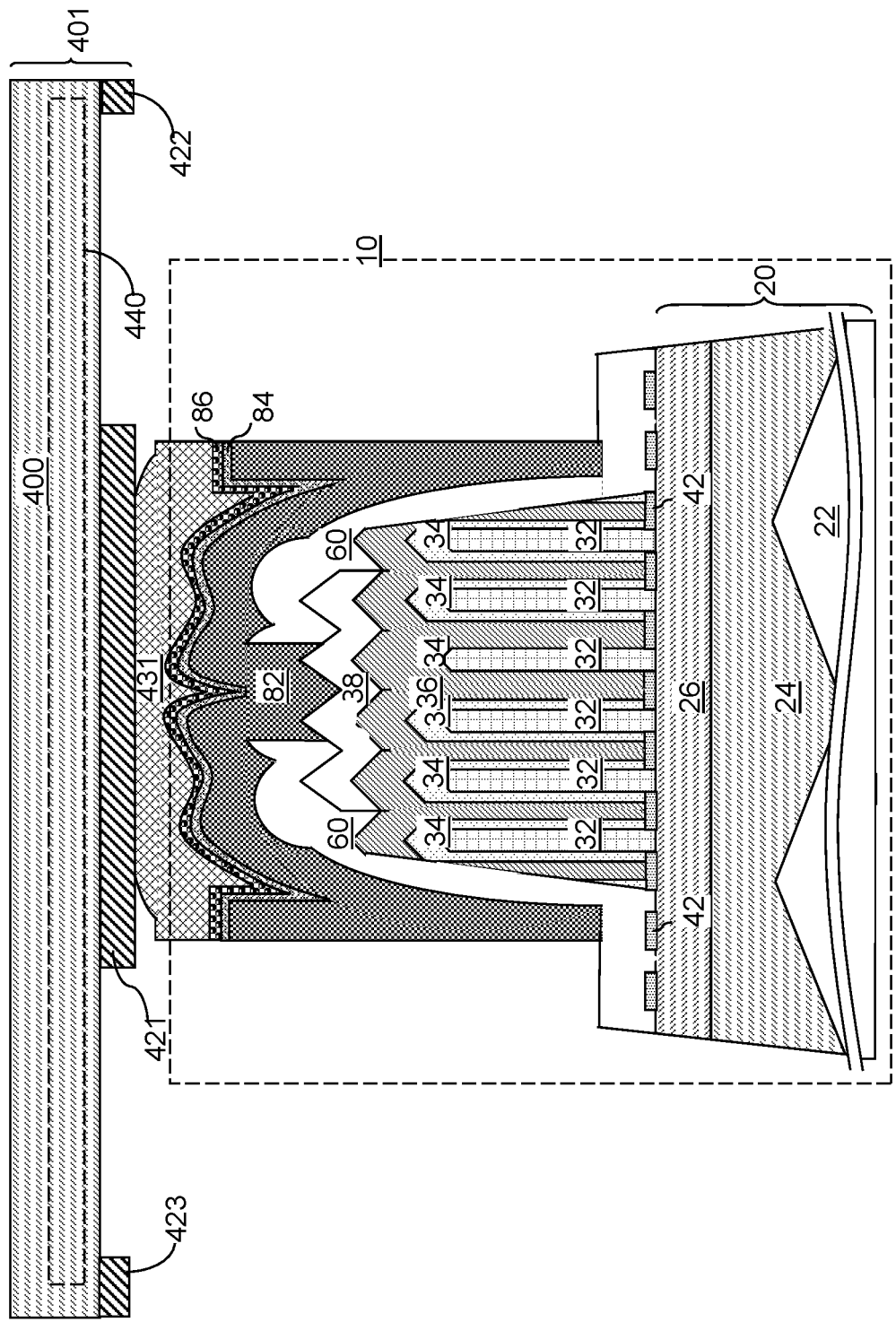
FIG. 13 is a vertical cross-sectional view of the first exemplary structure after bonding a first light emitting diode to a backplane according to an embodiment of the present disclosure.

Referring to FIG. 13, the light emitting device 10 is attached to a backplane 401 by bonding the conductive bonding structure 431 to one of bond pads (421, 422, 423) on the backplane 401. A backplane can be an active or passive matrix backplane substrate for driving light emitting devices. As used herein, a "backplane substrate" refers to any substrate configured to affix multiple devices thereupon. The backplane 400 contains a backplane substrate 400. The backplane substrate 400 is a substrate onto which various devices (e.g., LEDs) can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid and active device circuits are not present. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprises one or more transistors.

Subsequently the support substrate 22 can be removed from the light emitting device 10 which is attached to the backplane 401. For example, laser irradiation from the side of the support substrate 22 can be employed to heat the surface portions of the buffer layer 24 that are proximal to the support substrate 22. The wavelength of the laser beam is selected such that the support substrate 22 is transparent at the wavelength of the laser beam and the material of the bottom portion of the buffer layer 24 is absorptive at the wavelength of the laser beam. For example, if the support substrate 22 includes sapphire and if the buffer layer 24 includes GaN, the wavelength of the laser beam can be in a range from 150 nm to 350 nm, which corresponds the photon energy of about 3.5 eV to 8.2 eV. The laser beam can sequentially irradiate the back side of each die so that the dies are attached only to the backplane 401, and are not attached to the support substrate 22. The support substrate 22 can be detached from the light emitting devices 10 by pulling the support substrate 22 and the light emitting devices 10 apart, as shown in FIG. 14 and as will be described in more detail below in FIGS. 16A-16P.

Figure 14:
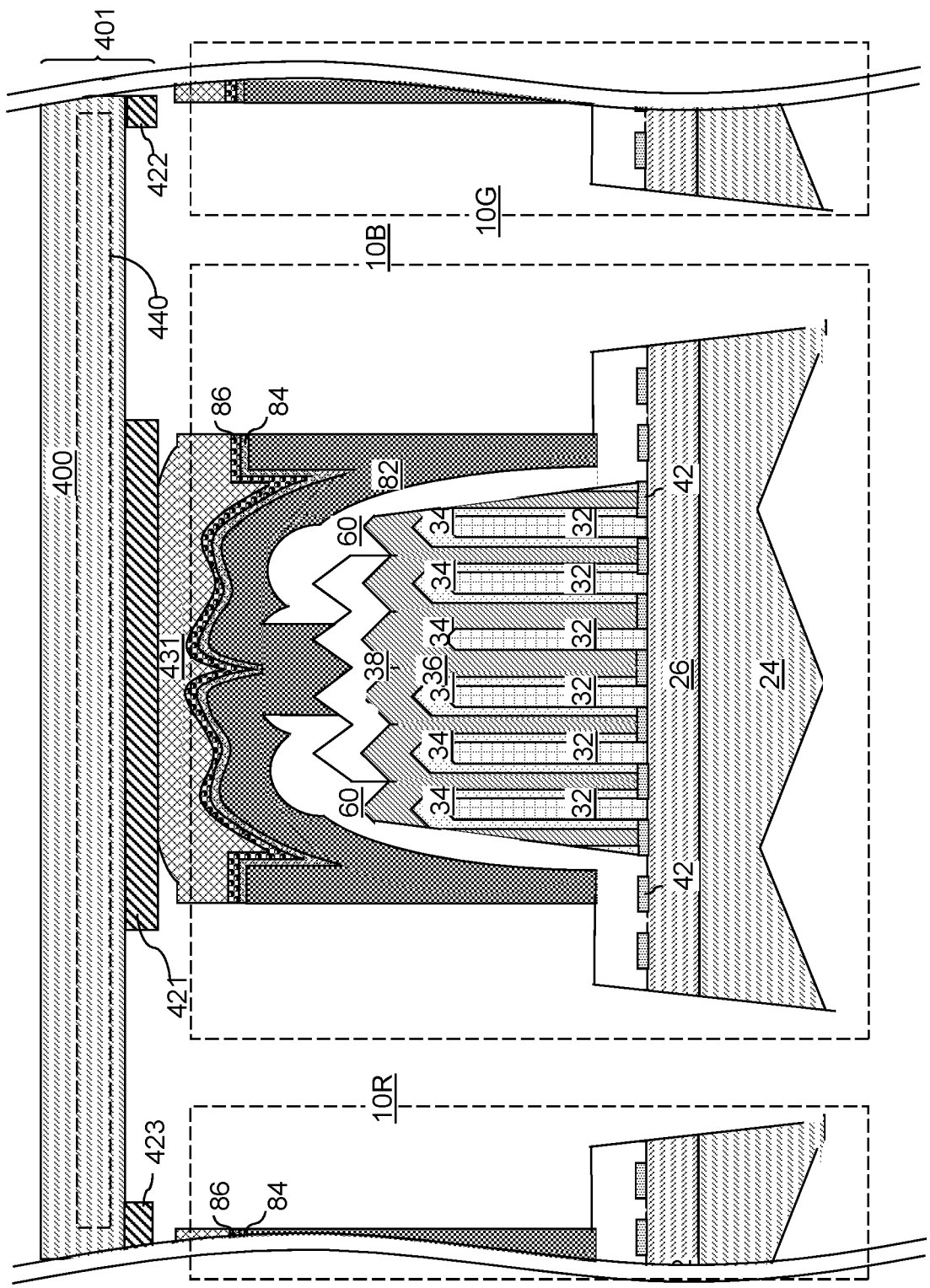
FIG. 14 is a vertical cross-sectional view of the first exemplary structure after bonding additional light emitting diodes to the backplane and removing a support substrate from the substrate of the first light emitting diode according to an embodiment of the present disclosure.
Figure 16B:
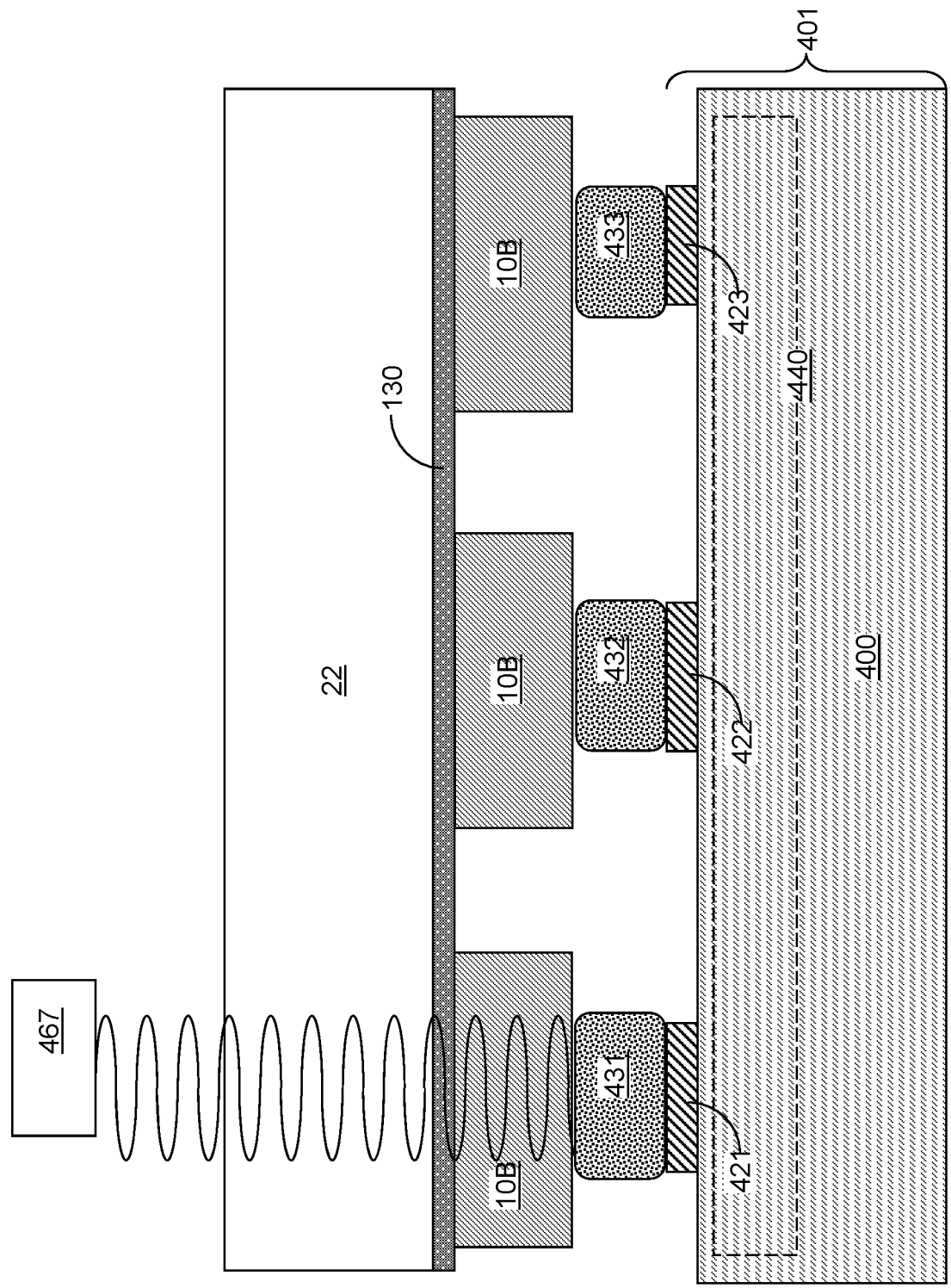
Figure 16C:
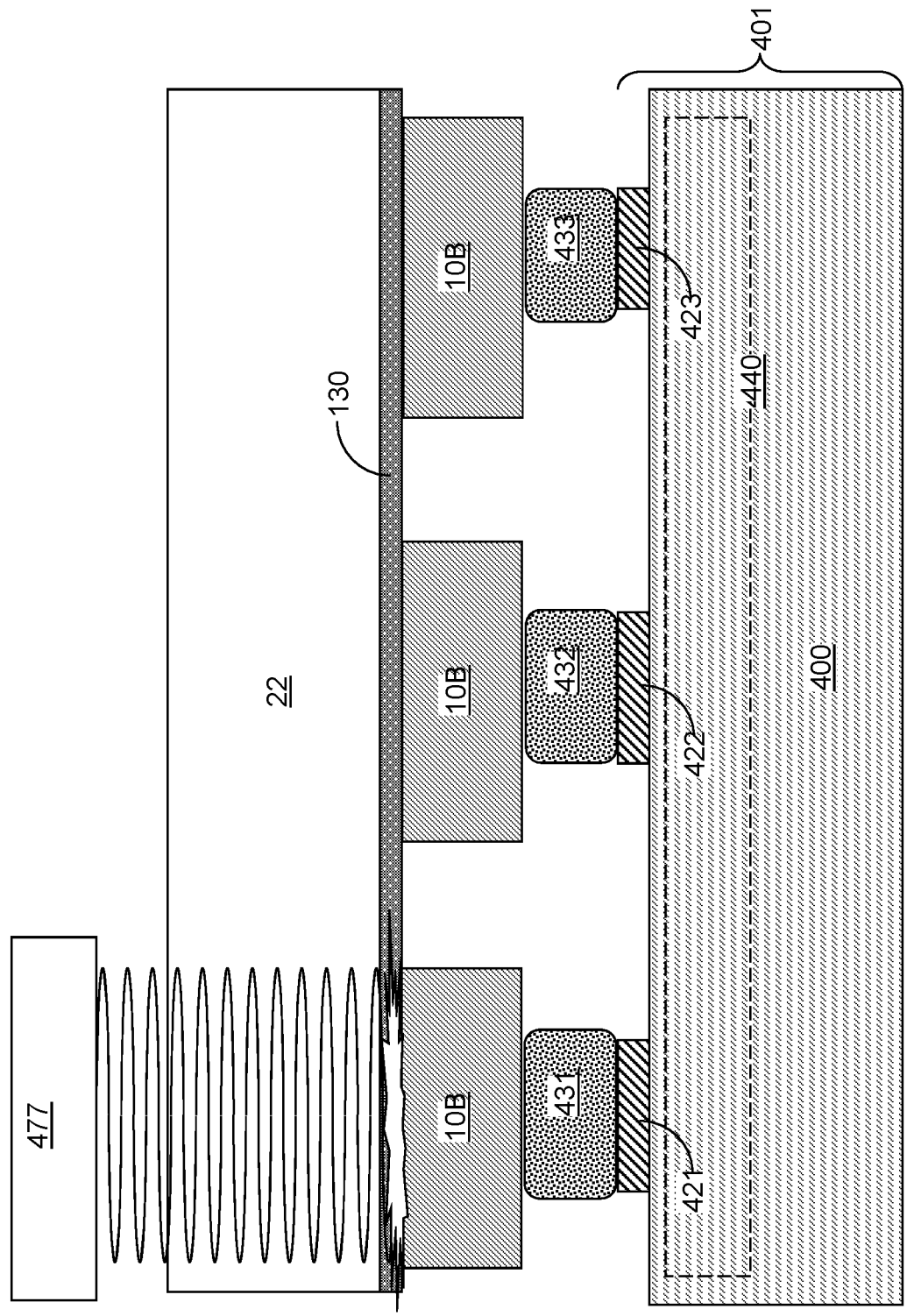
Figure 16D:
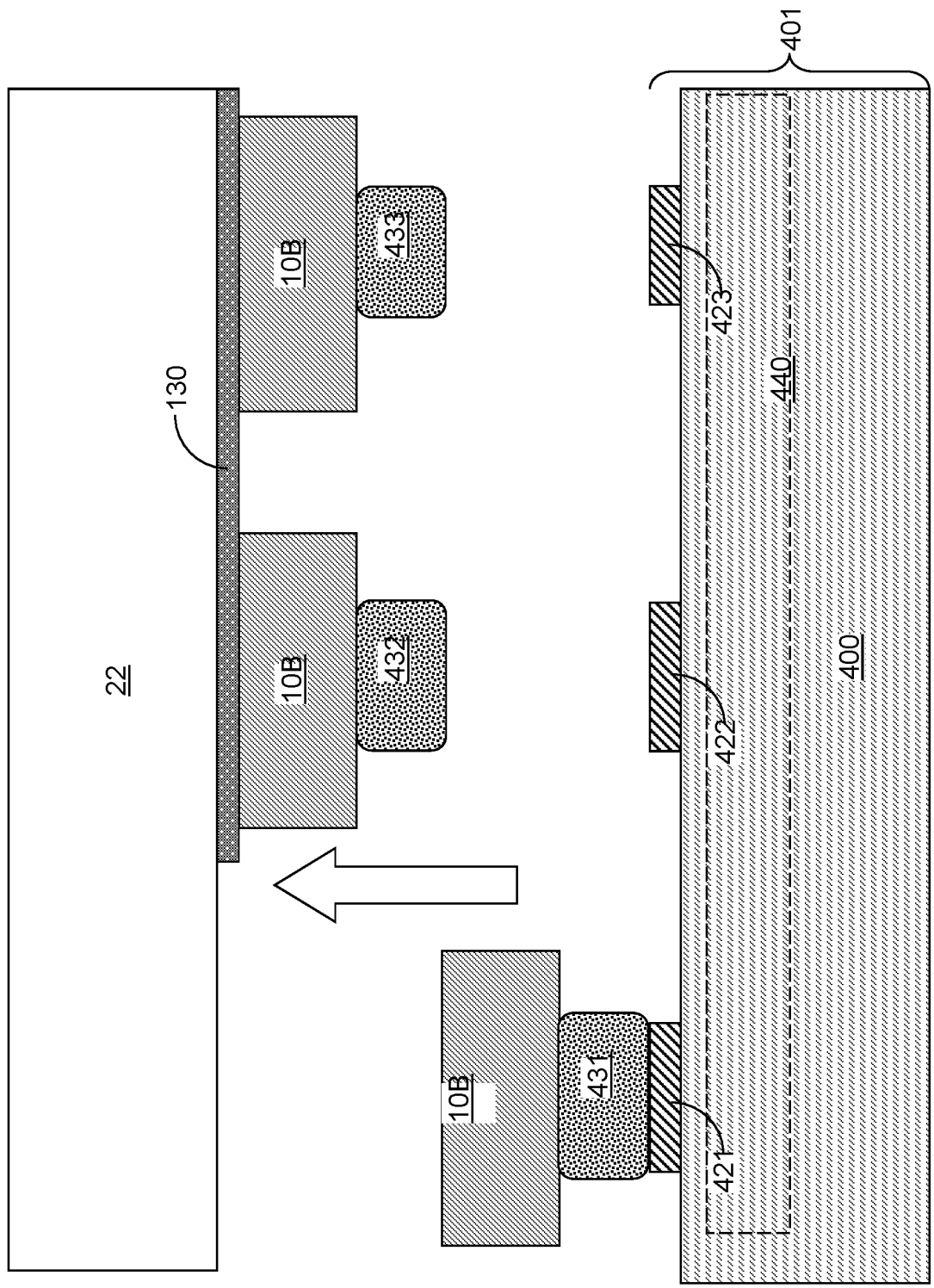
Figure 16F:
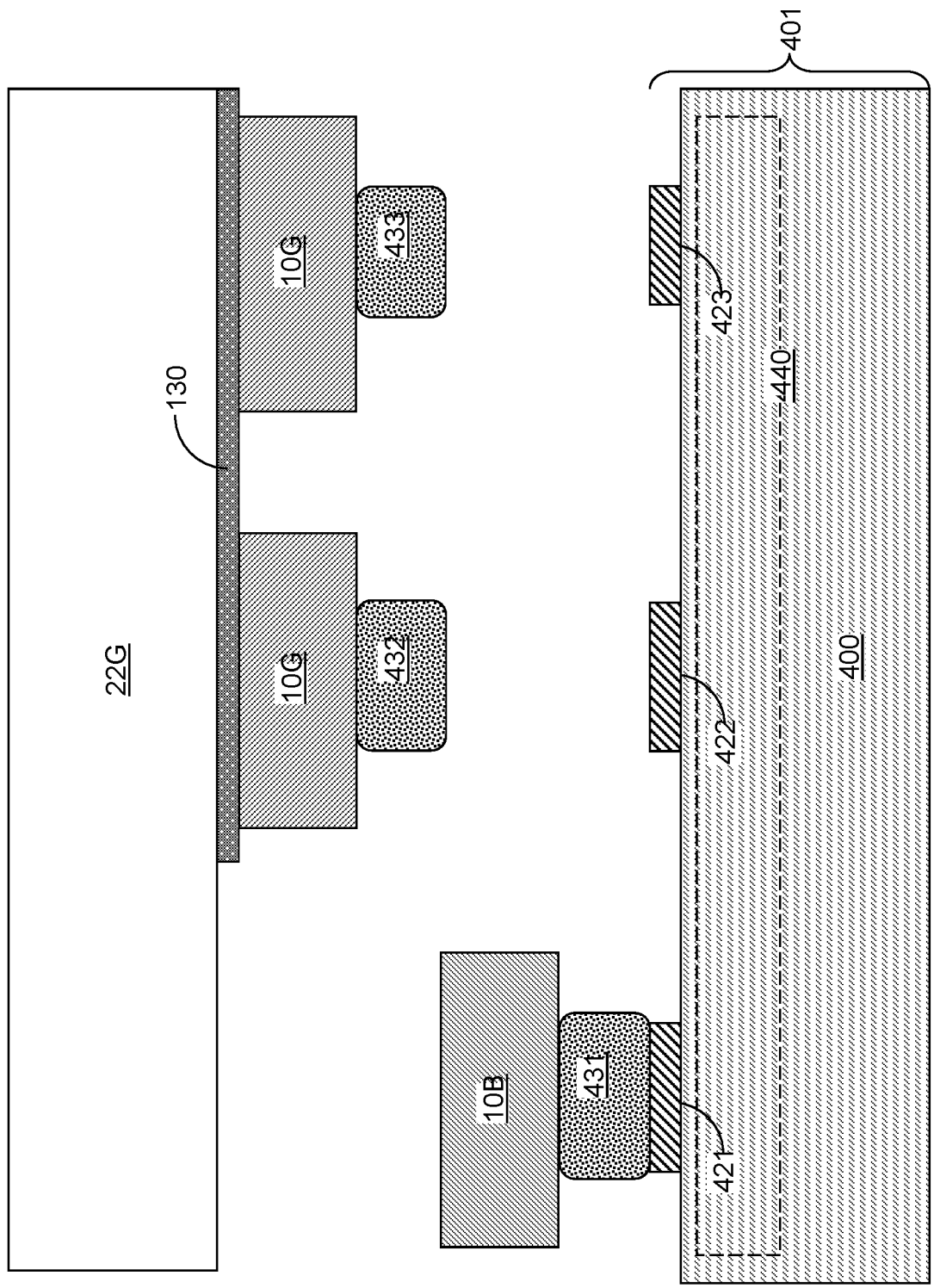
Figure 16G:
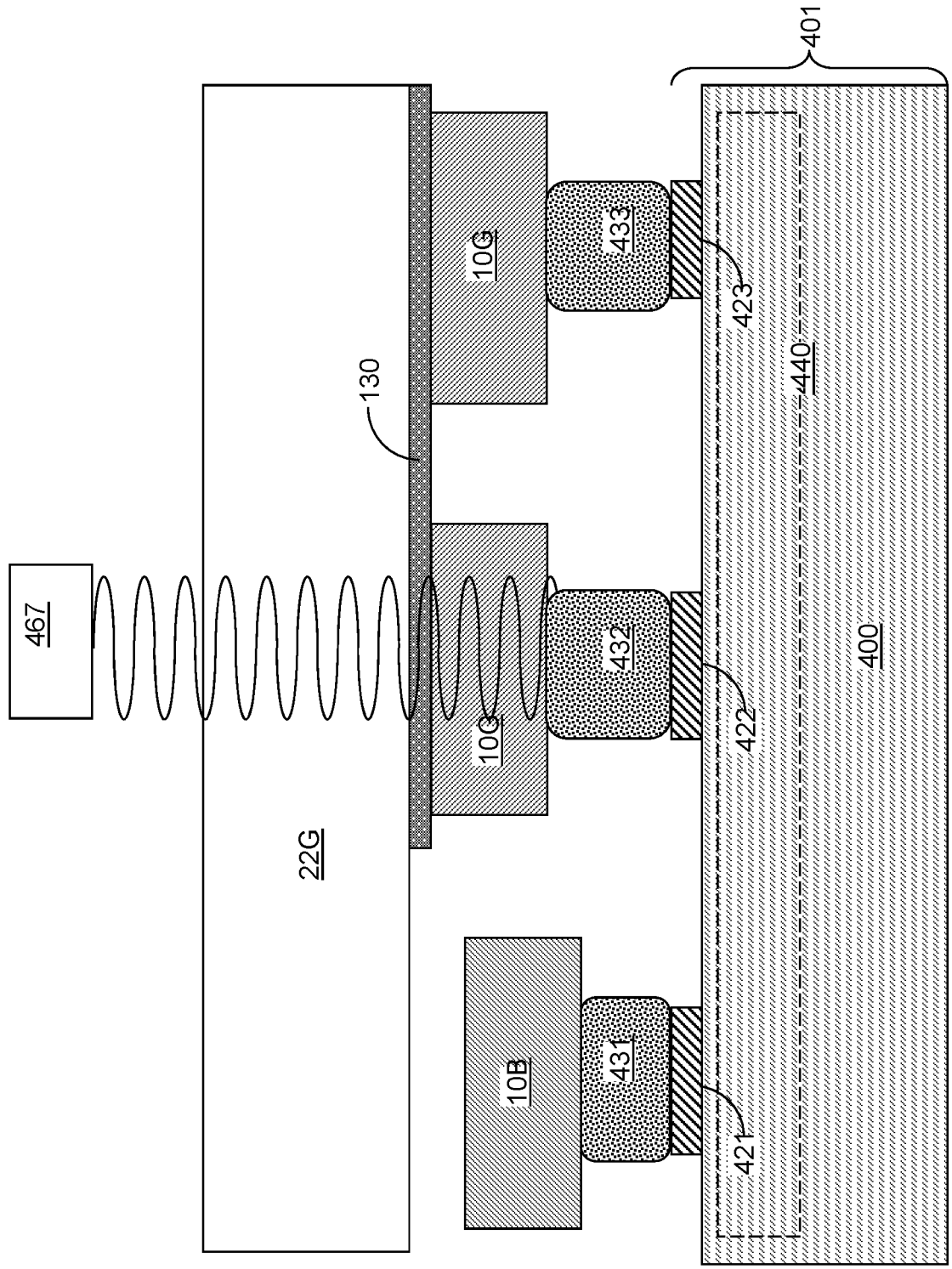
Figure 16I:
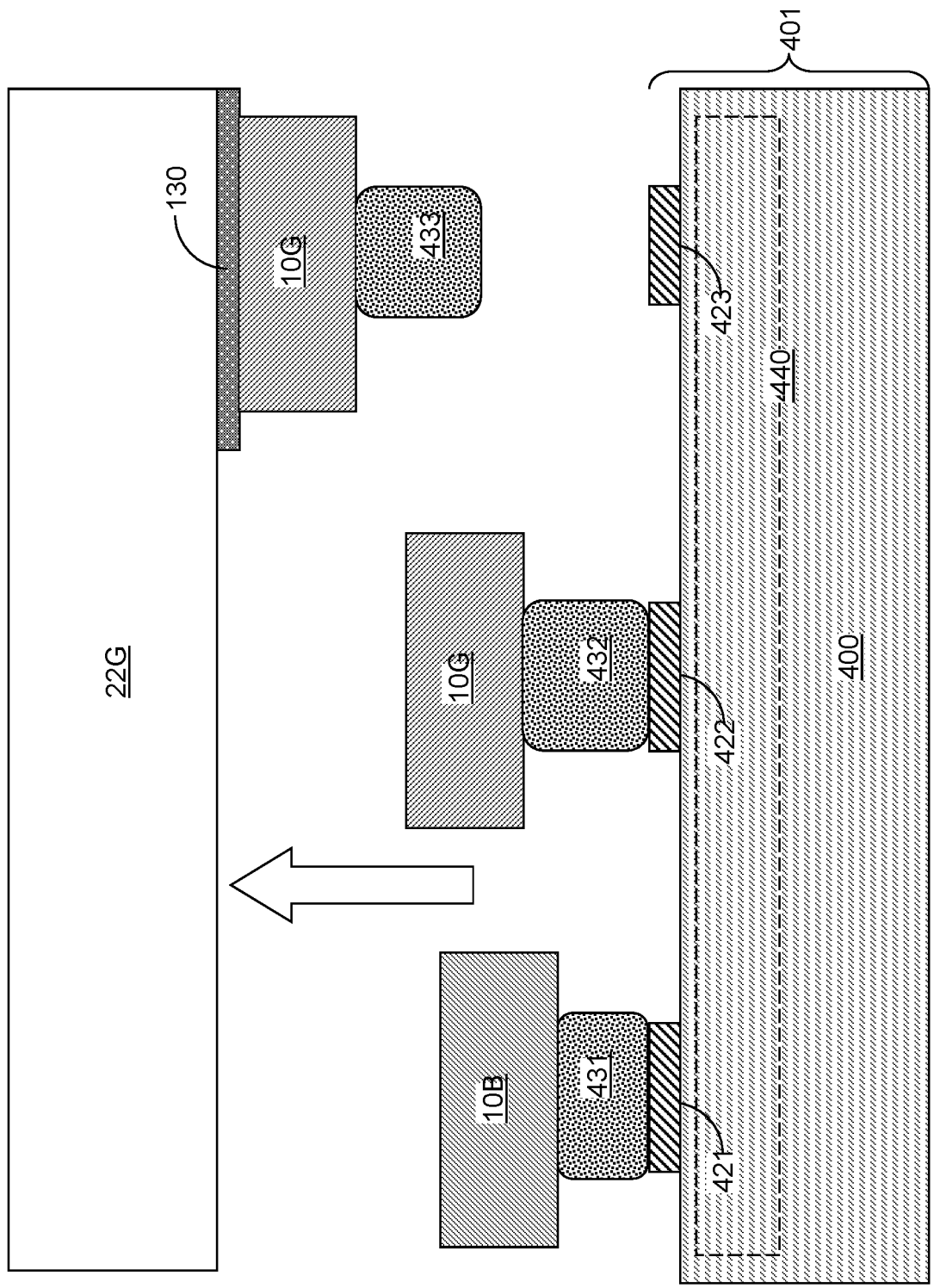
Figure 16J:
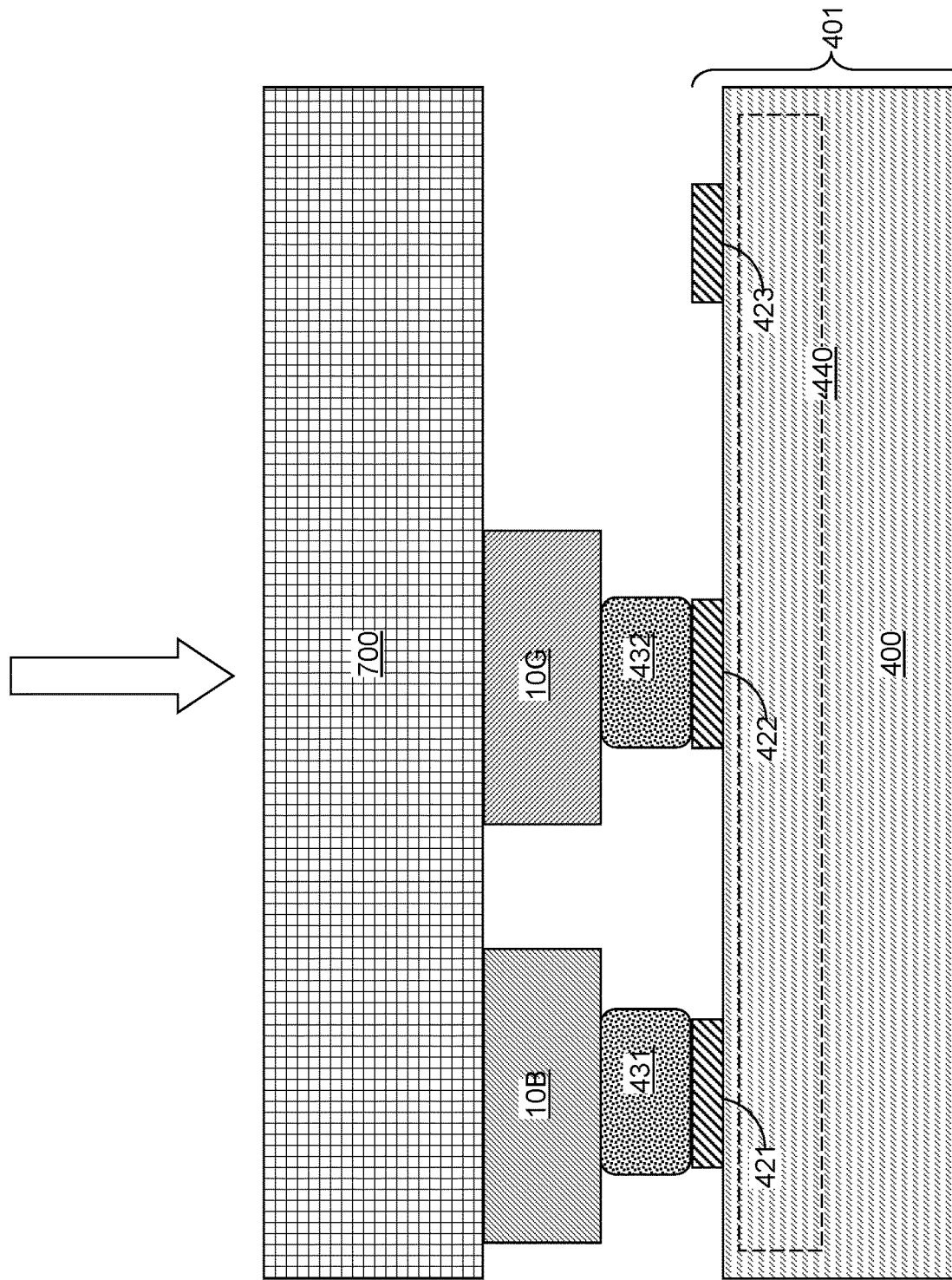
Figure 16K:
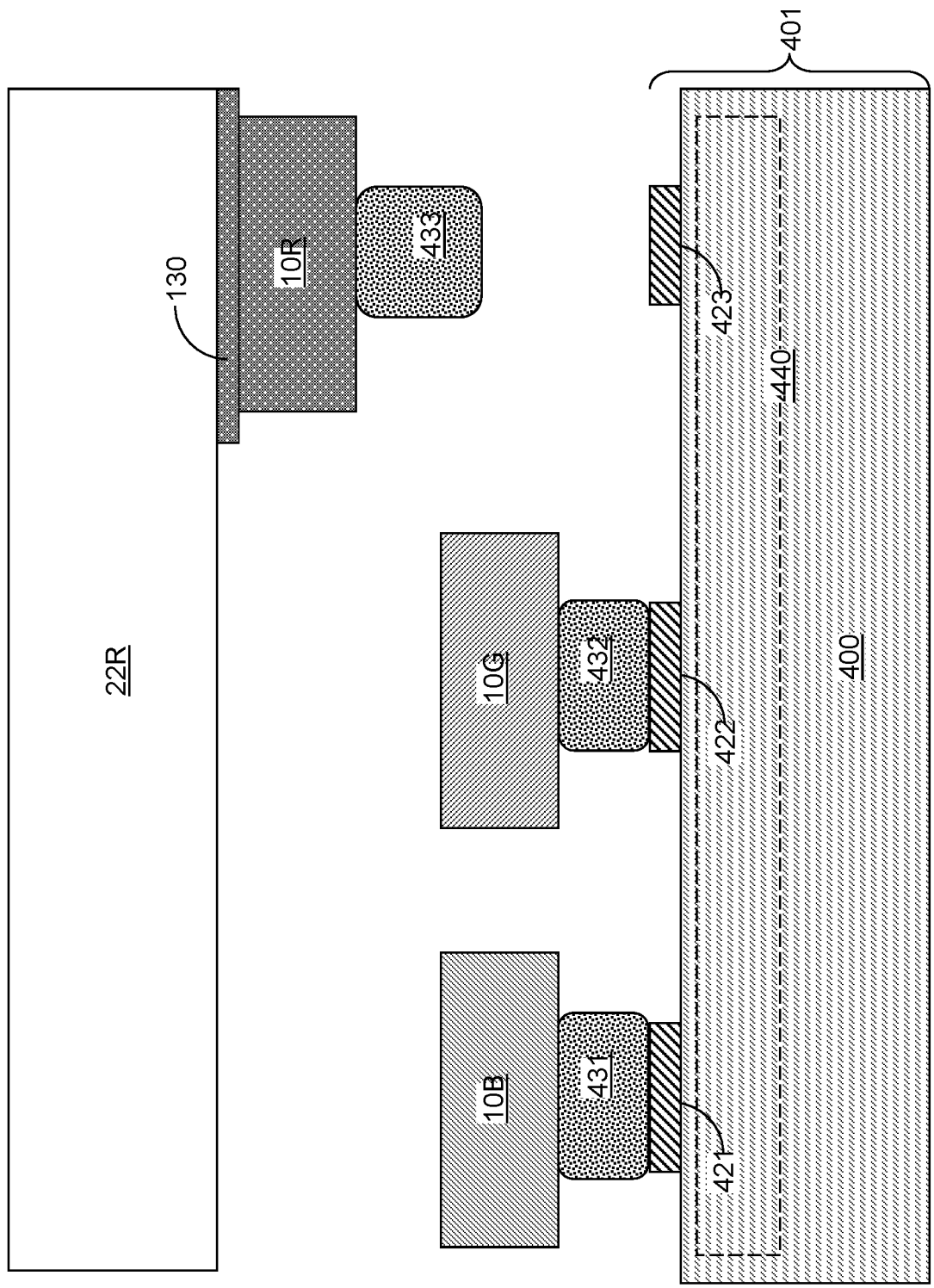
Figure 16L:
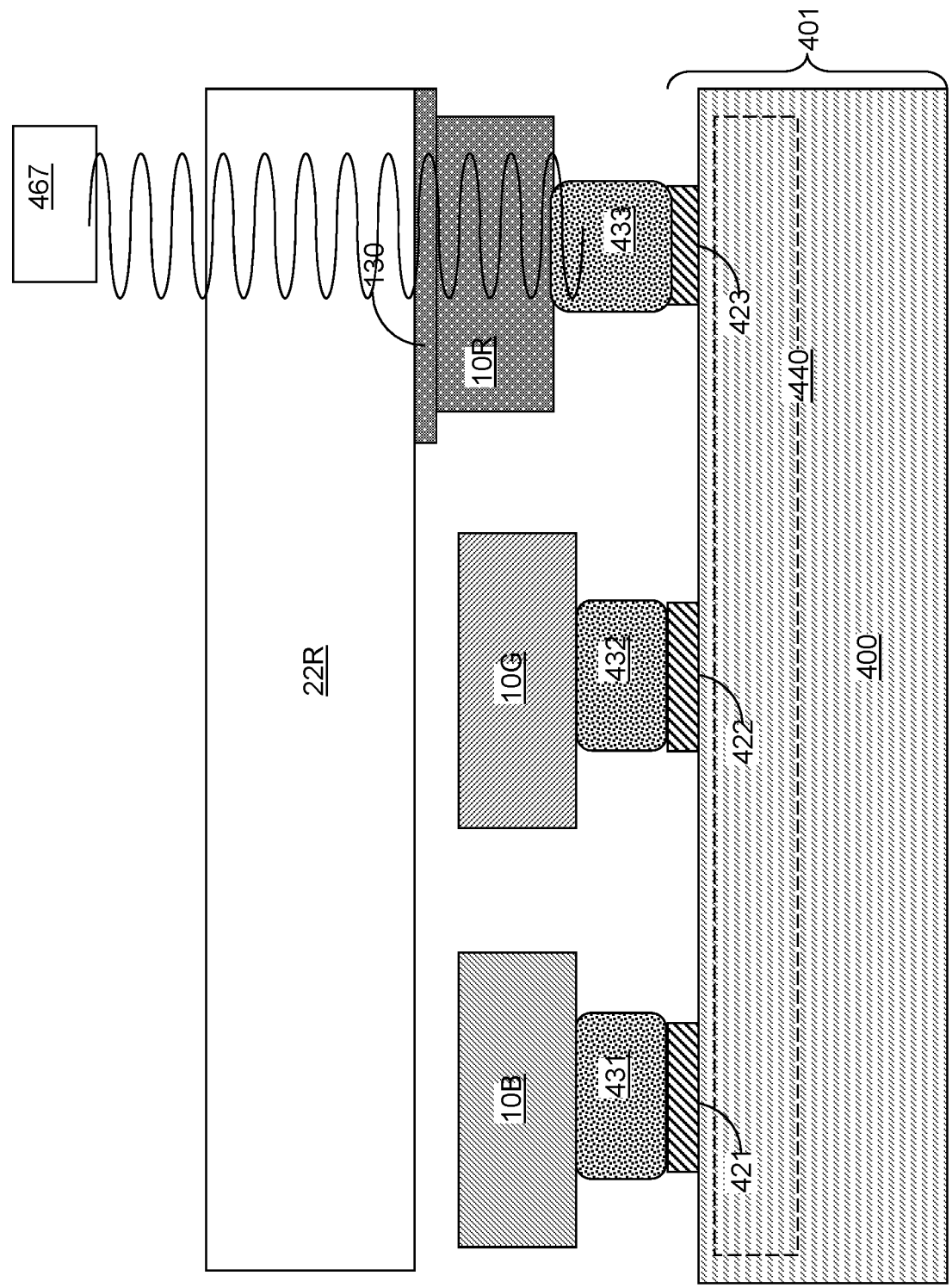
Figure 16M:
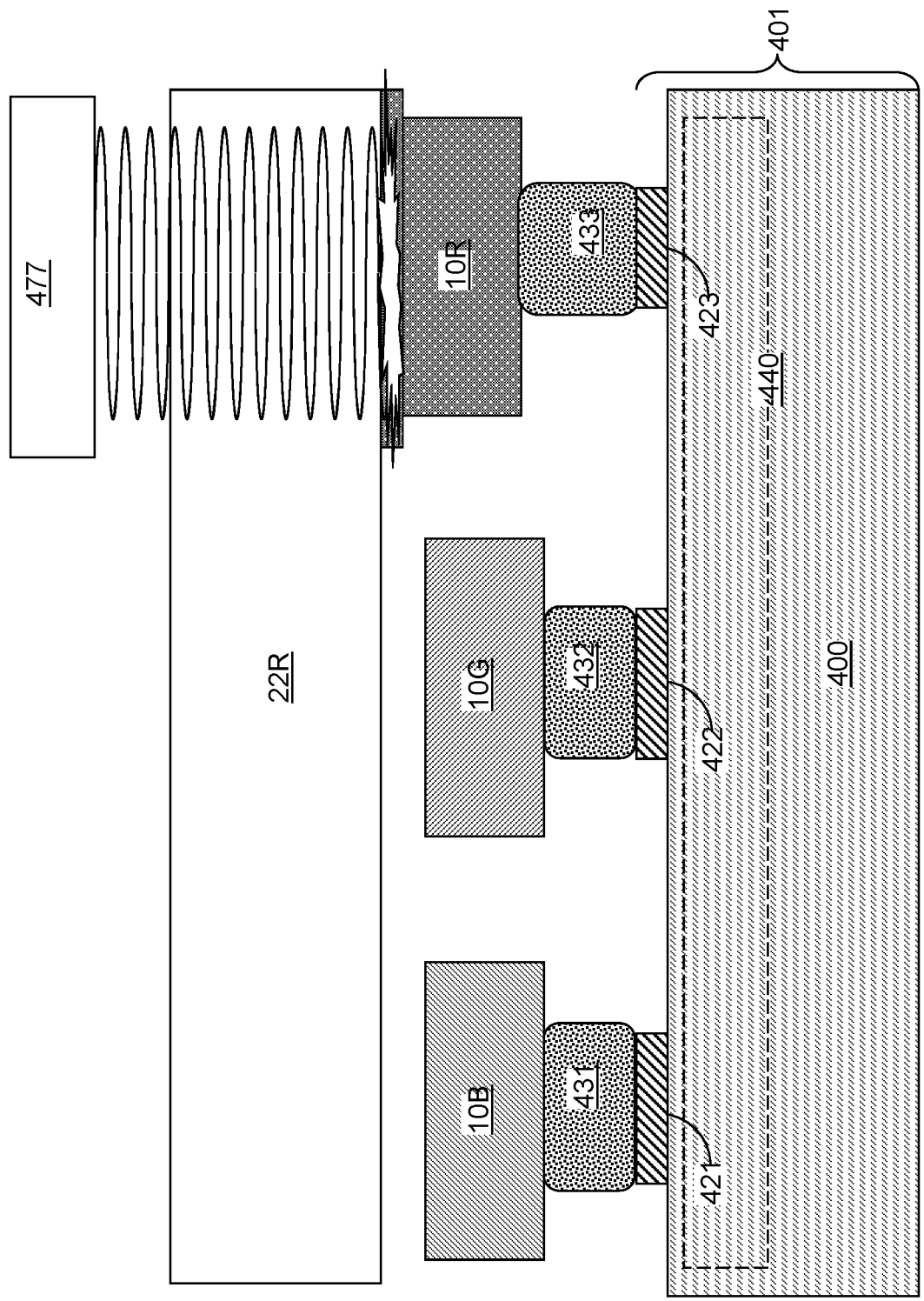
Figure 16N:
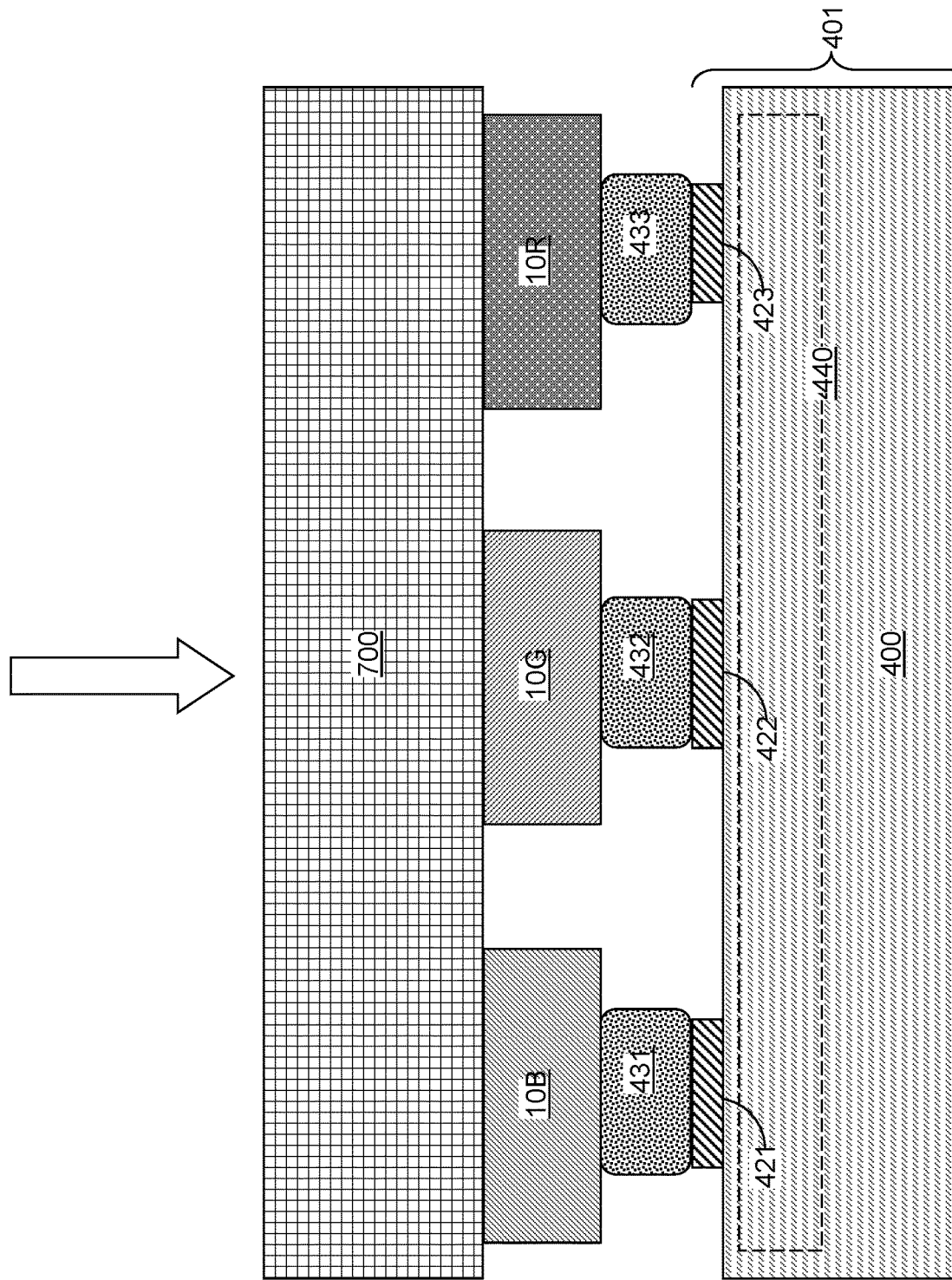
Figure 16O:
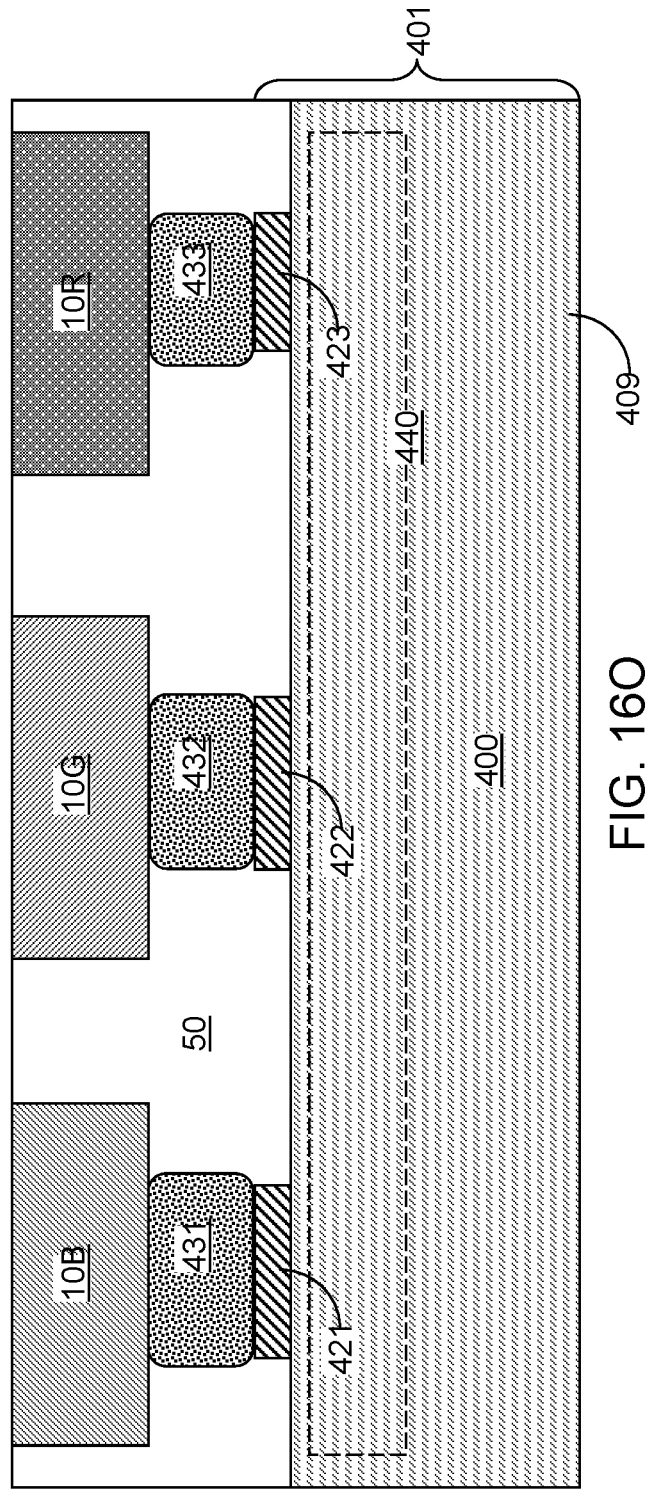
Figure 16P:
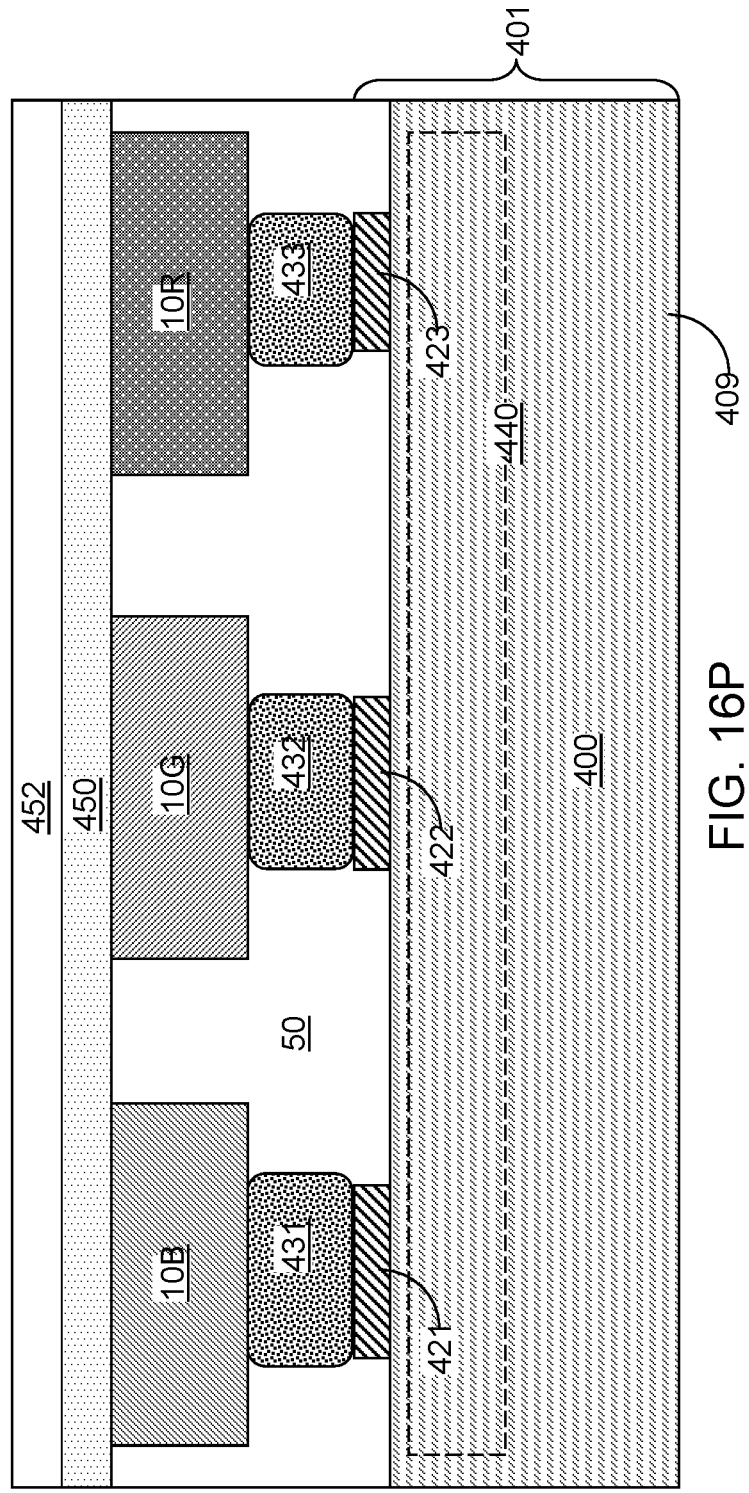

Referring to FIG. 14, additional light emitting diodes may be transferred to the backplane 401 employing the methods to be described in FIGS. 16A-16P. In one embodiment, the backplane 401 can be a display frame for a direct view display device, and each pixel of the direct view display device may include at least one red-light emitting diode 10R configured to emit light at a peak wavelength in a range from 620 nm to 750 nm, at least one green-light emitting diode 10G configured to emit light at a peak wavelength in a range from 495 nm to 570 nm, and at least one blue-light emitting diode 10B configured to emit light at a peak wavelength in a range from 450 to 495 nm.

Figure 15:
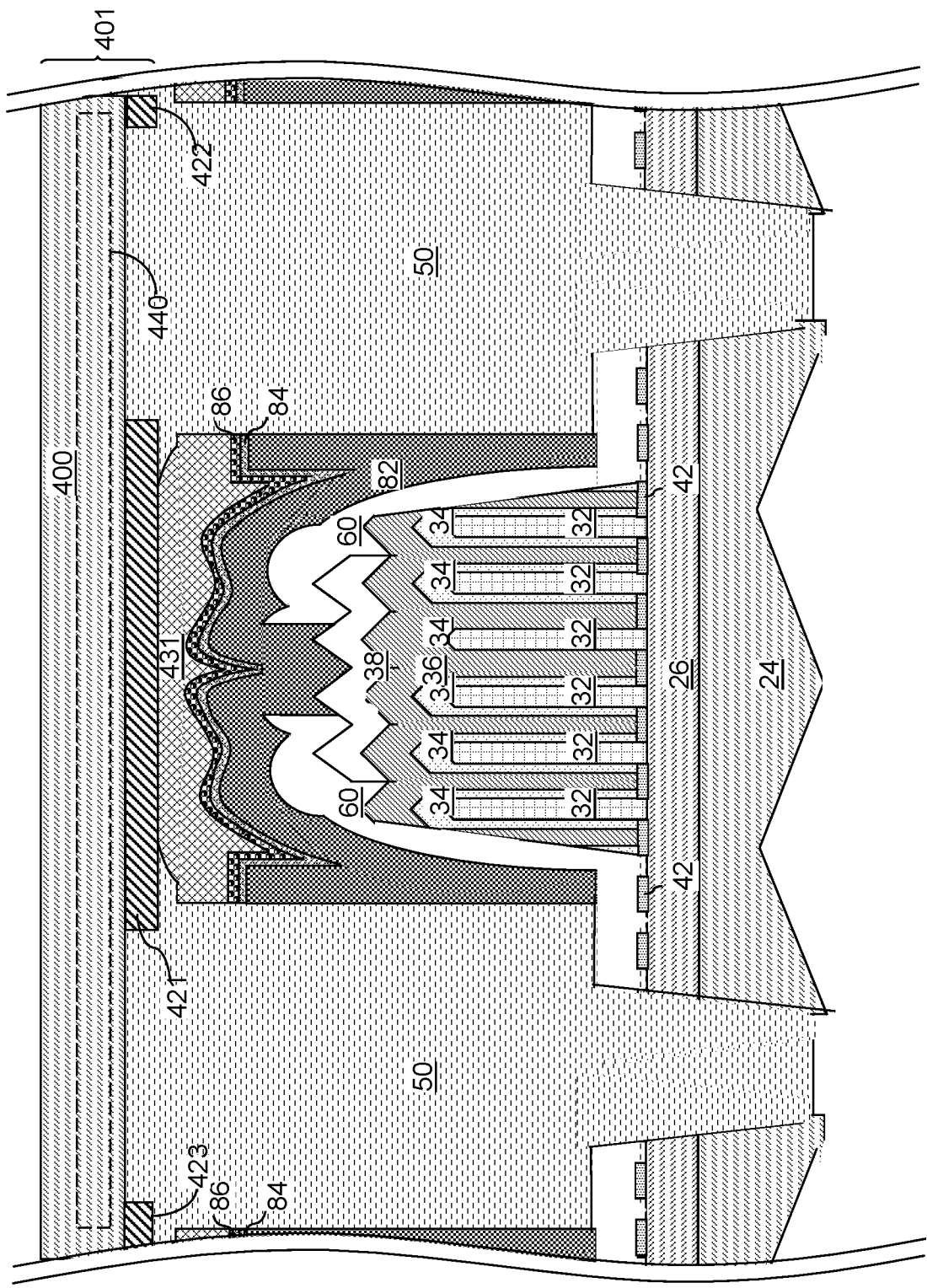
FIG. 15 is a vertical cross-sectional view of the first exemplary structure after formation of a dielectric matrix layer according to an embodiment of the present disclosure.

As shown in FIG. 15, a dielectric matrix layer 50 can be formed around each light emitting device 10 (e.g., 10R, 10G and/or 10B) die before or after the removal of the support substrate 22. The dielectric matrix layer 50 can be formed by depositing a self-planarizing dielectric material such as spin-on glass (SOG) or polymer material, such as benzocyclobutene (BCB) or polybenzoxazole (PBO) (e.g., poly(p-phenylene-2,6-benzobisoxazole) sold under the trade name Zylon). The polymer material may be a low temperature curable material which is cured at 200° C. or below, e.g., 100 to 190° C. after deposition. If the light emitting devices 10 are already attached to the backplane 401, then the dielectric matrix layer 50 is provided (e.g., injected or squeezed) into the spaces between the light emitting devices 10 and the backplane 401. The dielectric matrix layer 50 can be formed around the conductive reflector layer 82, the dielectric material layer 60 and the mesa structure 54 of the light emitting device 10.

Each light emitting device 10 die can constitute a subpixel that emits light of a given color, which may be, for example, red, green, or blue. FIGS. 16A-16P illustrate a method of incorporating the light emitting devices 10, such as a blue, green and/or red light emitting devices (10B, 10G, 10R) into a single pixel of direct view display. The light emitting devices 10 can be the nanowire LEDs described above with respect to FIGS. 1 to 15, different nanowire LEDs and/or bulk (i.e., planar) LEDs. Each of the pixels comprises a red-light emitting diode 10R configured to emit light at a peak wavelength in a range from 620 nm to 750 nm, a green-light emitting diode 10G configured to emit light at a peak wavelength in a range from 495 nm to 570 nm, and a blue-light emitting diode 10B configured to emit light at a peak wavelength in a range from 450 to 495 nm.

Referring to FIG. 16A, an in-process structure is illustrated, which can be employed to form an exemplary light emitting device assembly (e.g., direct view display) according to an embodiment of the present disclosure in which the The exemplary light emitting device assembly can include the same thickness bonding pads (421, 422, 423) for the respective first, second and third LEDs (10B, 10G, 10R) and the same height for the conductive bonding structures (431, 432, 433). The bond pads (421, 422, 423) can have the same composition as each other. The conductive bonding structures (431, 432, 433) can have the same composition as each other. In this embodiment, the backplane substrate 400 may have a substantially planar (i.e., not stepped) upper surface or a stepped upper surface. The bond pads (421, 422, 423) can have the same height or different heights. The conductive bonding structures (431, 432, 433) can have the same height or different heights.

In one embodiment, the conductive bonding structures (431, 432, 433) can be formed on the light emitting devices 10 to be transferred to the backplane 401. For example, first light emitting diodes 10B can be the first devices to be transferred to the backplane substrate 400. The first light emitting diodes 10B can be located on first support substrate 22, which can be a first transfer substrate or a first-type growth substrate. The conductive bonding structures 431 are formed on a first subset of the first light emitting diodes 10B, for example as described above and include the conductive bonding structure 431. The second conductive bonding structures 432 are formed on a second subset of the first light emitting diodes 10B and the third conductive bonding structures 433 are formed on a third subset of the first light emitting diodes 10B.

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Referring to FIG. 16B, the backplane 401 and the assembly including the first light emitting diodes 10B are positioned such that each conductive bonding structure 431 is attached to one first light emitting device 10B, and contacts the respective bonding pad 421. Each second conductive bonding structure 432 can be attached to the another first light emitting device 10B and contacts the second bonding pad 422. Each third conductive bonding structure 433 is attached to yet another first light emitting device 10R and contacts the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the support substrate 22 or within the materials of the devices to be transferred (e.g., the first light emitting devices 10B). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the support substrate 22 and the devices to be transferred. The first conductive bonding structures 431 can be selectively heated by sequential irradiation of a laser beam from the heating laser 467 to reflow each first conductive bonding structure 431, and to bond each first conductive bonding structure 431 to an overlying first light emitting device 10B and to an underlying first bonding pad 421. Preferably, the laser beam is provided through the support substrate 22. The laser beam may be transmitted through the support substrate 22 and through the devices to the conductive reflector layer 82 which absorbs the laser beam and heats the adjacent conductive bonding structures 431 for selective heating and reflow. Alternatively, the laser beam may be absorbed by the support substrate or the device adjacent to the conductive bonding structures 431 to selectively heat and reflow the conductive bonding structures 431 without reflowing the remaining conductive bonding structures (432, 433).

Referring to FIG. 16C, a laser irradiation process is performed to separate each bonded first light emitting device 10B from the first support substrate in the same manner as the processing steps of FIG. 15. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the support substrate 22 and the transferred devices (e.g., the first light emitting diodes 10B). The ablation material layer 130 may comprise the semiconductor buffer layer 24 (e.g., gallium nitride layer) described above or another material, such as a laser radiation absorptive insulating release layer (e.g., silicon rich silicon nitride layer). Each portion of the ablation material layer 130 overlying the first conductive bonding structures 431 can be sequentially irradiated by a laser beam from the laser 477 to dissociate each underlying first light emitting device 10B.

Referring to FIG. 16D, the assembly of the first support substrate 22 and attached first light emitting diodes 10B (i.e., the complement of the first subset of the first light emitting diodes 10B) is separated from the backplane 401 and the first subset of the first light emitting diodes 10B.

Referring to FIG. 16E, a dummy substrate 700 can employed to push the first light emitting diodes 10B on the first conductive bonding structures 431 toward the backplane 401 while optionally thermally reflowing the first conductive bonding structures 431. The compressible first conductive bonding structures can be compressed by 5 to 20% of their thickness during this step.

Referring to FIG. 16F, a second support substrate (such as a second growth or transfer substrate) 22G from which a first subset of second light emitting devices 10G are removed is positioned over the in-process exemplary light emitting device assembly, and is aligned such that a second subset of the second light emitting diodes 10G overlies the second bonding pads 422.

Referring to FIG. 16G, the backplane 401 and the assembly including the second light emitting diodes 10G are positioned such that each second conductive bonding structure 432 is attached to the second light emitting device 10G and contacts the second bonding pad 422.

In one embodiment, each second conductive bonding structure 432 can be attached to one of an overlying second light emitting device 10G, and the second bonding pad 422, and each third conductive bonding structure 433 can be attached to one of an overlying second light emitting device 10G and contacts the third bonding pad 423.

A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the support substrate 22G or within the materials of the devices to be transferred (e.g., the second light emitting devices 10G). The same heating laser can be employed as in the processing steps of FIG. 16B. The second conductive bonding structures 432 can be sequentially irradiated by a laser beam from the heating laser 467 to reflow each second conductive bonding structure 432, and to bond each second conductive bonding structure 432 to an overlying second light emitting device 10G and to an underlying second bonding pad 422.

Referring to FIG. 16H, a laser irradiation process is performed to separate each bonded second light emitting device 10G from the second support substrate in the same manner as the processing steps of FIG. 15. The wavelength of the laser 477 can be different from the wavelength of the heating laser 467, and provides more heating to the material of the ablation material layer 130 than to the materials of the support substrate 22G and the transferred devices (e.g., the second light emitting diodes 10G). Each portion of the ablation material layer 130 overlying the second conductive bonding structures 432 can be sequentially irradiated by a laser beam from the laser 477 to dissociate each underlying second light emitting device 10G.

Referring to FIG. 16I, the assembly of the second support substrate 22G and attached second light emitting diodes 10G (a third subset of the second light emitting diodes 10G that remain on the second support substrate) is separated from the backplane 401 and the second subset of the second light emitting diodes 10G that are now attached to the backplane 401.

Referring to FIG. 16J, a dummy substrate 700 can employed to push the second light emitting diodes 10G on the second conductive bonding structures 432 toward the backplane 401 in the same manner as described above.

Referring to FIG. 16K, a third support substrate (such as a third transfer substrate 22R), from which a first subset and a second subset of third light emitting devices 10R have been removed in prior processing steps, is positioned over the in-process fourth exemplary light emitting device assembly, and is aligned such that a third subset of the third light emitting diodes 10R overlies the third bonding pads 423.

Referring to FIG. 16L, the backplane 401 and the assembly including the third light emitting diodes 10R are positioned such that each third conductive bonding structure 433 is attached a third light emitting device 10R and contacts the third bonding pad 423. If any addition conductive bonding structures (not shown) are present, additional conductive bonding structures (not shown) overlying such additional bonding pads can contact underlying additional bonding pads and overlying third light emitting devices 10R, and can be attached to the underlying additional bonding pads or to the overlying third light emitting devices 10R.

A heating laser 467 is employed to reflow the third conductive bonding structures 433. The heating laser 467 can have a wavelength that induces greater absorption of energy within the material of the third conductive bonding structures 433 than within the materials of the support substrate 22R or within the materials of the devices to be transferred (e.g., the third light emitting devices 10R). The same heating laser can be employed as in the processing steps of FIG. 16B or FIG. 16G. The third conductive bonding structures 433 can be sequentially irradiated by a laser beam from the heating laser 467 to reflow each third conductive bonding structure 433, and to bond each third conductive bonding structure 433 to an overlying third light emitting device 10R and to an underlying third bonding pad 423.

Referring to FIG. 16M, a laser irradiation process is performed to separate each bonded third light emitting device 10R from the third support substrate in the same manner as in the processing steps of FIG. 15.

Referring to FIG. 16N, a dummy substrate 700 may be employed to push the third light emitting diodes 10R on the third conductive bonding structures 433 toward the backplane 401. The assembly of the third support substrate 22R and any remaining third light emitting diodes 10R, if any, is separated from the backplane 401 and the third subset of the third light emitting diodes 10R that are now attached to the backplane 401 in the same manner as above. The first, second and third LEDs (10B, 10G, 10R) attached to the backplane 401 have co-planar top and bottom surfaces (e.g., top surfaces which deviate by less than 0.25 microns (e.g., 0 to 0.2 microns) from a first common plane and bottom surfaces which deviate by less than 0.25 (e.g., 0 to 0.2 microns) microns from a second common plane due to the compressible conductive bonding structures.

Referring to FIG. 16O, the dielectric matrix layer 50 illustrated in FIG. 15 can be applied in the spaces between the light emitting devices (10B, 10G, 10R) that are bonded to the backplane 401. While FIG. 16O illustrates only three devices (10B, 10G, 10R), it is understood that an array of pixels is formed on the backplane 401, and each pixel includes a set of light emitting device such as a blue-light emitting diode as a first light emitting device 10B, a green-light emitting diode as a second light emitting device 10G, and a red-light emitting diode as a third light emitting device 10R. The dielectric matrix layer 50 can laterally surround each of the red-light emitting diodes, the green-light emitting diodes, and the blue light emitting diodes within the array of pixels. The dielectric matrix layer 50 can include a self-planarizing dielectric material such as spin-on glass (SOG) or polymer, or can be planarized by a recess etch or chemical mechanical planarization. The top surface of the dielectric matrix layer 50 as planarized can be within the horizontal plane including the top surfaces of the devices (10B. 10G, 10R), or can be vertically recessed below the horizontal plane including the top surfaces of the devices (10B. 10G, 10R).

Referring to FIG. 16P, a front side transparent conductive oxide layer 450 can be formed over the dielectric matrix layer 50 and directly on the electrical nodes that are located on top of each device (10B, 10G, 10R). For example, the front side transparent conductive oxide layer 450 can be deposited on the semiconductor buffer layer 24 or directly on the compound semiconductor material layer 26 of the first conductivity type. For example, if the buffer layer 24 has a high resistivity and is not removed during the laser ablation step described above, then an additional etch back or CMP is performed to remove the buffer layer 24 and expose the doped compound semiconductor layer 26 of the first conductivity type.

In this case, the front side transparent conductive oxide layer 450 can be a common ground electrode for each of the red-light emitting diodes 10R, the green-light emitting diodes 10G, and the blue-light emitting diodes 10B.

An optional transparent passivation dielectric layer 452 can be formed over the front side transparent conductive oxide layer 450. The transparent passivation dielectric layer 452 can include silicon nitride or silicon oxide. Thus, the LEDs 10B, 10G and 10R are so-called bottom emitting, vertical LEDs which emit light through the on the compound semiconductor material layer 26, the front side transparent conductive oxide layer 450 and transparent passivation dielectric layer 452. The LEDs are vertical devices because they have electrical contacts (i.e., layer 450 and bonding structures or pads (431, 432, 433)) on opposite sides thereof.

The red-light emitting diodes, the blue-light emitting diodes and/or the green-light emitting diodes of the type described above are located in direct view display device 460 of FIG. 16P. Such a direct view display device comprises an array of pixels located on a backplane 401. Each of the pixels comprises a red-light emitting diode configured to emit light at a peak wavelength in a range from 620 nm to 750 nm, a green-light emitting diode configured to emit light at a peak wavelength in a range from 495 nm to 570 nm, and a blue-light emitting diode configured to emit light at a peak wavelength in a range from 450 to 495 nm. Each of the red-light emitting diodes 10R, the green-light emitting diodes 10G, and the blue light emitting diodes 10B can be a planar LED or a nanowire LED.

In one embodiment, the red-light emitting diode in each pixel comprises a first conductive bonding structure 433 (such as a conductive bonding structure) that is electrically shorted to the first p-doped compound semiconductor material layer 36 and is bonded to a respective bonding pad 423 on the backplane 401; and the at least one of the green-light emitting diode 10G, and the blue-light emitting diode 10B in each pixel comprises a second conductive bonding structure (431 or 432) (such as a conductive bonding structure) that is electrically shorted to the respective p-doped compound semiconductor material layer 36 and is bonded to another respective bonding pad (421 or 422) on the backplane 401.

In one embodiment, the direct view display device can further include a dielectric matrix layer 50 laterally surrounding each of the red light emitting diodes 10R, the green light emitting diodes 10G, and the blue light emitting diodes 10B within the array of pixels, and a common front side transparent conductive oxide layer 450 located on the dielectric matrix layer 50 and electrically connected to contact nodes (e.g., shorted to the contact nodes of each instance of layers 24 and/or 26) of the red light emitting diode, green light emitting diode, and the blue light emitting diode in each pixel.

Each light emitting device 10 die illustrated in FIGS. 14 and 15 comprises a substrate 20 including a doped compound semiconductor layer 26 and optionally a buffer layer 24; an array of nanowires (32, 34) extending vertically from a top surface of the doped compound semiconductor layer 26, wherein each nanowire (32, 34) within the array includes a nanowire core 32 having a doping of a first conductivity type and an active shell 34 including an active light emitting layer (which emits light upon application of electrical bias therethrough) a second-conductivity-type semiconductor material layer 36 contacting sidewalls of each nanowire (32, 34) within the array of nanowires (32, 34); a dielectric material layer 60 overlying the second-conductivity-type semiconductor material layer 38 and laterally surrounding the array of nanowires (32, 34); a conductive reflector layer 82 including a laterally extending portion 82l that overlies the array of nanowires (32, 34) and a sidewall portion 82s that laterally surrounds the array of nanowires (32, 34) and electrically connected (e.g., shorted) to the second-conductivity-type semiconductor material layer 36; and a conductive bonding structure overlying, and electrically connected (e.g., shorted) to the reflector layer 431.

In one embodiment, the conductive reflector layer 82 is laterally spaced from the array of nanowires (32, 34) by sidewall portions of the dielectric material layer 60. In one embodiment, the dielectric material layer 60 comprises a horizontal portion located outside the area of a mesa structure containing the array of nanowires (32, 34), overlying the top surface of the substrate 20, and adjoined to the sidewall portions of the dielectric material layer 60. The horizontal portion of the dielectric material layer 60 may contact the doped compound semiconductor layer 26.

The light emitting device can further include at least one metallic barrier layer (84, 86) contacting a region of the laterally extending portion 82l of the conductive reflector layer 82 and electrically shorted to the conductive bonding structure 43. In one embodiment, the light emitting device can include a dielectric matrix layer 50 laterally surrounding the dielectric material layer 60, and the substrate (24, 26). In one embodiment, each interface between the dielectric matrix layer 50 and any of the dielectric material layer 60 and the substrate (24, 26) has a taper angle with respect to a vertical direction that is perpendicular to the top surface of the substrate (24, 26). The taper angle can be in a range from 3 degrees to 30 degrees.

In one embodiment, the second-conductivity-type semiconductor material layer 36 comprises a horizontally extending portion that overlies the array of nanowires (32, 34); and the light emitting device further comprises a transparent conductive oxide layer 38 located on the horizontally extending portion of the second-conductivity-type semiconductor material layer 36. The transparent conductive oxide layer 38 has a shorter length than the horizontally extending portion second-conductivity-type semiconductor material layer 36, such that edge portions of the horizontally extending portion of the second-conductivity-type semiconductor material layer 36 are exposed below the transparent conductive oxide layer 38.

In one embodiment, a downward-protruding portion 82d of the conductive reflector layer 82 extends through an opening in the dielectric material layer 60 and contacts the transparent conductive oxide layer 38.

In one embodiment, the conductive reflector layer 82 comprises at least one material selected from silver and aluminum. In one embodiment, a patterned dielectric mask layer 42 can be located on the top surface of the substrate (24, 26). Each nanowire core 32 can vertically extend through a respective opening 43 through the patterned dielectric mask layer 42. The patterned dielectric mask layer 42 can further comprises additional openings 43 located outside an area of the array of nanowires (32, 34). In this case, the dielectric material layer 60 contacts the doped compound semiconductor layer 26 through the additional openings 43.

The conductive reflector layer 82 can have tapered sidewall portions, which are caused by the taper angle of the interface between the sidewalls of the assembly of the nanowires (32, 34) and the second-conductivity-type semiconductor material layer 36 and the inner sidewall of the dielectric material layer 60. By tailoring the general angle of the tapered sidewall portions of the conductive reflector layer 82, angular distribution of light emitted from the light emitting diode through the doped compound semiconductor layer 26 and the buffer layer 24 can be optimized for viewing with minimal waste of stray light that is emitted outside a target viewing angle.

Figure 17:
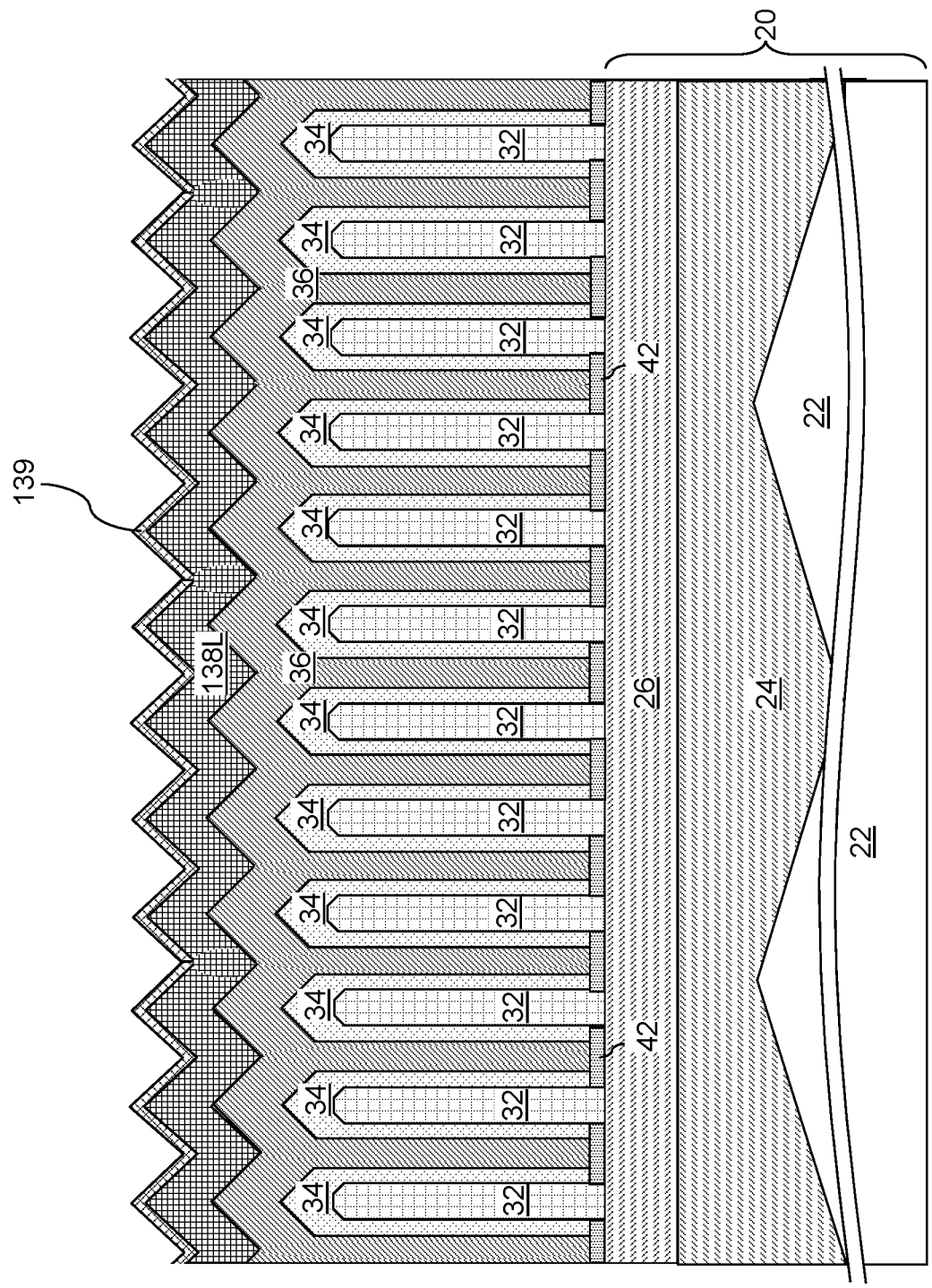
FIG. 17 is a vertical cross-sectional view of a second exemplary structure after depositing an electrode metal layer and an electrode barrier layer according to an embodiment of the present disclosure.

Referring to FIG. 17, a second exemplary structure can be derived from the first exemplary structure of FIG. 3 by depositing a stack of an electrode metal layer 138L and an electrode barrier layer 139 over the second-conductivity-type semiconductor material layer 36. The electrode metal layer 138L includes a reflective material that does not diffuse into the second-conductivity-type semiconductor material layer 36. For example, the conductive metal layer can include silver or a silver alloy. In one embodiment, the conductive metal layer can consist essentially of silver. The thickness of the electrode metal layer 138L can be in a range from 100 nm to 1,000 nm, although lesser and greater thicknesses can also be employed.

The electrode barrier layer 139 includes a material that can prevent diffusion of the material of the electrode metal layer 138L into a material layer to be subsequently deposited thereupon such as an insulating dielectric layer. In one embodiment, the electrode barrier layer 139 can include a material such as TiN, TaN, WN, or a titanium/platinum alloy. The electrode barrier layer 139 can be deposited by vacuum evaporation or sputtering. The thickness of the electrode barrier layer 139 can be in a range from 3 nm to 100 nm, although lesser and greater thicknesses can also be employed.

Figure 18:
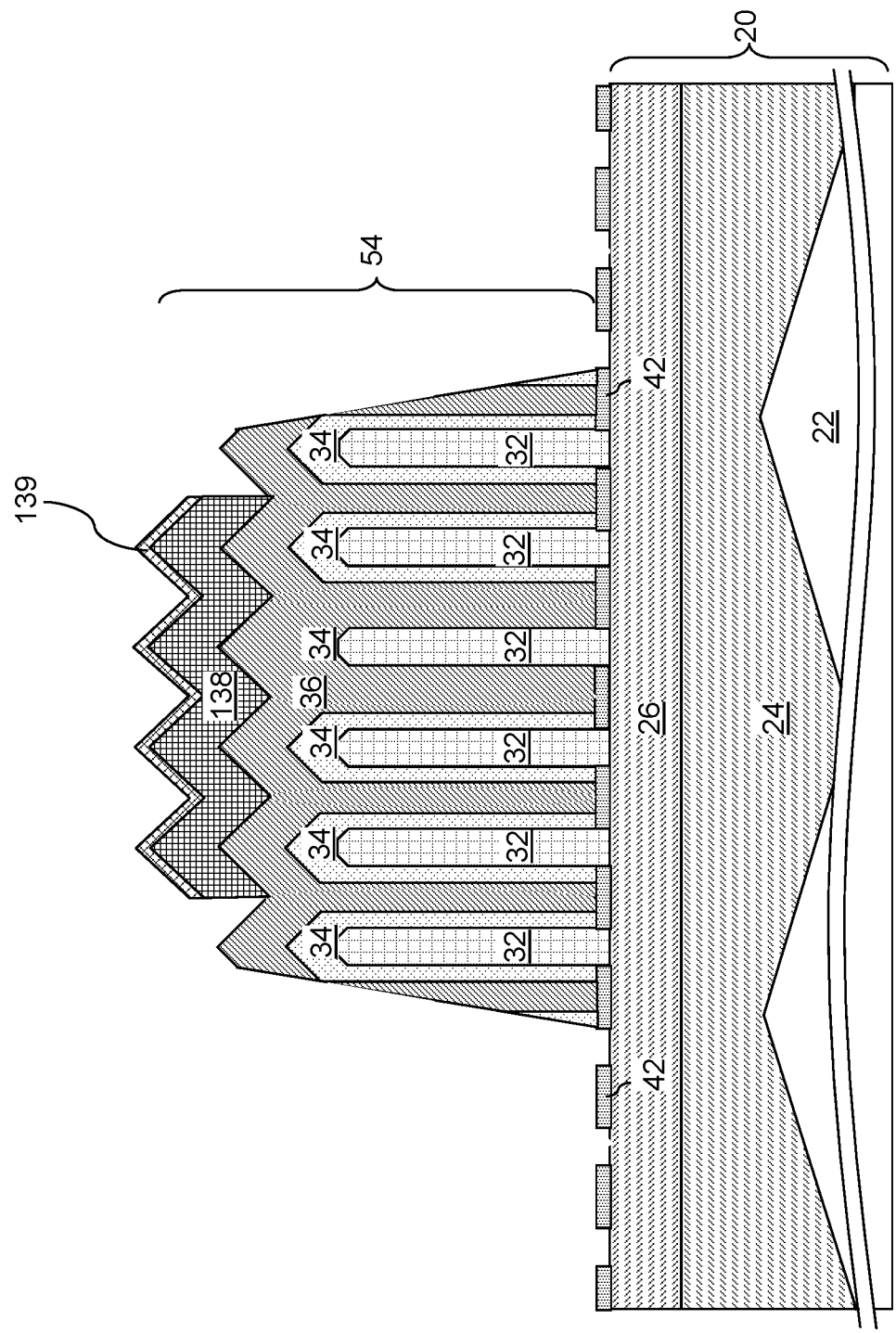
FIG. 18 is a vertical cross-sectional view of a second exemplary structure after patterning a metal electrode and the electrode barrier layer according to an embodiment of the present disclosure.

Referring to FIG. 18, the processing steps of FIG. 5 can be performed with changes in the etch chemistry to pattern the stack of the electrode barrier layer 139 and the electrode metal layer 138L instead of the transparent conductive oxide layer 38. For example, a photoresist layer (not shown) can be applied and patterned over the electrode barrier layer 139. Each combination of a group of nanowires (32, 34), portions of the second-conductivity-type semiconductor material layer 36, a portion of the electrode metal layer 138L, and a portion of the electrode barrier layer 139 that underlie a portion of the patterned photoresist layer remains intact as a mesa structure 54, while additional nanowires (32, 34) that are not covered by the patterned photoresist layer are removed by the second etch process. Each remaining portion of the electrode metal layer 138L constitutes a metal electrode 138, preferably a reflective metal electrode. The etch chemistries can be selected to sequentially etch the materials of the electrode barrier layer 139, the electrode metal layer 138L, and the semiconductor materials of the second-conductivity-type semiconductor material layer 36 and the nanowires (32, 34). Anisotropic etch processes (such as reactive ion etch processes) and/or isotropic etch processes (such as wet etch processes) may be employed.

Subsequently, the photoresist layer may be trimmed as in the processing steps of FIG. 6. The electrode barrier layer 139 and the metal electrode 138 can be subsequently trimmed by an isotropic etch or an anisotropic etch. The photoresist layer can be subsequently removed, for example, by ashing.

Figure 19:
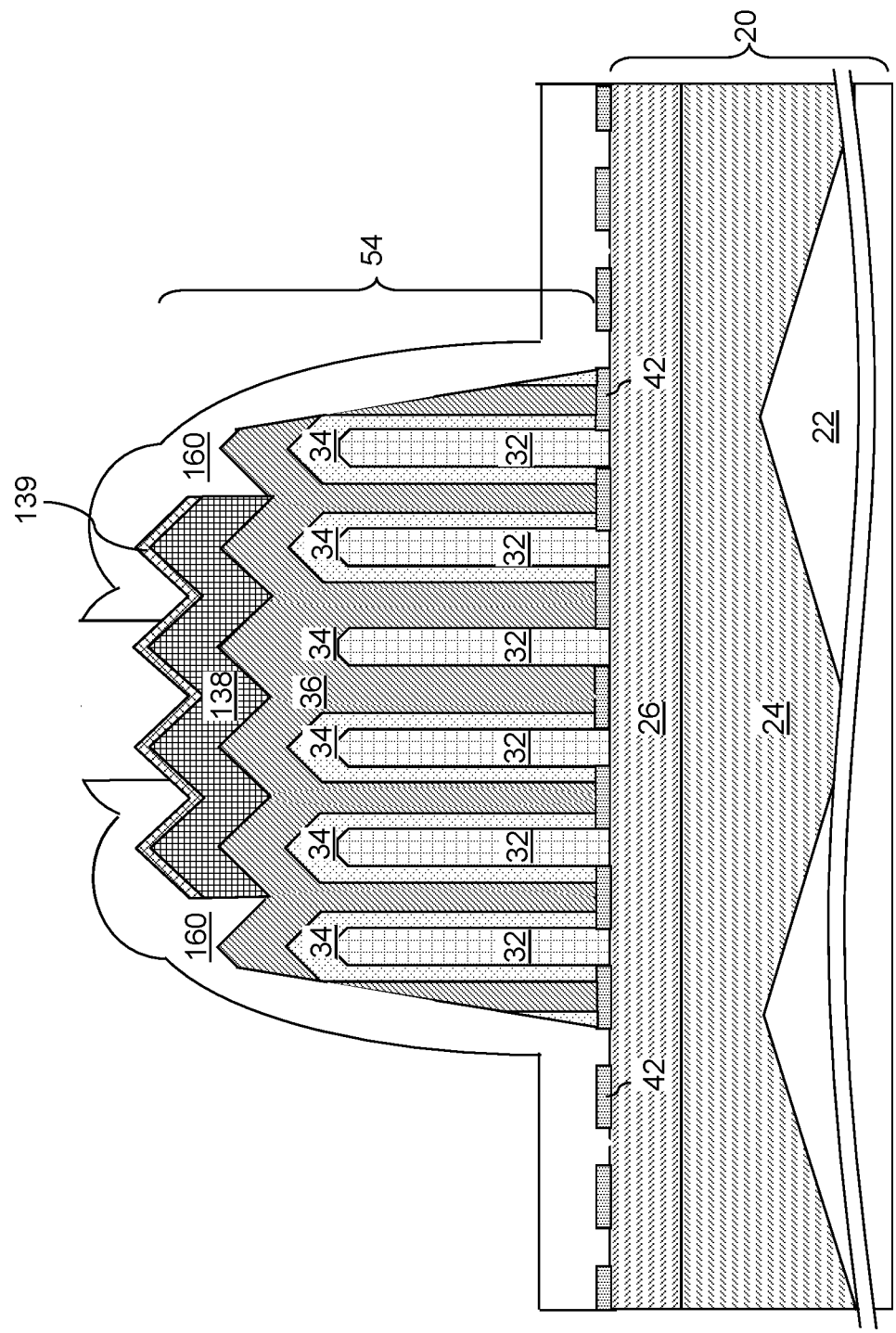
FIG. 19 is a vertical cross-sectional view of the second exemplary structure after formation and patterning of a reflective dielectric layer according to an embodiment of the present disclosure.

Referring to FIG. 19, a reflective dielectric material is deposited over the mesa structure 54 to form an insulating reflector layer 160. The reflective dielectric layer 160 includes a dielectric material that provides high reflectivity in the optical wavelength range (i.e., between 400 nm and 800 nm). In one embodiment, the reflective dielectric material can include an insulating distributed Bragg reflector (DBR) material In an illustrative example, the reflective dielectric layer 160 can include multiple layers of materials such as $TiO_2$, $Ta_2O_5$, $Nb_2O_5$, $SiO_2$, $Si_3N_4$, ZnSe, $MgF_2$ and/or $CaF_2$ to provide a DBR structure.

The insulating reflector layer 160 can be subsequently patterned to form an opening over the metal electrode 138. A top surface of the electrode barrier layer 139 is physically exposed at the bottom of the opening in the reflective dielectric layer 160.

Figure 20:
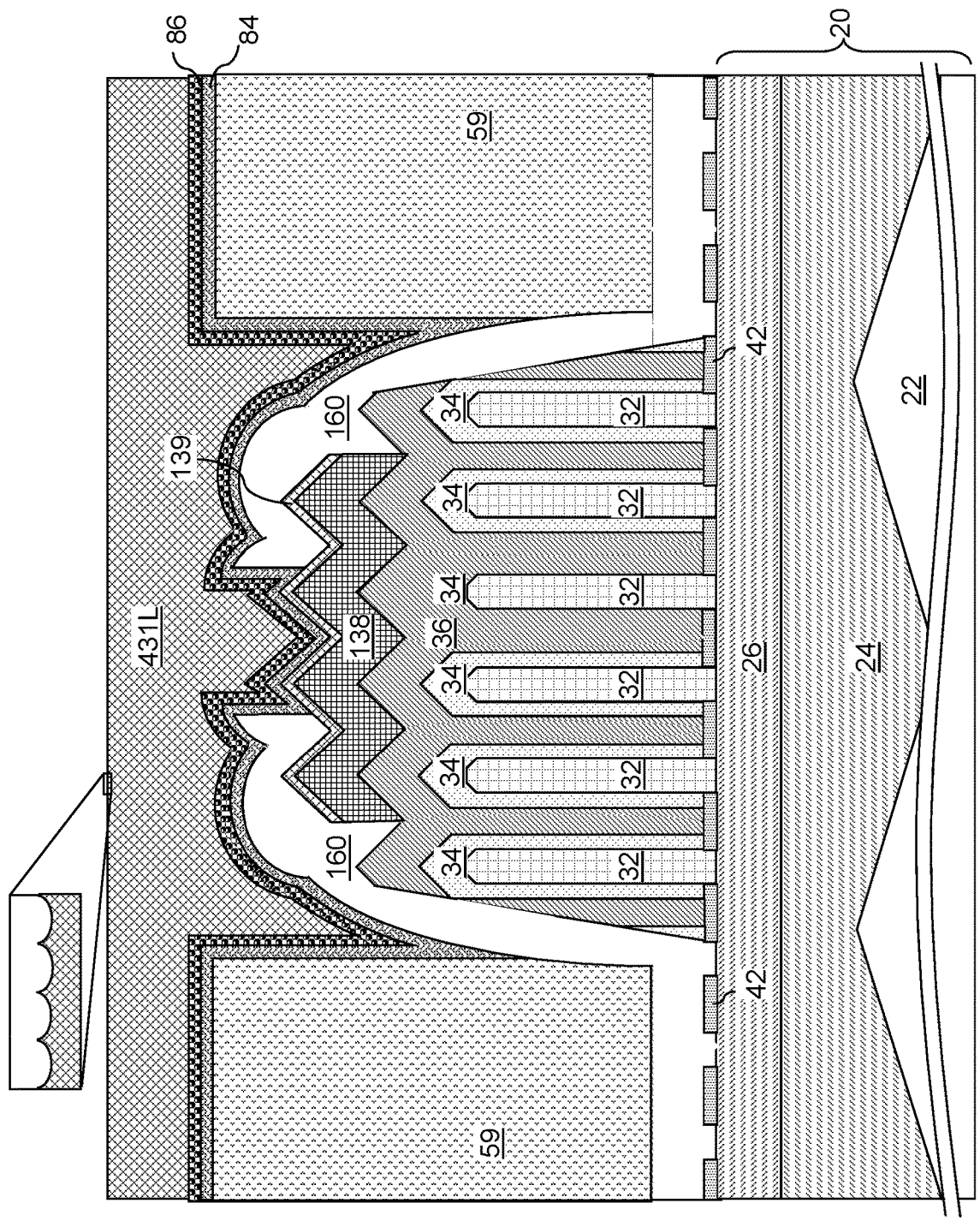
FIG. 20 is a vertical cross-sectional view of the second exemplary structure after formation of a lift-off mask layer, at least one metallic barrier layer, and a bonding material layer according to an embodiment of the present disclosure.

Referring to FIG. 20, a lift-off mask material can be applied over the insulating reflector layer 160 and lithographically patterned to form the lift-off mask layer 59. The lift-off mask layer 59 is patterned such that the lift-off mask layer 59 is located only outside the areas of the mesa structures 54 containing each array of nanowires (32, 34). The sidewalls of the lift-off mask layer 59 are laterally spaced outward from each sidewall of the insulating reflector layer 160. A set of sidewalls of the lift-off mask layer 59 can laterally surround each set of sidewalls of the insulating reflector layer 160 that laterally surrounds the mesa structure 54 containing the array of nanowires (32, 34).

At least one metallic (i.e., electrically conductive) barrier layer (84, 86) can be formed as at least one continuous material layer on the conductive reflector layer 82. The at least one metallic barrier layer (84, 86) can be formed directly on the top surface of the electrode barrier layer 139 and surfaces of the insulating reflector layer 160. The at least one metallic barrier layer (84, 86) is electrically shorted to the electrode barrier layer 139, the metal electrode 138, and the second-conductivity-type semiconductor material layer 36.

The at least one metallic barrier layer (84, 86) includes a metal or metal alloy (i.e., metallic) material layers that can be employed for under-bump metallurgy (UBM), i.e., a set of metal layers provide between a conductive bonding structure and a die. In one embodiment, the at least one metallic barrier layer (84, 86) can include a diffusion barrier layer 84 and an adhesion promoter layer 86. Each component of the at least one metallic barrier layer (84, 86) can have the same composition and thickness as a corresponding component in the first exemplary structure of FIG. 10.

A bonding material layer 431L can be formed on the at least one metallic barrier layer (84, 86). The bonding material layer 431L includes a solder material, which can include tin, and optionally includes an alloy of tin and silver, gold, copper, bismuth, indium, zinc, and/or antimony. The bonding material layer 431L can have the same thickness, compressibility and the same composition as the bonding material layer 431L in FIG. 10.

Figure 21:
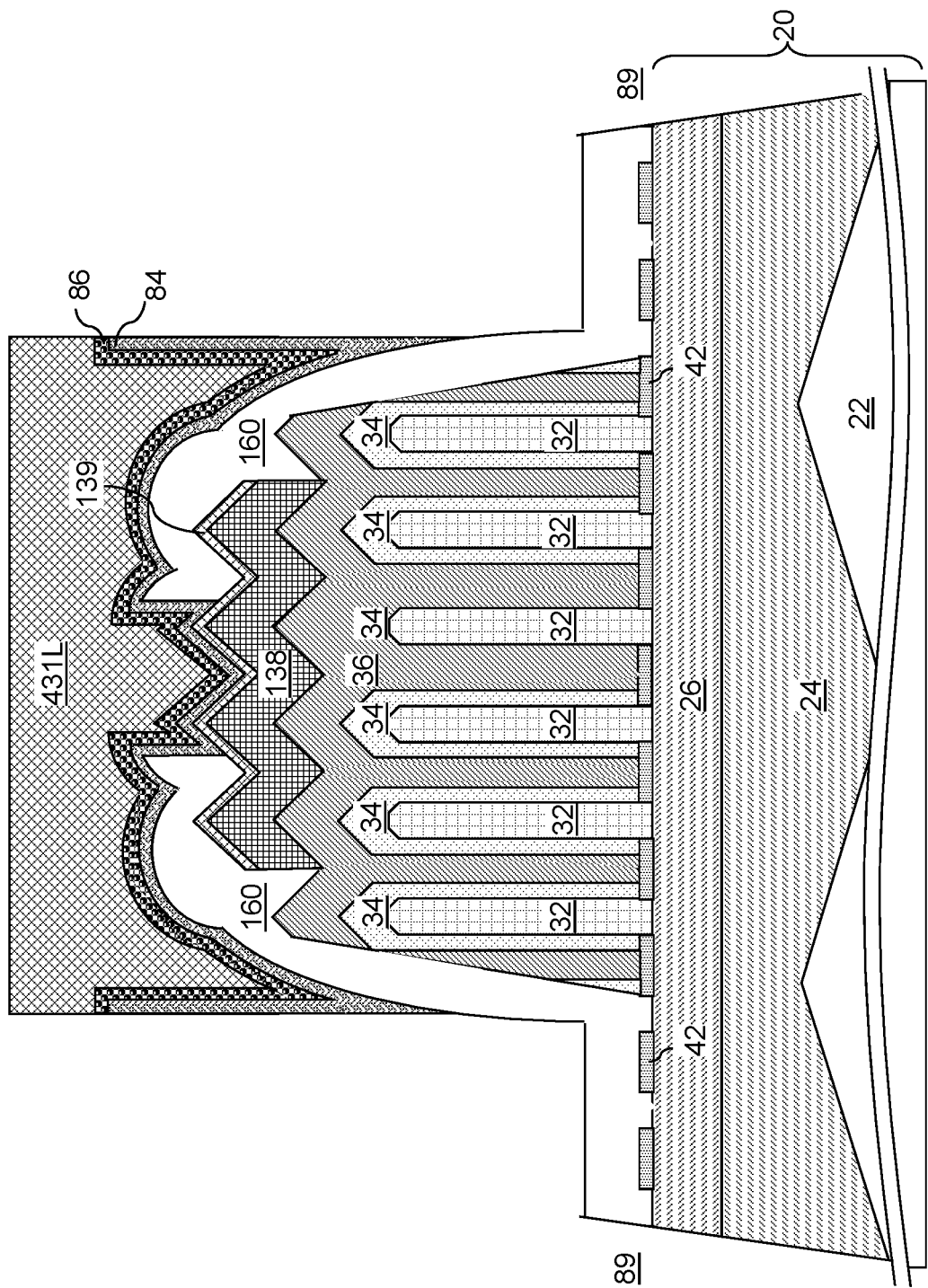
FIG. 21 is a vertical cross-sectional view of the second exemplary structure after lifting off the lift-off mask layer and forming moat trenches according to an embodiment of the present disclosure.

Referring to FIG. 21, the lift-off mask layer 59, peripheral portions of the at least one metallic barrier layer (84, 86), and peripheral portions of the bonding material layer 431L overlying the lift-off mask layer 59 can be lifted off from the dielectric material layer 60, for example, by dissolving the material of the lift-off mask layer 59 in a solvent. A suitable clean process (such as a megasonic clean process) can be performed to remove any remaining portions the metallic barrier layer (84, 86) and/or conductive bonding structure 431 from the surface of the insulating reflector layer 160 and the conductive reflector layer 82. Each remaining portion of the bonding material layer 431L on a mesa structure constitutes a conductive bonding structure 431.

Subsequently, moat trenches 89 are formed through the insulating reflector layer 160, the buffer layer 24 and the doped compound semiconductor layer 26 of the first conductivity type around each region including an array of nanowires (32, 34) and an overlying conductive bonding structure 431 in the same manner as in the processing steps of FIG. 12.

The processing steps of FIGS. 13-15 can be subsequently performed to bond multiple instances of the light emitting diode shown in FIG. 21 to a backplane 401.

Figure 22:
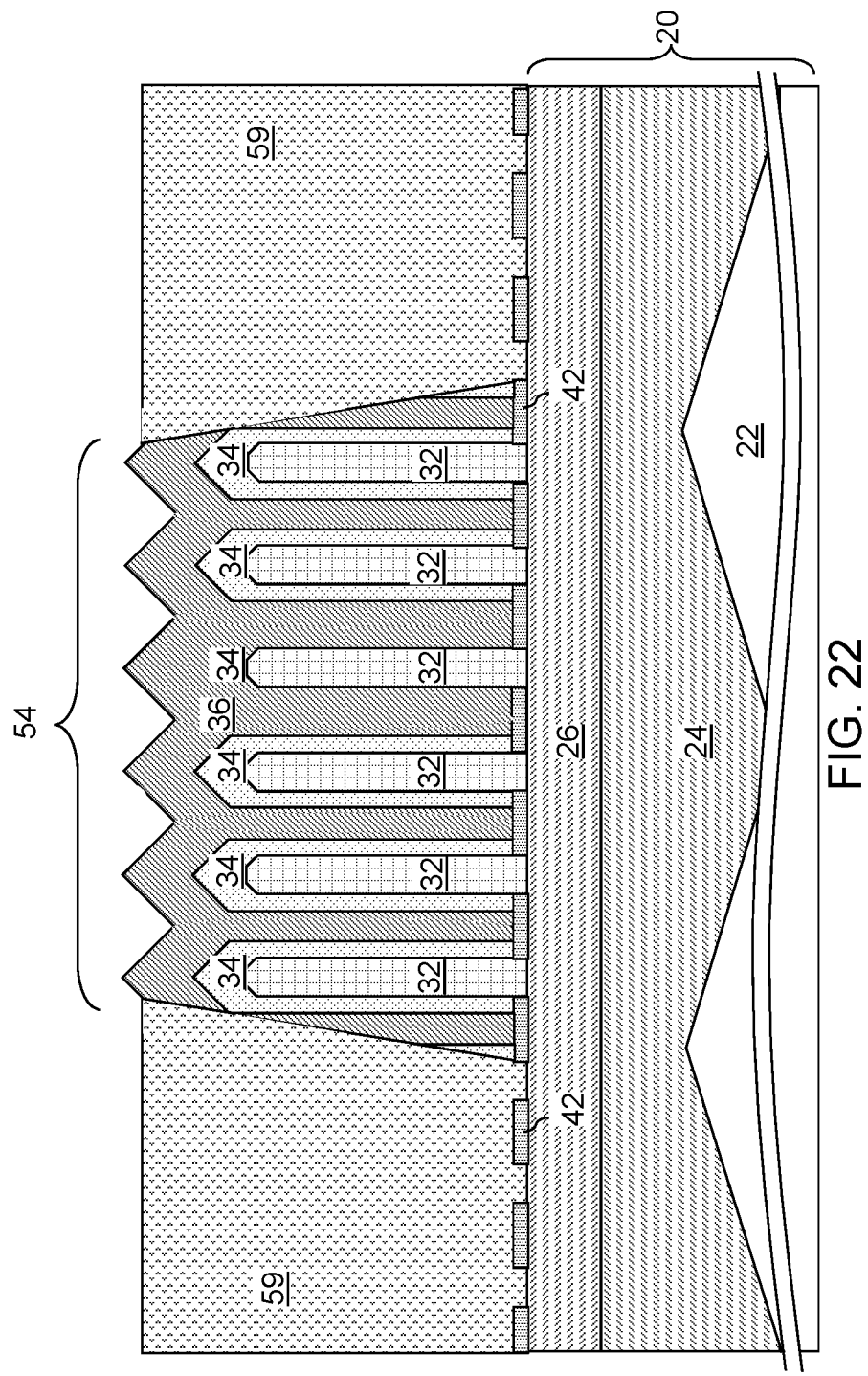
FIG. 22 is a vertical cross-sectional view of a third exemplary structure after formation of a lift-off mask layer according to an embodiment of the present disclosure.

Referring to FIG. 22, a third exemplary structure can be derived from the first exemplary structure of FIG. 3 by applying an patterning a photoresist layer over the second-conductivity-type semiconductor material layer 36, and etching portions of the second-conductivity-type semiconductor material layer 36 and the nanowires (32, 34) that are not masked by the patterned photoresist layer to form the mesa structure 54. The photoresist layer can be subsequently removed, for example, by ashing.

Subsequently, a lift-off mask material can be applied over the mesa structure 54 to form a lift-off mask layer 59. The lift-off mask layer 59 can include a self-planarizing material such as a photoresist material. The lift-off mask layer 59 laterally surrounds each mesa structures 54 containing a respective array of nanowires (32, 34). In one embodiment, the top surface of the lift-off mask 59 can be at, or about, an upper periphery of each mesa structure 54.

Figure 23:
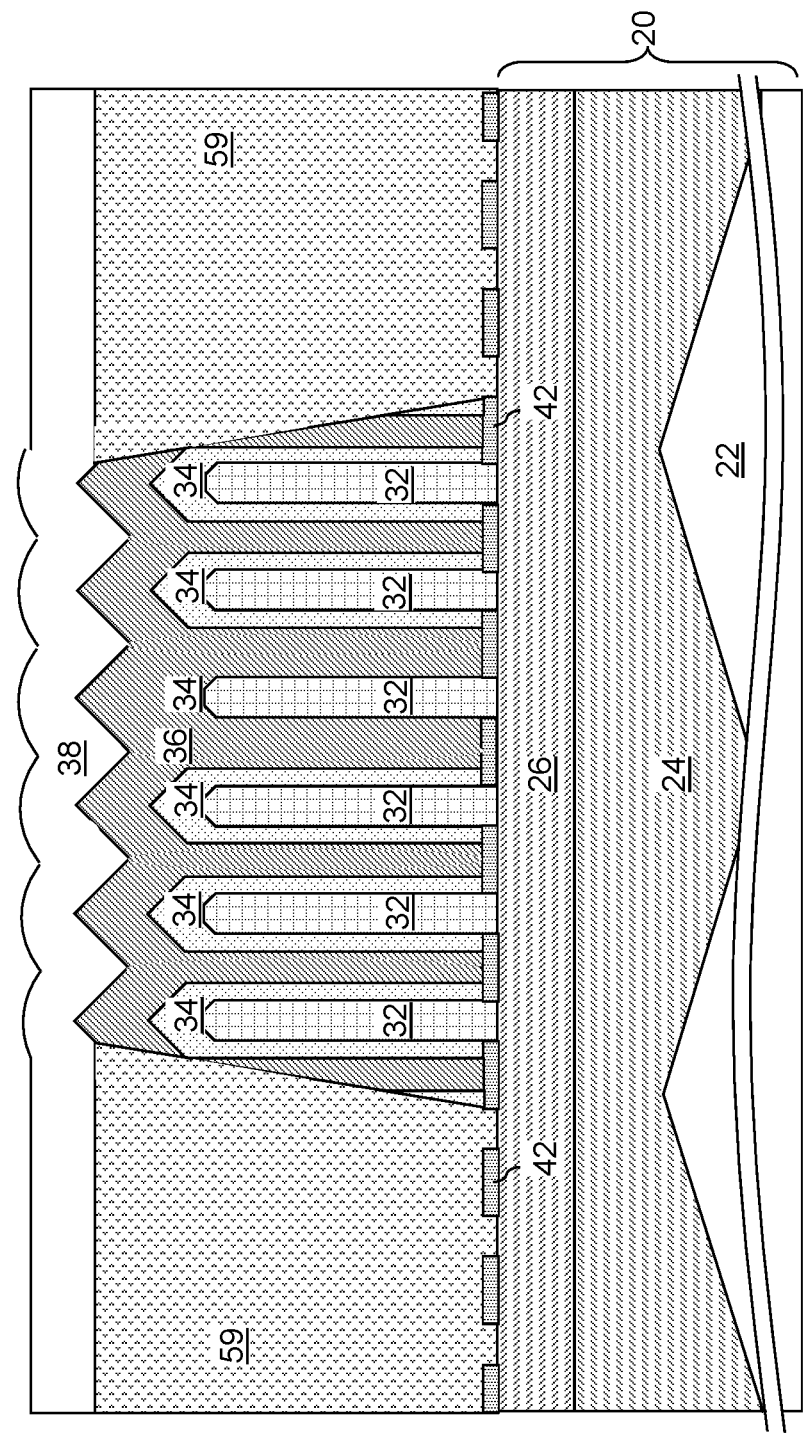
FIG. 23 is a vertical cross-sectional view of the third exemplary structure after formation of a transparent conductive oxide layer according to an embodiment of the present disclosure.

Referring to FIG. 23, a transparent conductive oxide layer 38 can be formed over each mesa structure 54 and the lift-off mask layer 59. The transparent conductive oxide layer 38 can be the same as the transparent conductive oxide layer 38 illustrated in FIG. 4.

Figure 24:
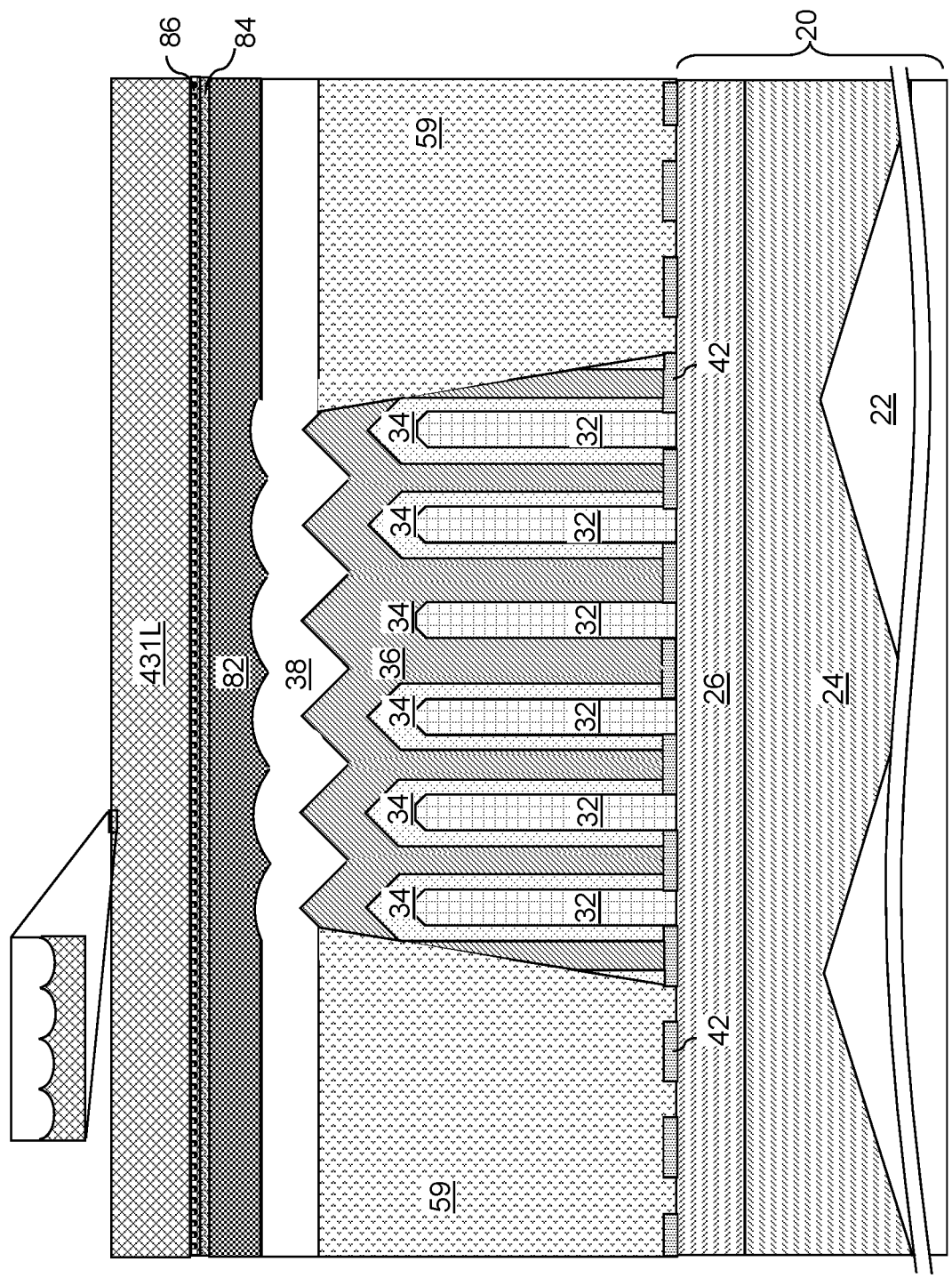
FIG. 24 is a vertical cross-sectional view of the third exemplary structure after deposition of a reflector material layer, at least one metallic barrier layer, and a bonding material layer according to an embodiment of the present disclosure.

Referring to FIG. 24, a conductive reflector layer 82, at least one metallic barrier layer (84, 86), and a bonding material layer 431L can be sequentially deposited. Each of the conductive reflector layer 82, the at least one metallic barrier layer (84, 86), and the bonding material layer 431L can be the same as in the first exemplary structure illustrated in FIGS. 9 and 10.

Figure 25:
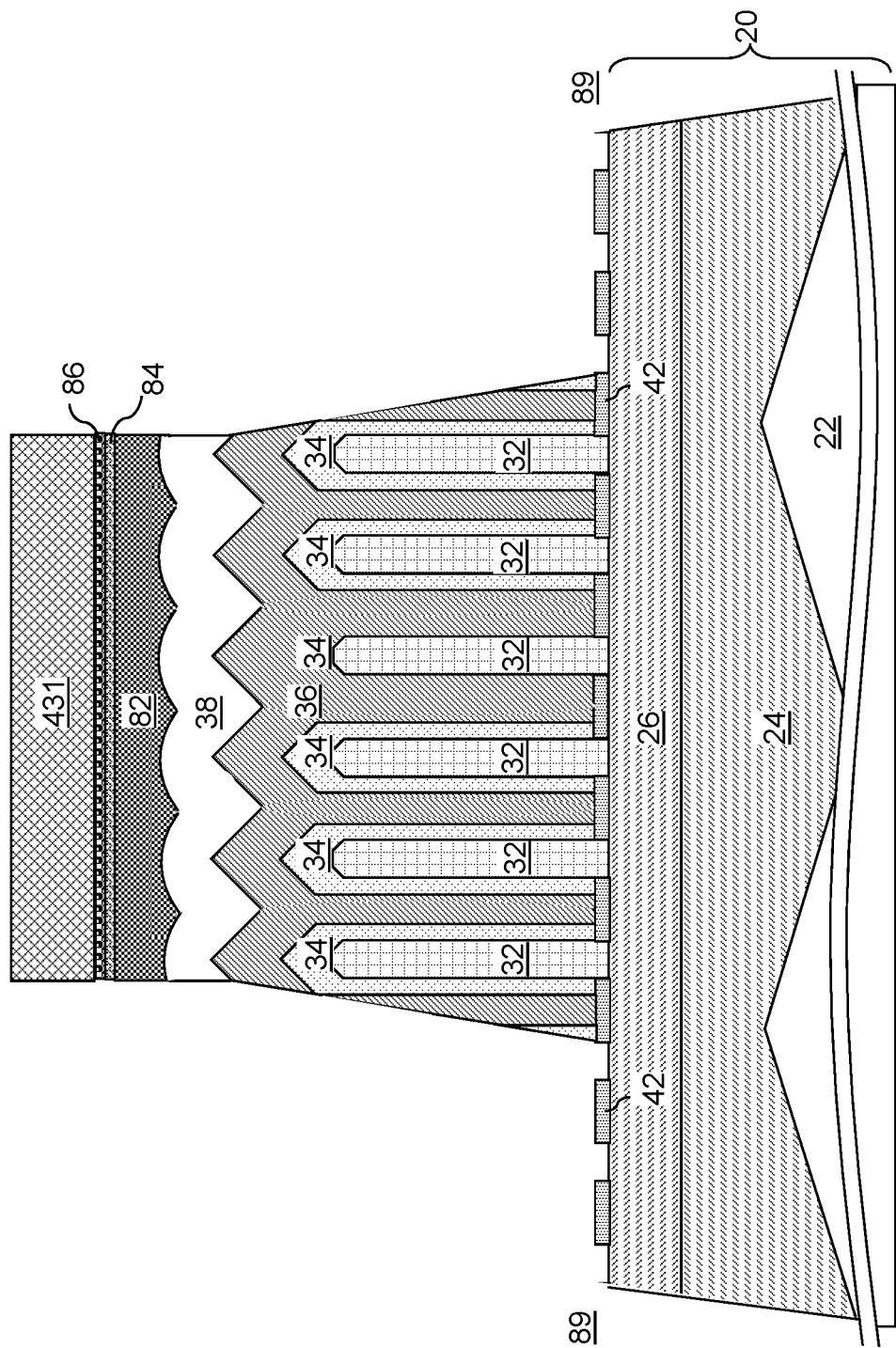
FIG. 25 is a vertical cross-sectional view of the third exemplary structure after lifting off the lift-off mask layer and forming moat trenches according to an embodiment of the present disclosure.

Referring to FIG. 25, the lift-off mask layer 59, peripheral portions of the transparent conductive oxide layer 38, peripheral portions of the at least one metallic barrier layer (84, 86), and peripheral portions of the bonding material layer 431L overlying the lift-off mask layer 59 can be lifted off from the mesa structure, for example, by dissolving the material of the lift-off mask layer 59 in a solvent. A suitable clean process (such as a megasonic clean process) can be performed to remove any remaining portions of the residual reflector material portion (and optionally the metallic barrier layer (84, 86) and/or conductive bonding structure 431) from the surface of the mesa structure 54 the conductive reflector layer 82. Each remaining portion of the bonding material layer 431L on a mesa structure constitutes a conductive bonding structure 431.

Subsequently, moat trenches 89 are formed through the buffer layer 24 and the doped compound semiconductor layer 26 of the first conductivity type around each region including an array of nanowires (32, 34) and an overlying conductive bonding structure 431 in the same manner as in the processing steps of FIG. 12.

The processing steps of FIGS. 13-15 can be subsequently performed to bond multiple instances of the light emitting diode shown in FIG. 12 to a backplane 401.

Figure 26:
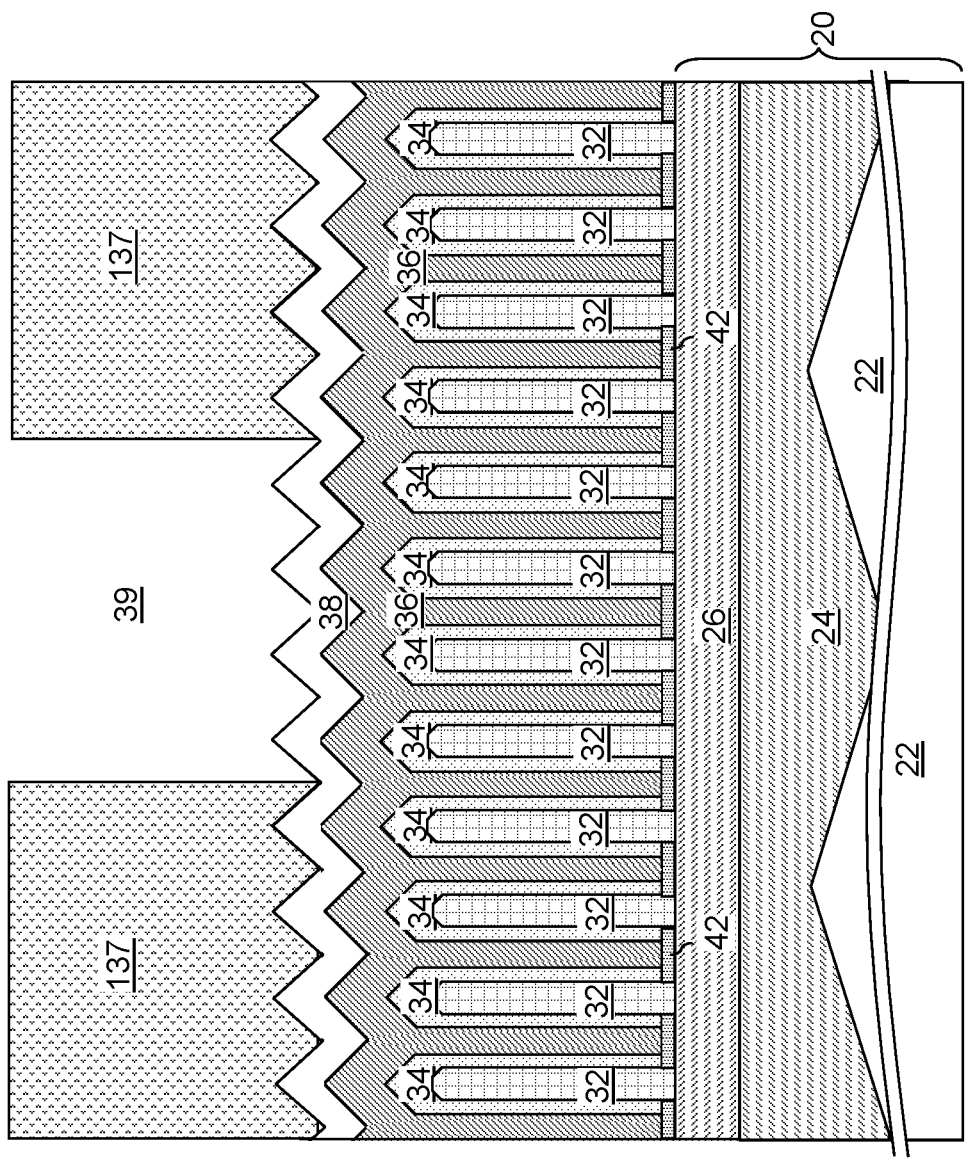
FIG. 26 is a vertical cross-sectional view of a fourth exemplary structure after application and patterning of a photoresist layer to form an opening within a center portion of each subpixel region according to an embodiment of the present disclosure.

Referring to FIG. 26, a fourth exemplary structure according to an embodiment of the present disclosure is illustrated, which is derived from the first exemplary structure of FIG. 4, by applying and patterning of a photoresist layer 137 to form an opening 39 within a center portion of each subpixel region. The area of the each opening 39 can coincide with the top area of the entirety of the light emitting area of a respective light emitting diode subpixel.

Figure 27:
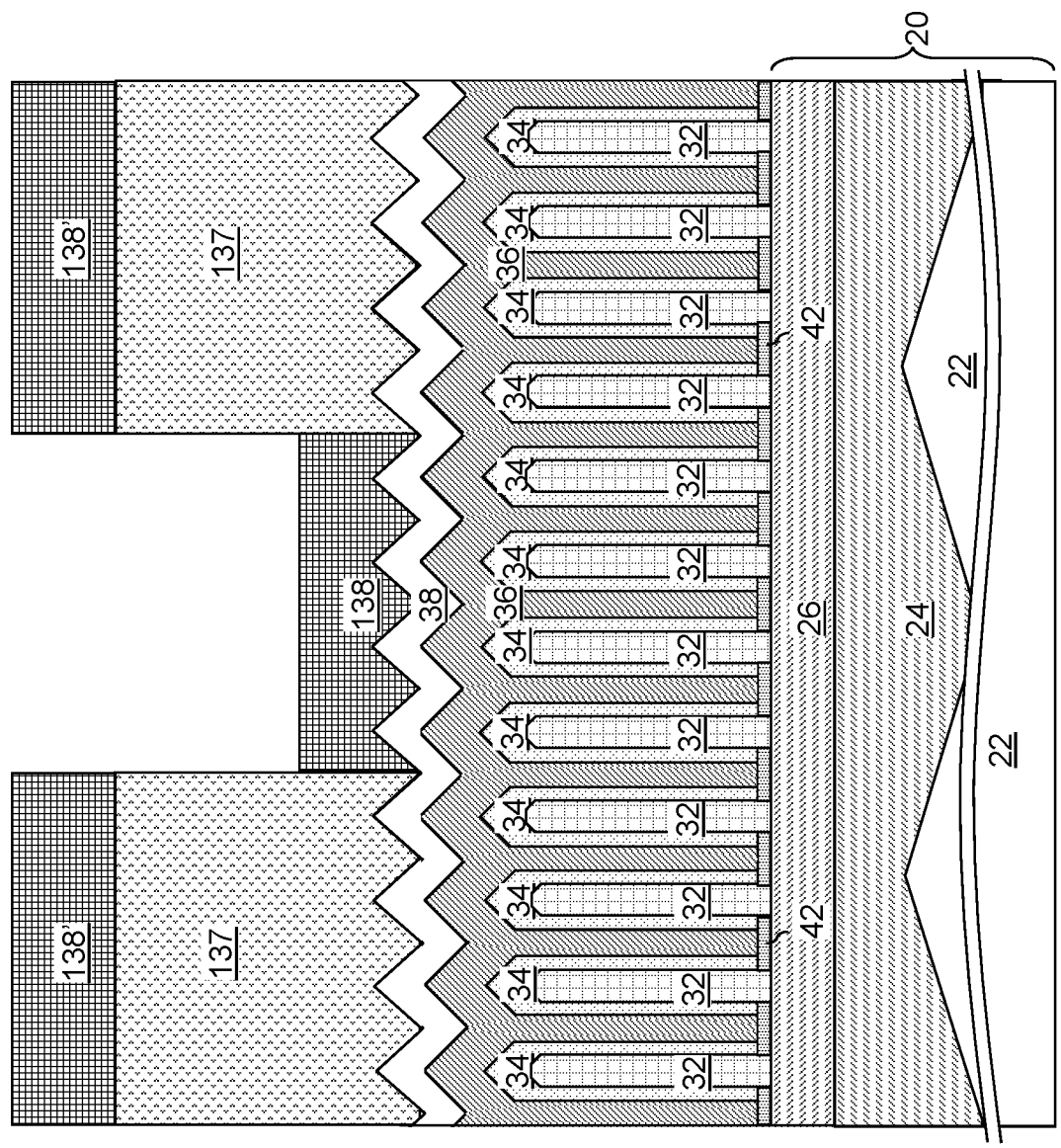
FIG. 27 is a vertical cross-sectional view of the fourth exemplary structure after formation of a top contact electrode in each subpixel region according to an embodiment of the present disclosure.

Referring to FIG. 27, a metallic material is deposited on the top surface of the transparent conductive oxide layer 38. The metallic material can include a reflective metal such as aluminum, silver, copper, and/or gold. The metallic material can be deposited, for example, by sputtering. The average thickness of the deposited metallic material can be in a range from 50 nm to 500 nm, although lesser and greater thicknesses can also be employed. Each portion of the metallic material that is deposited in the openings 39 in the photoresist layer 137 constitutes a top contact electrode 138. Metallic material portions 138' can be deposited on the top surface of the photoresist layer 137.

Optionally, at least one metallic (i.e., electrically conductive) barrier layer (not shown) can be formed as a component of the top contact electrode 138. In this case, the at least one metallic barrier layer can be located at a top surface of the top contact electrode 138, and can be employed to facilitate subsequent bonding of a solder material over the mesa structures. The at least one metallic barrier layer includes a metal or metal alloy (i.e., metallic) material layers that can be employed for under-bump metallurgy (UBM), i.e., a set of metal layers provide between a conductive bonding structure and a die. In one embodiment, the at least one metallic barrier layer can include a diffusion barrier layer and an adhesion promoter layer. Exemplary materials that can be employed for the diffusion barrier layer include titanium, titanium-tungsten, titanium-platinum or tantalum. Exemplary materials that can be employed for the adhesion promoter layer include tungsten, platinum, or a stack of tungsten and platinum. Any other under-bump metallurgy known in the art can also be employed.

Figure 28:
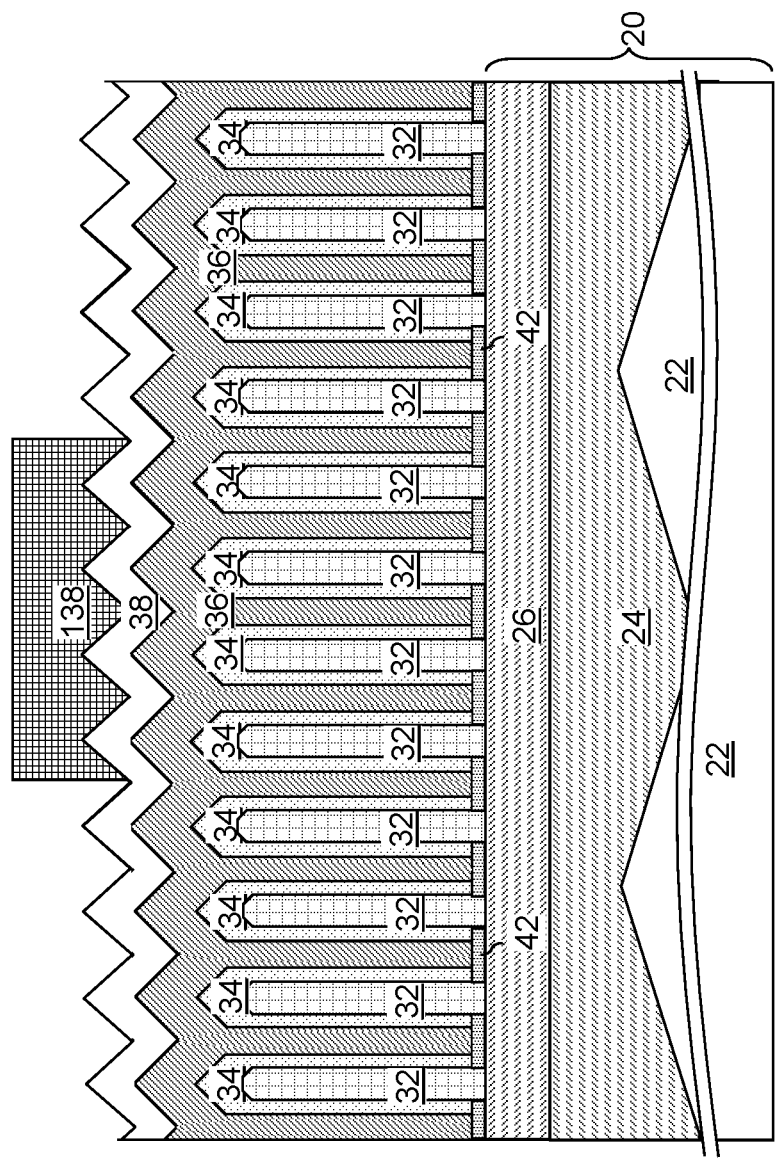
FIG. 28 is a vertical cross-sectional view of the fourth exemplary structure after lifting off the photoresist layer according to an embodiment of the present disclosure.

Referring to FIG. 28, the photoresist layer 137 and the metallic material portions 138' can be lifted off the top surface of the transparent conductive oxide layer 38, for example, by dissolving in a solvent.

Figure 29:
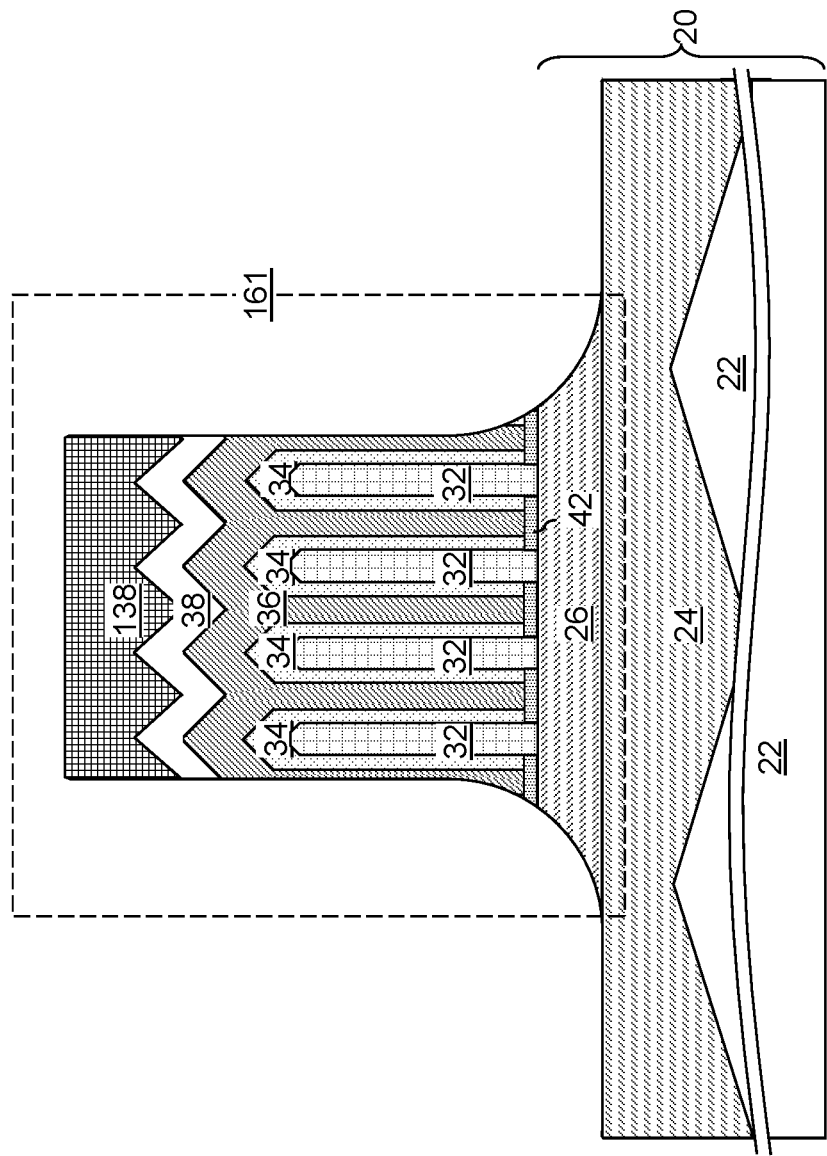
FIG. 29 is a vertical cross-sectional view of the fourth exemplary structure after formation of a mesa structure in each subpixel region by an anisotropic etch process that employs the top contact electrodes etch masks according to an embodiment of the present disclosure.

Referring to FIG. 29, an anisotropic etch process can be performed to etch portions of the transparent conductive oxide layer 38, the second-conductivity-type semiconductor material layer 36, the semiconductor nanowires (32, 34), the patterned growth mask layer 42, and the doped compound semiconductor layer 26 employing the top contact electrodes 138 as an etch mask. The buffer layer 24 can be employed as an etch stop structure. Alternatively, the anisotropic etch may etch into an upper portion of the buffer layer 24 or may stop after forming recessed surfaces of the doped compound semiconductor layer 26. Each contiguous set of remaining portions of the transparent conductive oxide layer 38, the second-conductivity-type semiconductor material layer 36, the semiconductor nanowires (32, 34), the patterned growth mask layer 42, and the doped compound semiconductor layer 26 collectively constitute a mesa structure 161. The sidewalls of the transparent conductive oxide layer 38, the second-conductivity-type semiconductor material layer 36, the patterned growth mask layer 42, and/or the doped compound semiconductor layer 26 may be tapered, or may be curved, for example, with concave surfaces, for each mesa structure 161. Sidewalls of the nanowires cores (32, 34) may be physically exposed for outermost nanowire cores (32, 34).

Figure 30:
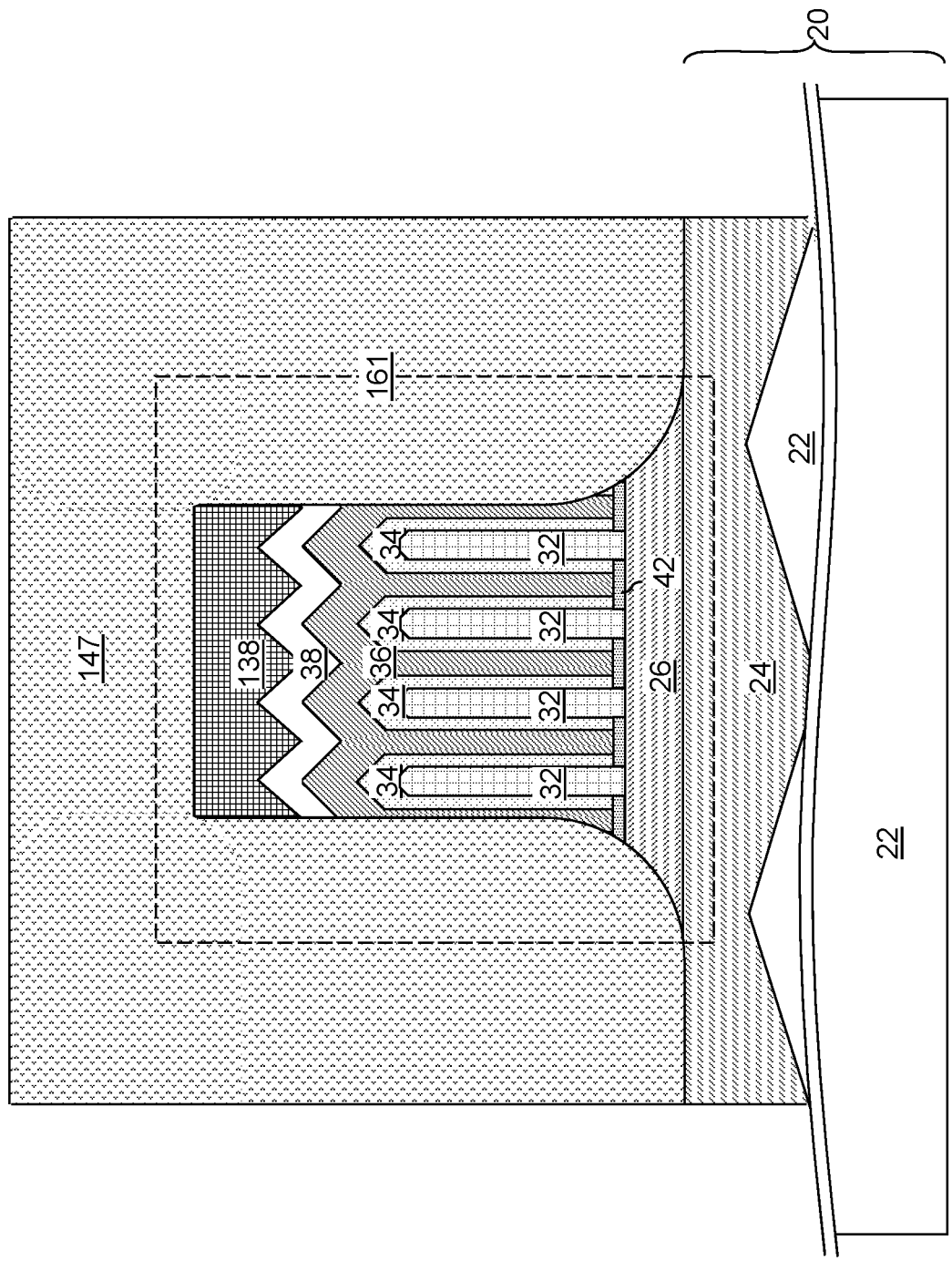
FIG. 30 is a vertical cross-sectional view of the fourth exemplary structure after applying and patterning a photoresist layer and patterning the buffer layer according to an embodiment of the present disclosure.

Referring to FIG. 30, a photoresist layer 147 can be applied over the fourth exemplary structure, and can be lithographically patterned to define subpixel areas. Specifically, the areas of the photoresist layer 147 can be the same as the areas of the subpixels to be subsequently formed. An anisotropic etch is performed employing the photoresist layer 147 to etch portions of the buffer layer 24 that are not covered by the photoresist layer 147. The support substrate 22 can be employed as a stopping structure for the anisotropic etch process. Thus, top surfaces of the support substrate 22 can be physically exposed outside the areas of the subpixels, i.e., outside the areas covered by the patterned portions of the photoresist layer 147. The photoresist layer 147 can be subsequently removed, for example, by ashing.

Figure 31:
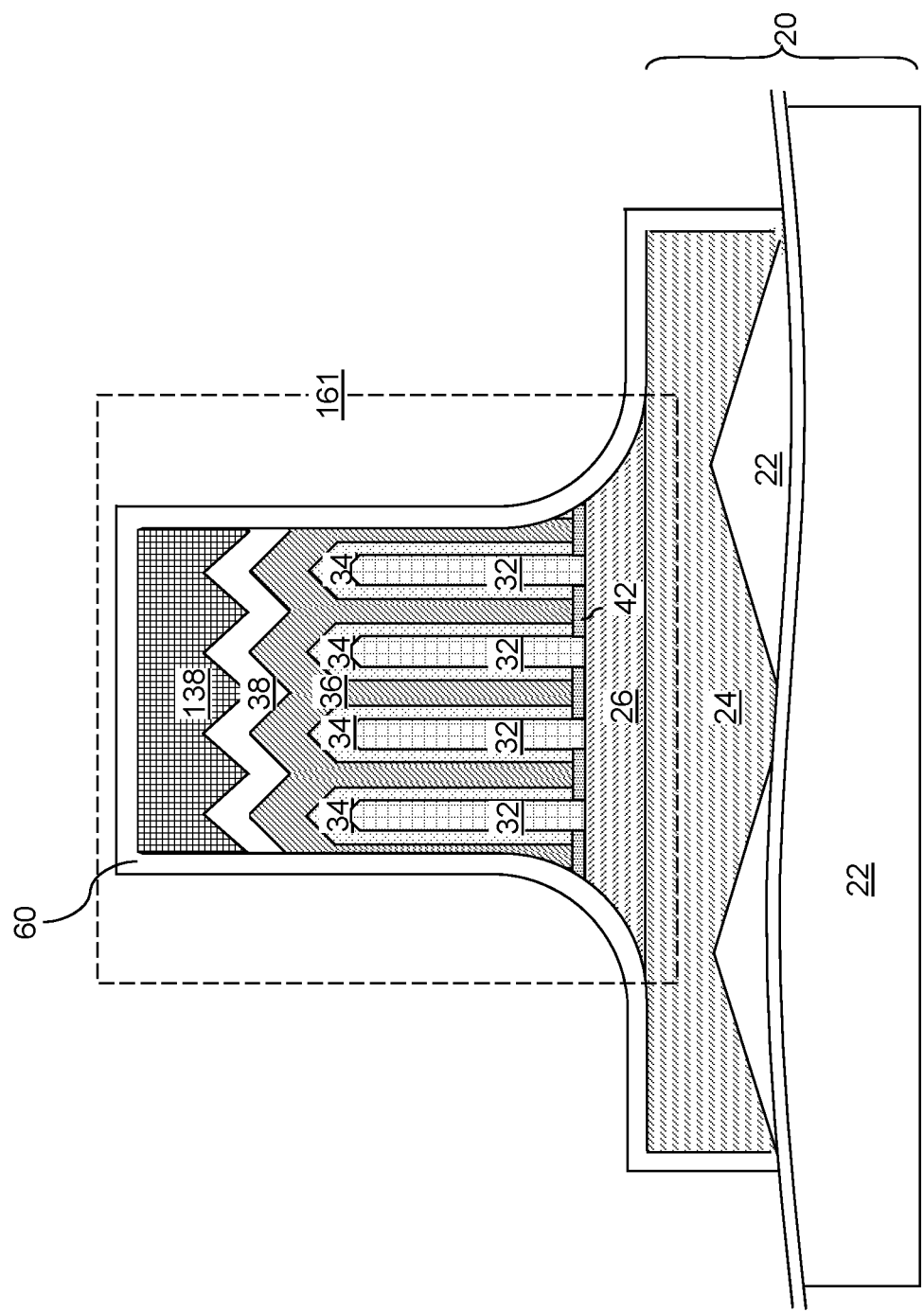
FIG. 31 is a vertical cross-sectional view of the fourth exemplary structure after formation of a dielectric material layer according to an embodiment of the present disclosure.

Referring to FIG. 31, a dielectric material layer 60 may be deposited over the top contact electrode 138 and the sidewalls of the mesa structure 161 and on the surface of the support substrate 22 between the mesa structures 160 (not shown for clarity in cut away view in FIG. 31). The dielectric material layer 60 includes a transparent dielectric material such as silicon oxide, silicon nitride, a dielectric metal oxide (such as aluminum oxide), organosilicate glass, or porous variants thereof. The dielectric material layer 60 can be deposited by a conformal deposition method (such as low pressure chemical vapor deposition (LPCVD) or atomic layer deposition (ALD)) or by a non-conformal deposition method (such as plasma enhanced chemical vapor deposition (PECVD) or physical vapor deposition (such as sputtering or e-beam deposition).

The dielectric material layer 60 can encapsulates each mesa structure 161 in combination with the support substrate 22. In one embodiment, at least one remaining group of nanowires (32, 34) in the mesa structure 161 can constitute an array of nanowires (32, 34). In one embodiment, the dielectric material layer 60 can be formed as a conformal material layer, i.e., a layer having a uniform thickness throughout. The thickness of the dielectric material layer 60 can be in a range from 10 nm to 100 nm, such as from 200 nm to 200 nm, although lesser and greater thicknesses can also be employed.

Figure 32:
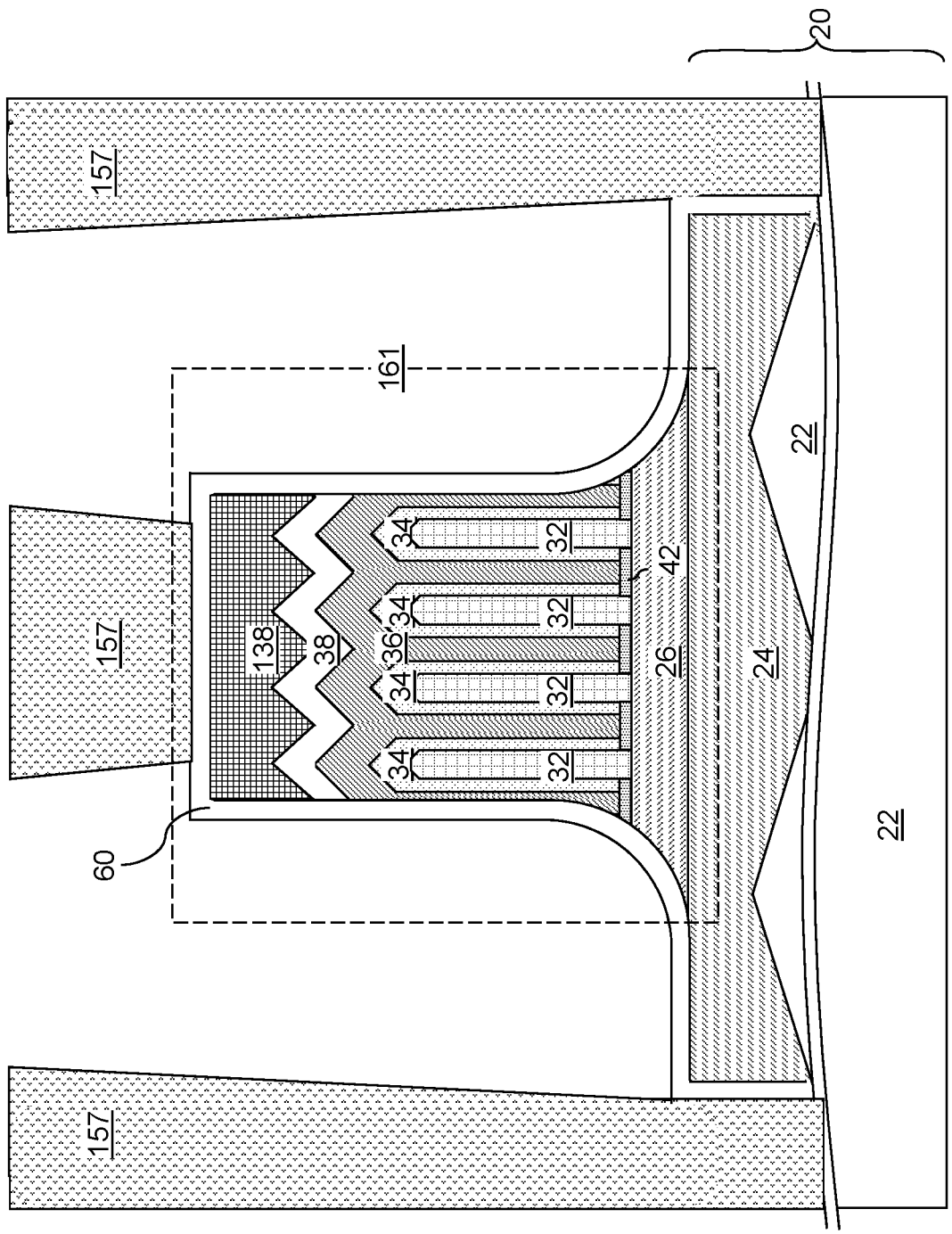
FIG. 32 is a vertical cross-sectional view of the fourth exemplary structure after formation of a patterned photoresist layer according to an embodiment of the present disclosure.

Referring to FIG. 32, a photoresist layer 157 can be applied over the fourth exemplary structure, and can be lithographically patterned to cover a center portion of each mesa structure 161, and not to cover an entire periphery of each mesa structure 161. Portions of the surfaces of the dielectric material layer 60 on the support substrate 22 located between a neighboring pair of mesa structures 160 can be covered with the patterned photoresist layer 157. In one embodiment, the uncovered areas of the exemplary structure can include annular regions located at a periphery of each mesa structure 161. The annular regions can be laterally spaced from one another by remaining portions of the photoresist layer 157 that cover underlying portions of the support substrate 22. In one embodiment, the sidewalls of the patterned photoresist layer 157 can have a retro-taper to minimize deposition of a metallic material in a subsequent metallic material deposition process.

Figure 33:
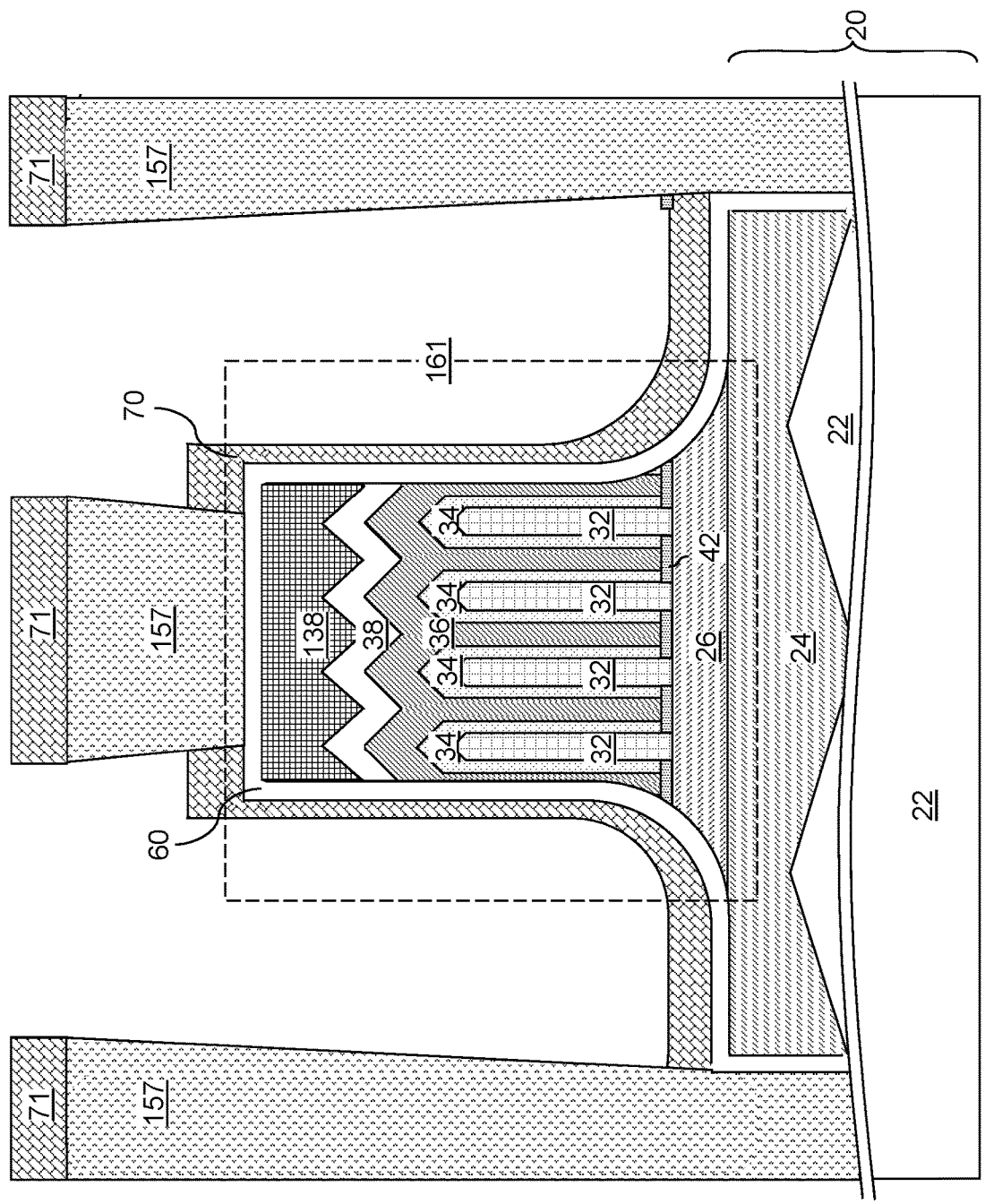
FIG. 33 is a vertical cross-sectional view of the fourth exemplary structure after formation of a reflector structure within each subpixel region according to an embodiment of the present disclosure.

Referring to FIG. 33, a reflector material can be deposited over the dielectric material layer 60 in regions that are not covered with the photoresist layer 157. The reflector material can be deposited by a directional deposition method such as vacuum evaporation or physical vapor deposition. Each portion of the reflector material that is deposited directly on the dielectric material layer 60 constitutes a sidewall portion of the reflector layer 70, which can be topologically homeomorphic to a ring. In one embodiment, each sidewall portion of the reflector layer 70 includes a reflective material such as a metal. In one embodiment, each sidewall portion of the reflector layer 70 includes at least one material selected from silver, aluminum, copper, and gold. In one embodiment, the reflector material can be a thin film distributed Bragg reflector (DBR) with small index changes to provide better reflectivity. The reflector material can include at least one conductive material and/or at least one electrically insulating material.

Reflector material portions 71 are formed on the top surfaces of the patterned portions of the photoresist layer 77. The thickness of horizontal portions of the sidewall portion of the reflector layer 70 can be in a range from 5 nm to 500 nm, such as from 10 nm to 250 nm, although lesser and greater thicknesses can also be employed.

Figure 34:
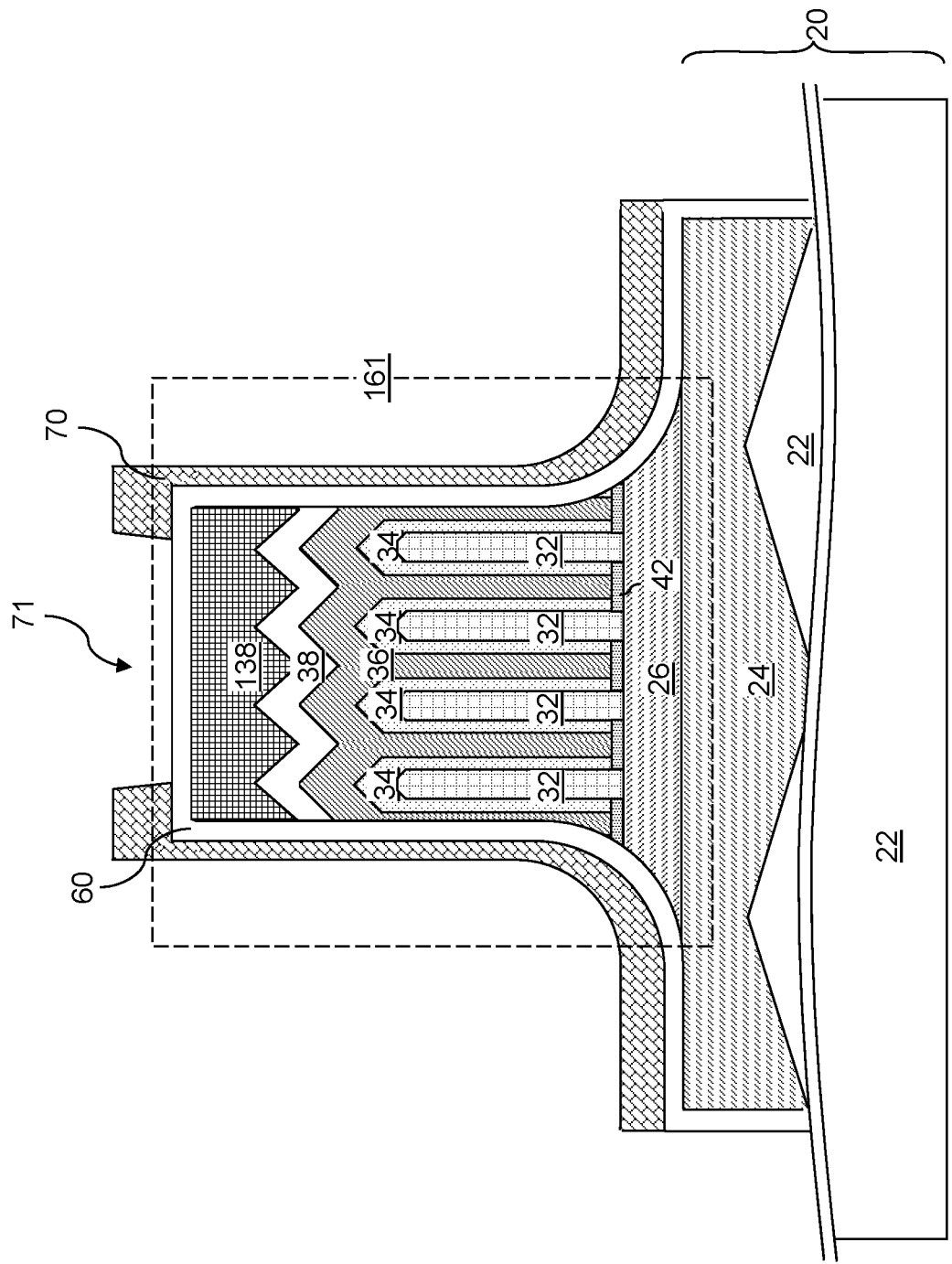
FIG. 34 is a vertical cross-sectional view of the fourth exemplary structure after removal of the patterned photoresist layer according to an embodiment of the present disclosure.

Referring to FIG. 34, the remaining portions of the photoresist layer 157 and the reflector material portions 71 thereupon can be lifted off the exemplary structure, for example, by dissolving the photoresist layer 157 in a solvent.

Figure 35:
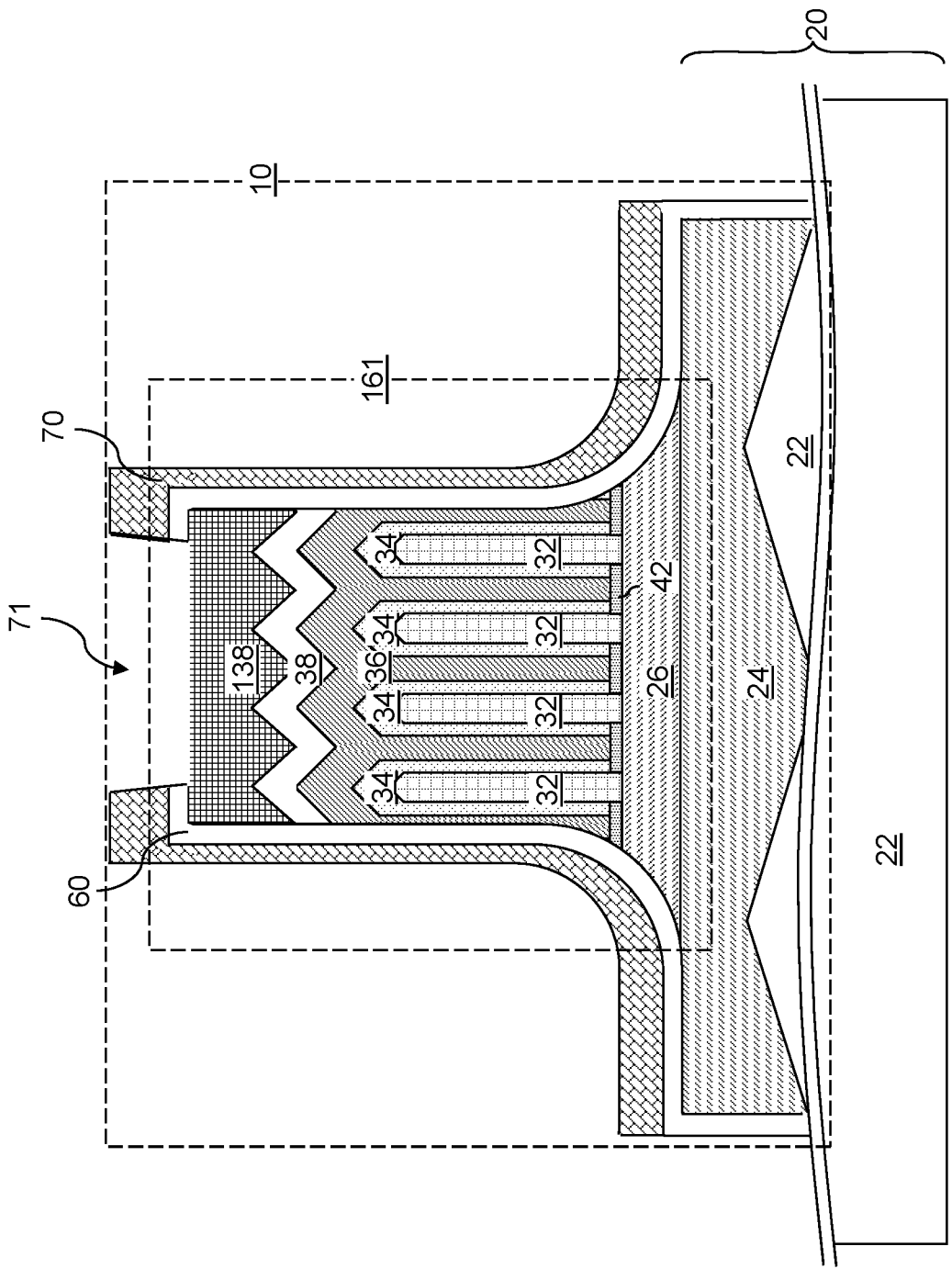
FIG. 35 is a vertical cross-sectional view of the fourth exemplary structure after etching unmasked portions of the dielectric material layer according to an embodiment of the present disclosure.

Referring to FIG. 35, an etch process can be performed to etch unmasked portions of the dielectric material layer 60. The etch process may be an anisotropic etch process (e.g., $CF_4$ plasma etch) or an isotropic etch process. Portions of the dielectric material layer 60 that are not masked by the reflector layers 70 are removed by the etch process. The top surface of each top contact electrode 138 and the top surface of the support substrate 22 are physically exposed in each area that is not covered with the reflector layers 70. A light emitting diode (LED) 10 is provided, which includes a mesa structure 161, a dielectric material layer 60, and a sidewall portion of the reflector layer 70 having an annular configuration. The top surface of the top contact electrode 138 is physically exposed within a hole in the sidewall portion of the reflector layer 70, and within a hole in the dielectric material layer 60. Each LED 10 can be subsequently employed as a sub-pixel in a display device.

Figure 36:
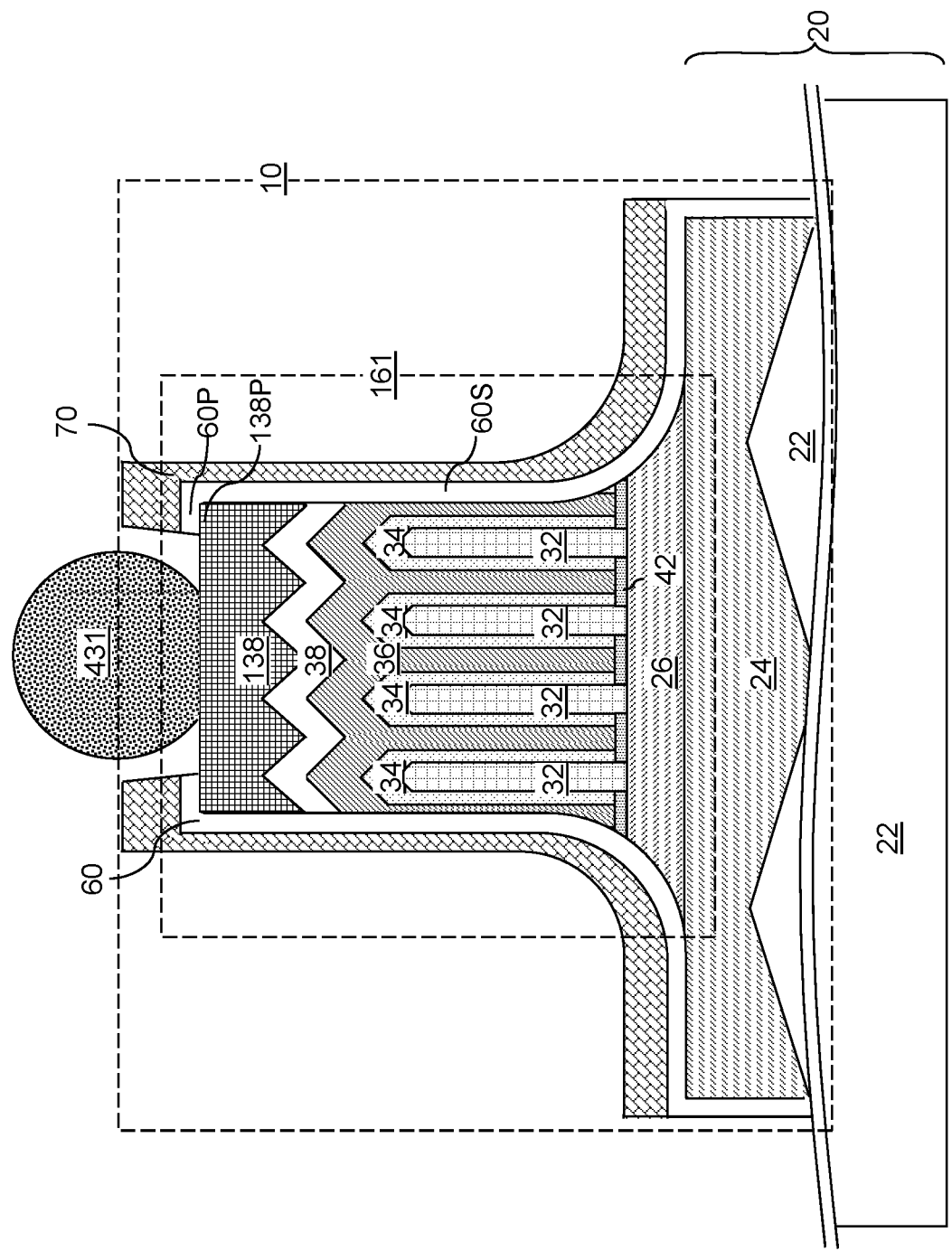
FIG. 36 is a vertical cross-sectional view of the fourth exemplary structure after attaching a conductive bonding structure according to an embodiment of the present disclosure.

Referring to FIG. 36, a conductive bonding structure 431 is formed over each mesa structure 161. In one embodiment, the conductive bonding structures 431 can be formed directly on the at least one metallic barrier layer, which can be a topmost layer of the top contact electrode 138. The conductive bonding structures 431 include a solder material, which can include tin, and optionally includes an alloy of tin and silver, gold, copper, bismuth, indium, zinc, and/or antimony. The conductive bonding structures 431 can be formed as solder balls, or can be formed as a layer stack including at least one solder material.

In the fourth exemplary structure, the reflector layer (70, 138) is a conductive reflector layer which includes a laterally extending portion which comprises the reflective top contact electrode 138 and the sidewall portion 70. The laterally extending portion of the reflector layer 138 is electrically connected to the second-conductivity-type semiconductor material layer 36 and to the conductive bonding structure 431. As shown in FIG. 36, peripheral portion 138P of the laterally extending portion of the reflector layer 138 underlies a first portion 60P of the dielectric material layer 60. The sidewall portion of the reflector layer 70 overlies the first portion 60P and a second portion 60S of the dielectric material layer 60. The dielectric material layer 60 separates the sidewall portion of the reflector layer 70 from the laterally extending portion of the reflector layer 138. The sidewall portion of the reflector layer 70 does not electrically or physically contact the laterally extending portion of the reflector layer 138.

Figure 37:
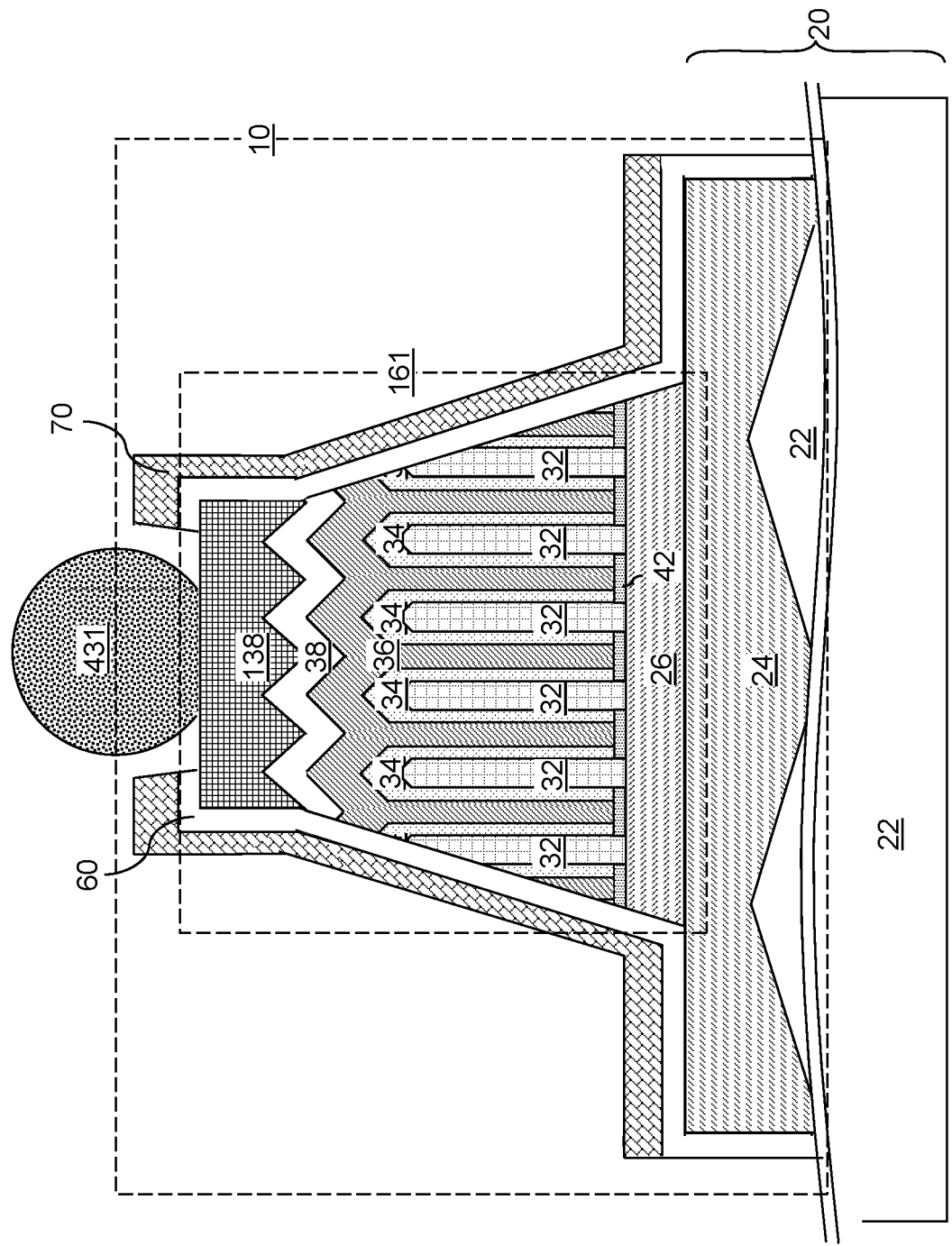
FIG. 37 is a vertical cross-sectional view of an alternative embodiment of the fourth exemplary structure according to an embodiment of the present disclosure.

Referring to FIG. 37, an alternative embodiment of the fourth exemplary structure is illustrated, which can be derived from the fourth exemplary structure of FIG. 36 by altering the taper profile during an anisotropic etch that forms the mesa structure 161 at the processing steps of FIG. 29. Generally, the taper profile of the sidewalls of the mesa structure 161 can be optimized to include each of a vertical profile, a tapered profile, and/or a curved profile (such as a concave profile) to maximize light reflection toward the illumination direction, which is generally downward and at a predefined angle of view, which can be from 10 degrees to 180 degrees, such as from 20 degrees to 150 degrees.

Subsequently, the processing steps of FIGS. 16A-16P can be performed as in the first through third embodiments.

Figure 38:
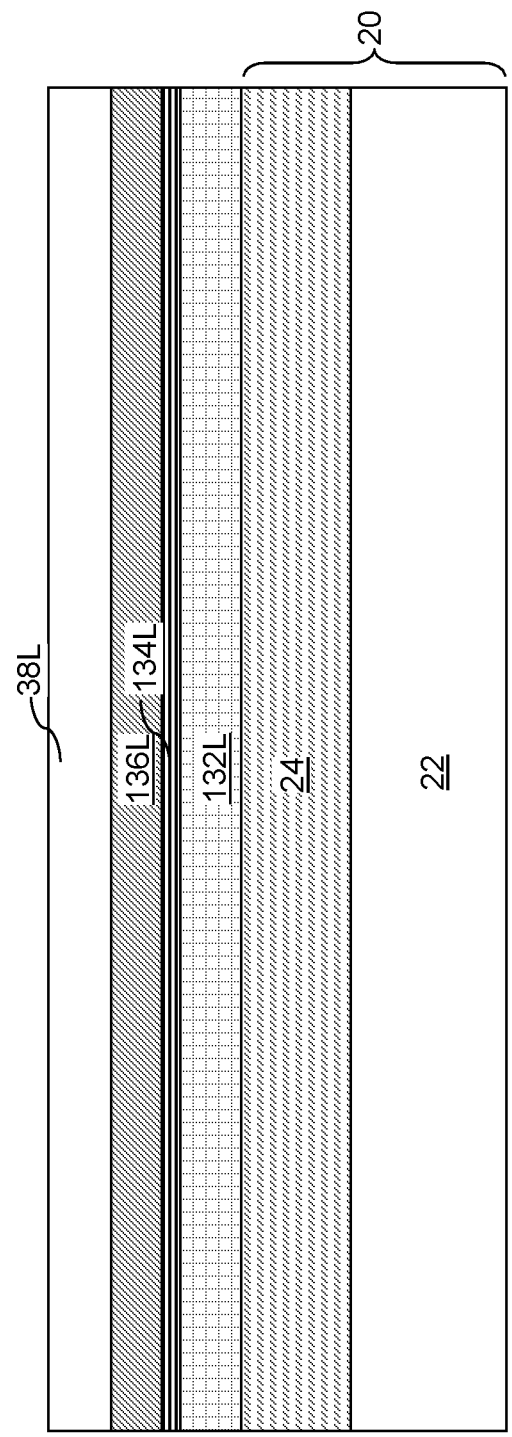
FIGS. 38-49 are vertical cross-sectional views of steps of making a fifth exemplary according to a fifth embodiment of the present disclosure.

Referring to FIG. 38, a fifth exemplary structure according to an embodiment of the present disclosure is illustrated. The fifth exemplary structure includes a support substrate 22 and a buffer layer 24, each of which can be the same as in previously described embodiments. Particularly, the buffer layer 24 can be a doped single crystalline compound semiconductor layer such as a doped single crystalline III-V compound semiconductor layer (e.g., a n-doped single crystalline GaN layer). The buffer layer 24 can have a doping of a first conductivity type, which may be p-type or n-type. The support substrate 22 can be any single crystalline substrate (such as a single crystalline sapphire substrate) that can function as an epitaxial growth template for the buffer layer 24. In one embodiment, the interface between the support substrate 22 and the buffer layer 24 can be planar or non-planar (e.g., the interface may be textured if the support substrate comprises a patterned sapphire substrate (PSS)).

A layer stack including a continuous first-conductivity-type semiconductor material layer 132L, a continuous active layer 134L, a continuous second-conductivity-type semiconductor material layer 136L, and a continuous transparent conductive oxide layer 38L, can be sequentially formed over the buffer layer 24. Each layer within the layer stack can be formed as a blanket material layer having a uniform thickness and continuously extending over the entire area of the buffer layer 24. As used herein, a "continuous" element refers to a unitary element that extends continuously between each segment of the element without a discontinuity.

The continuous first-conductivity-type semiconductor material layer 132L includes a doped single crystalline compound semiconductor material having a doping of the first conductivity type, i.e., the conductivity type of doping of the buffer layer 24. The material of the continuous first-conductivity-type semiconductor material layer 132L may be the same as, or may be different from, the material of the buffer layer 24, and may be epitaxially aligned to the material of the buffer layer 24. In one embodiment, the material of the continuous first-conductivity-type semiconductor material layer 132L may be selected to match the average lattice constant of the material layers to be subsequently employed in the continuous active layer 134L, and to reduce mechanical stress within the continuous active layer 134L. For example, the material of the continuous first-conductivity-type semiconductor material layer 132L may include n-type gallium nitride. In one embodiment, the first conductivity type can be n-type. In another embodiment, the first conductivity type can be p-type. The epitaxial growth process that grows the continuous first-conductivity-type semiconductor material layer 132L may be selective or non-selective.

The continuous active layer 134L can include any of the layer stacks that may be employed for the active shell 34 described above. Generally, the continuous active layer 134L includes at least one semiconductor material that emits light upon application of a suitable electrical bias. For example, the continuous active layer 134L can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the continuous active layer 134L can include any other suitable semiconductor layers or stack of layers for light emitting diode applications provided that it can be grown on the surfaces of the nanowires cores 32. The continuous active layer 134L may emit any color light, such as blue, green or red light.

The continuous second-conductivity-type semiconductor material layer 136L can include the same material as, and can have the same thickness as, the second-conductivity-type semiconductor material layer 36 described above. The continuous transparent conductive oxide layer 38L can include the same material as, and can have the same thickness as, the transparent conductive oxide layer 38 described above.

Figure 39:
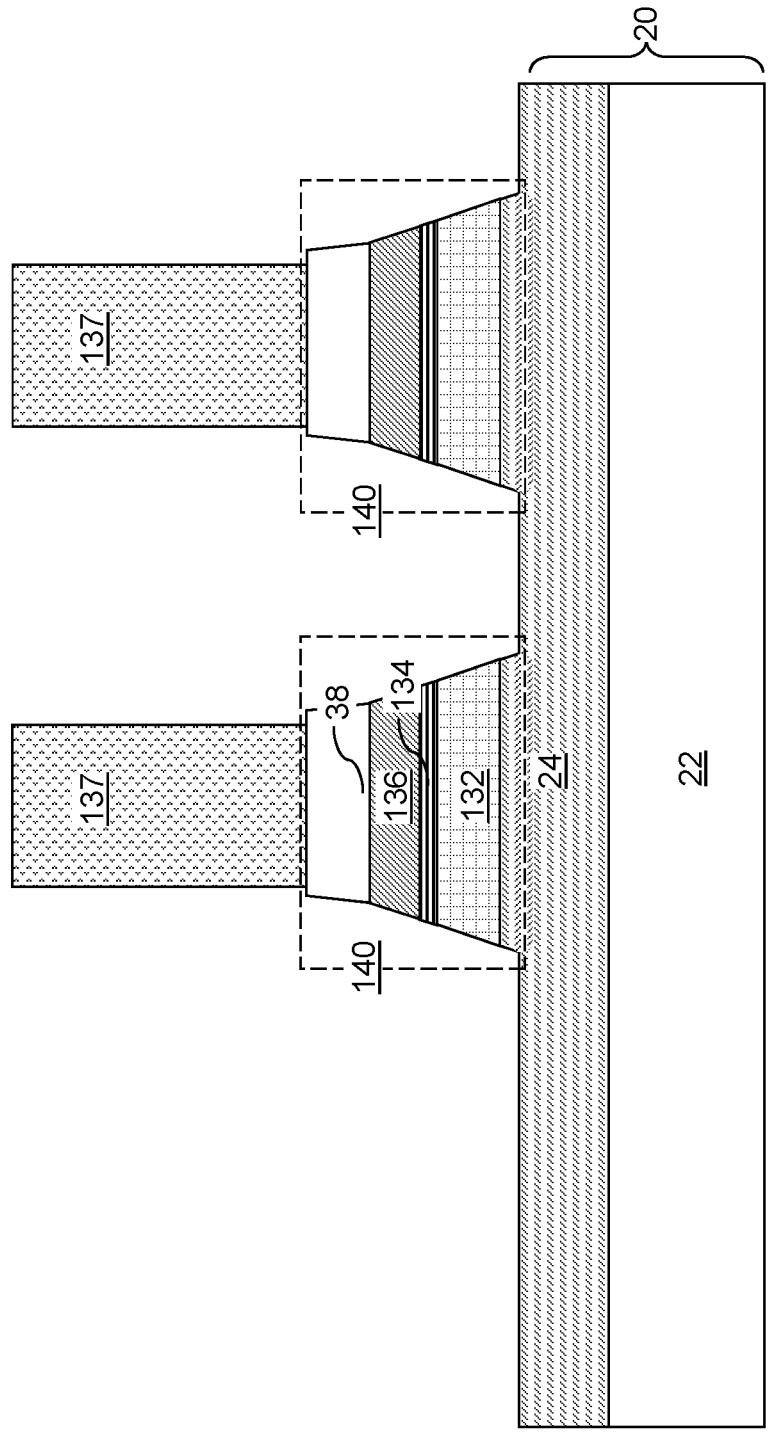

Referring to FIG. 39, a photoresist layer can be applied over the layer stack, and can be lithographically patterned to form a patterned photoresist layer 137. The patterned photoresist layer 137 can include discrete portions that cover a respective area of the layer stack such that the covered areas are laterally spaced among one another. In one embodiment, the discrete portions of the patterned photoresist layer 137 can be arranged as a two-dimensional array or a one-dimensional array. In one embodiment, the discrete portions of the patterned photoresist layer 137 can be arranged as a two-dimensional periodic array or a one-dimensional periodic array. The horizontal cross-sectional shape of each discrete portion of the patterned photoresist layer 137 can be circular, elliptical, polygonal, of a rounded polygonal shape, or of any generally two-dimensional closed curvilinear shape having a periphery.

An etch process can be performed to etch unmasked portions of the layer stack above the buffer layer 24. The etch process may include, and/or may consist of, at least one isotropic wet etch step in case the lateral dimension of each patterned portion of the patterned photoresist layer 137 is greater than the total thickness of the layer stack, for example, by a factor of 1.5 or more. Alternatively or additionally, the etch process may include, and/or may consist of, at least one anisotropic etch step (such as at least one reactive ion etch process). In one embodiment, the etch process may include a plurality of anisotropic etch steps that sequentially etches two or more of the various material layers within the layer stack. In one embodiment, the etch process may consist of a single anisotropic etch process that includes a plurality of anisotropic etch steps that are sequentially performed to etch through each layer of the layer stack until a top surface of the buffer layer 24 is physically exposed.

Portions of the layer stack that are not masked by the patterned photoresist layer 137 are etched by the etch process. Remaining patterned portions of the layer stack (and any patterned upper portions of the buffer layer 24) comprise the mesa structures 140. Specifically, each contiguous set of remaining portions of the layer stack and optionally an underlying patterned portion of the buffer layer 24 that underlies a respective discrete portion of the patterned photoresist layer 137 constitutes a mesa structure 140. Each mesa structure 140 has a top surface that contacts a bottom surface of an overlying portion of the patterned photoresist layer 137. Each mesa structure 140 has at least one sidewall that continuously extends from the top surface to an optionally recessed horizontal surface of the buffer layer 24. Generally, the mesa structures 140 can have shapes of frustums or cylinders with variable, or uniform, horizontal cross-sectional shapes. Each sidewall of the mesa structures 140 may be vertical, or may have a taper angle with respect to a vertical direction (which is perpendicular to the interfaces between the various layers within the layer stack. The taper angle may be in a range from 0 degree to 50 degrees, such as from 0 degrees to 30 degrees. The maximum lateral dimension of the top surface of each mesa structure 140 may be in a range from 100 nm to 5 microns, such as 0.5 to 3 microns, for example 1 to 2 microns, although lesser and greater dimensions can also be employed. In one embodiment, the top surface of each mesa structure 140 is narrower than the bottom surface of the mesa structure 140.

Each mesa structure 140 can be formed over the buffer layer 24 (which can be the a doped compound semiconductor layer). Each mesa structure 140 can include, from bottom to top, a first-conductivity-type compound semiconductor layer 132, an active layer stack 134 configured to emit light at a peak wavelength, a second-conductivity-type compound semiconductor layer 136, and a transparent conductive oxide layer 38. Each first-conductivity-type compound semiconductor layer 132 comprises a patterned portion of the continuous first-conductivity-type semiconductor material layer 132L. Each active layer stack 134 comprises a patterned portion of the continuous active layer 134L. Each second-conductivity-type compound semiconductor layer 136 comprises a patterned portion of the continuous second-conductivity-type semiconductor material layer 136L. Each transparent conductive oxide layer 38 comprises a patterned portion of the continuous transparent conductive oxide layer 38L. Each layer within a mesa structure 140 can be formed as a planar layer having a uniform thickness throughout and having a respective horizontal top surface and a respective horizontal bottom surface. The photoresist layer 137 can be subsequently removed, for example, by ashing.

Figure 40:
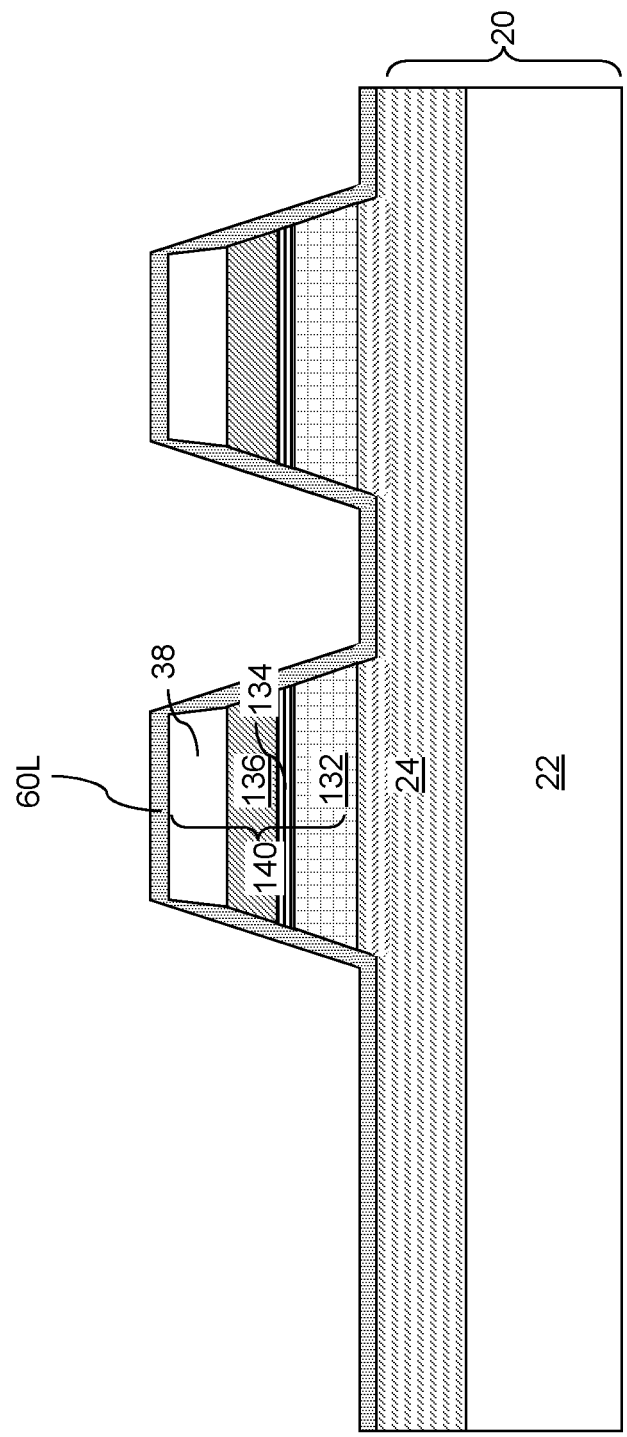

Referring to FIG. 40, a continuous dielectric material layer 60L is formed over the mesa structures 140 and over the physically exposed horizontal surface of the buffer layer 24. The continuous dielectric material layer 60L can include the same material as, and can have the same thickness as, the dielectric material layer 60 described above.

Figure 41:
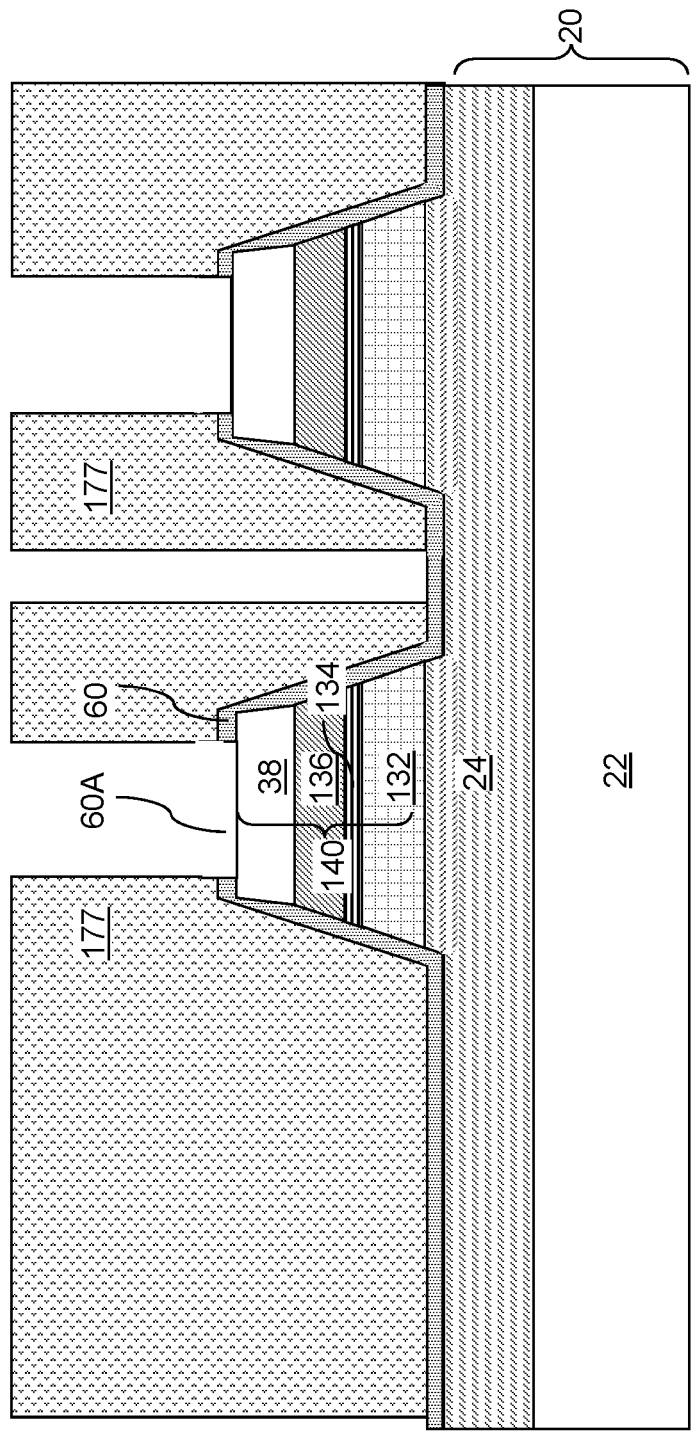

Referring to FIG. 41, a photoresist layer 177 can be applied over the continuous dielectric material layer 60L, and can be lithographically patterned to form discrete patterned photoresist material portions having a respective opening therethrough above an underling mesa structure 140. An etch process can be performed to etch unmasked portions of the continuous dielectric material layer 60L employing the photoresist layer 177 as an etch mask to form openings 60A in the dielectric material layer 60L exposing the top of the transparent conductive oxide layer 38 at the top of each mesa structure 140. The etch process may include an anisotropic etch process and/or an isotropic etch process. Each patterned portion of the continuous dielectric material layer 60L constitutes a dielectric material layer 60. The opening 60A is located in the dielectric material layer 60 over a center region of a respective underlying mesa structure 140. The photoresist layer 177 portions are removed by any suitable method, such as ashing.

Figure 42:
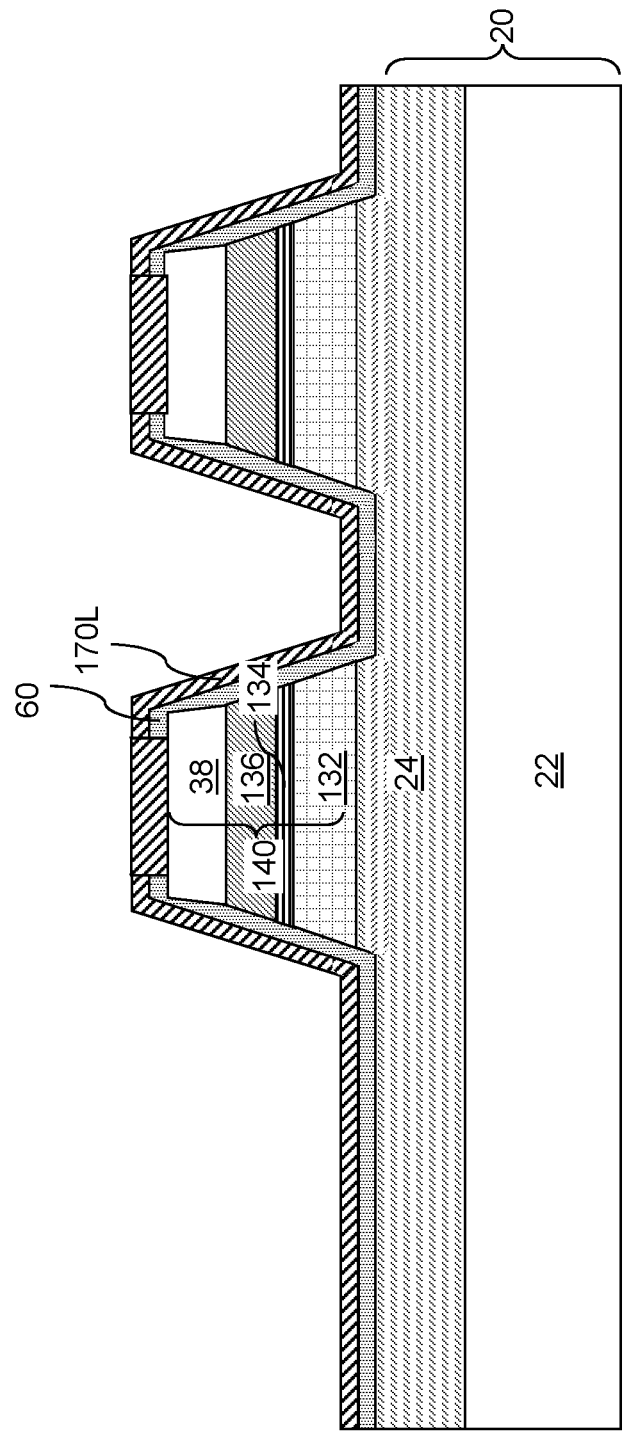

Referring to FIG. 42, a continuous reflector layer 170L is formed over the dielectric material layer 60. The continuous reflector layer 170L can include the same material as, and can have the same thickness as, the reflector layer 70 described above. A portion of the continuous reflector layer 170L at least partially fills the opening 60A is located in the dielectric material layer 60 to electrically contact the transparent conductive oxide layer 38.

Figure 43:
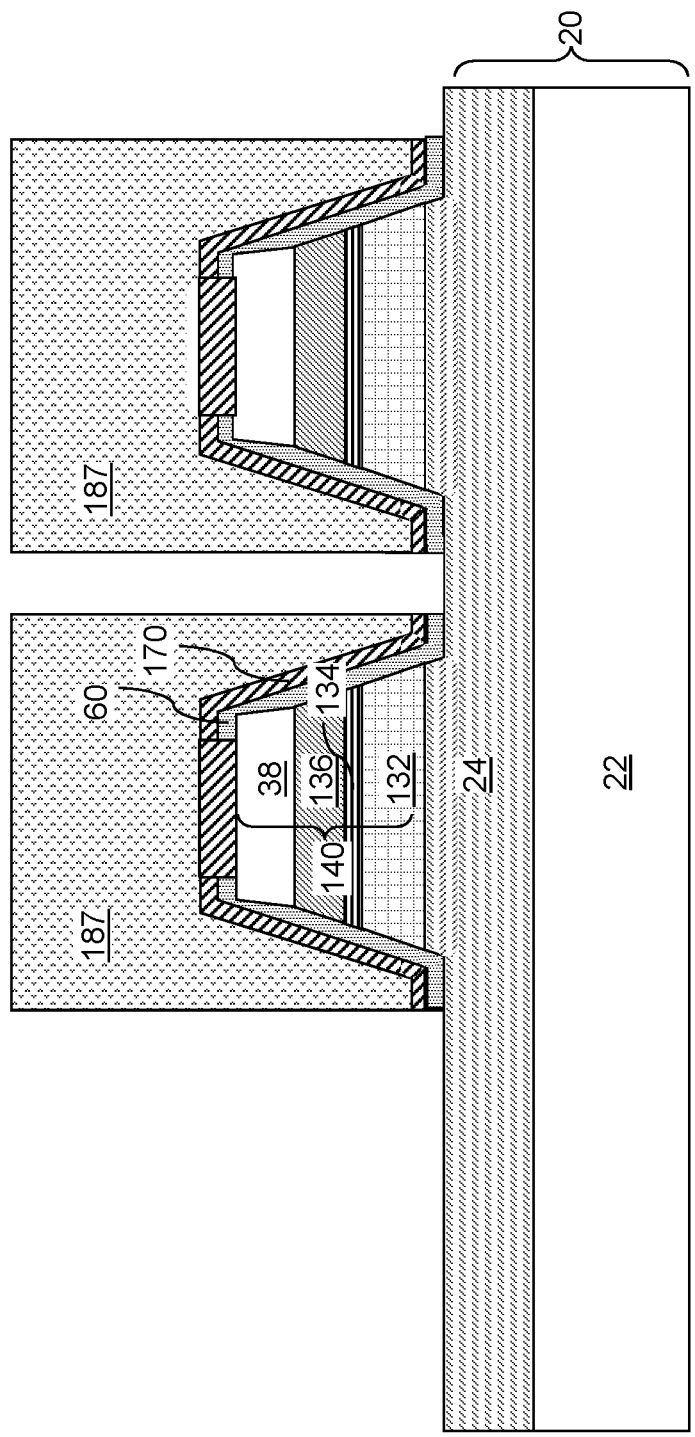

Referring to FIG. 43, a photoresist layer 187 can be applied over the continuous reflector layer 170L, and can be lithographically patterned to form discrete patterned photoresist material portions covering an underling mesa structure 140. The area defined by the outer periphery of a discrete patterned photoresist material portion covers the entire area of an underlying mesa structure 140 and may laterally extend past the edge of each underlying mesa structure 140. Regions of the continuous reflector layer 170L located between adjacent mesa structures 140 are exposed between the discrete patterned photoresist material portions. The exposed portions of the continuous reflector layer 170L are removed by isotropic and/or anisotropic etching using photoresist layer 187 portions as an etch mask. Each patterned portion of the continuous reflector layer 170L constitutes a reflector layer 70. Portions of the dielectric material layer 60 that are exposed between each reflector layer 70 may also be optionally removed by etching. The photoresist layer 187 portions are removed by any suitable method, such as ashing.

Each stack of a dielectric material layer 60 and a reflector layer 170 may overlie only one mesa structure 140, and may be laterally spaced apart from neighboring stacks of a dielectric material layer 60 and a reflector layer 170. In one embodiment, a bottom horizontal portion of each dielectric material layer 60 can include a horizontal top surface and a horizontal bottom surface, and can contact a top surface of the buffer layer 24. In one embodiment, an anisotropic etch process can be employed to pattern the continuous reflector layer 170L and the dielectric material layer 60. In one embodiment, each reflector layer 170 can have an inner sidewall that overlies a respective mesa structure 140. In one embodiment, each reflector layer 170 can have an outer sidewall that is located outside an area of the mesa structure 140, and is vertically coincident with an outer sidewall of the bottom horizontal portion of a dielectric material layer 60 that underlies the reflector layer 170. Each dielectric material layer 60 can laterally surround a respective mesa structure 140, and can contact each sidewall of the layers within the respective mesa structure 140. In one embodiment, each dielectric material layer 60 can include an upper portion that overlies a peripheral region of the top surface of a respective mesa structure 140.

Figure 44:
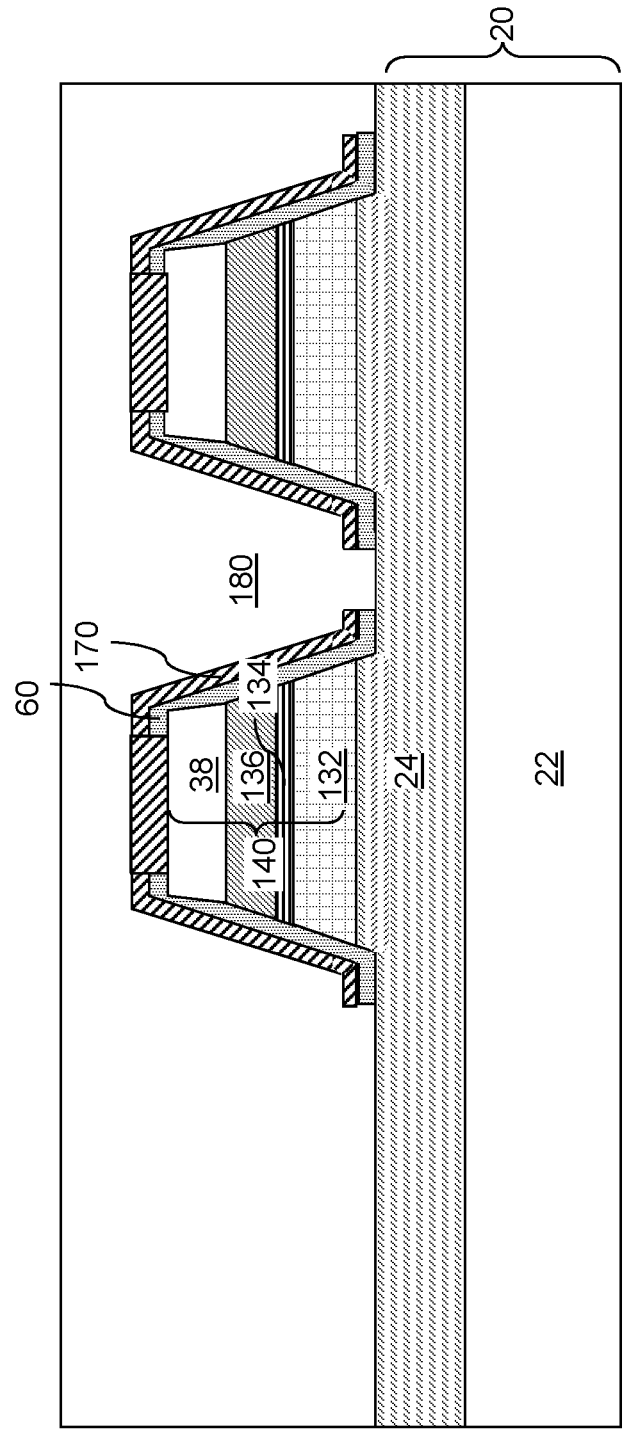

Referring to FIG. 44, a dielectric matrix layer 180 can be formed around the mesa structures 140 and the stacks of a dielectric material layer 60 and a reflector layer 170. The dielectric matrix layer 180 can include a planarizable dielectric material such as an organic polymer or silicon oxide, or can include a self-planarizing dielectric material such as flowable oxide (FOX). In case the dielectric matrix layer 180 includes a planarizable dielectric material, a chemical mechanical polishing (CMP) process can be performed to provide a planar top surface that is vertically spaced from topmost surfaces of the reflector layers 170 and the mesa structures 140. In case the dielectric matrix layer 180 is formed by application of a self-planarizing dielectric material, the thickness of the applied dielectric material can be adjusted so that the top surface of the dielectric matrix layer 180 overlies the top surfaces of the reflector layers 170 and the mesa structures 140.

Figure 45:
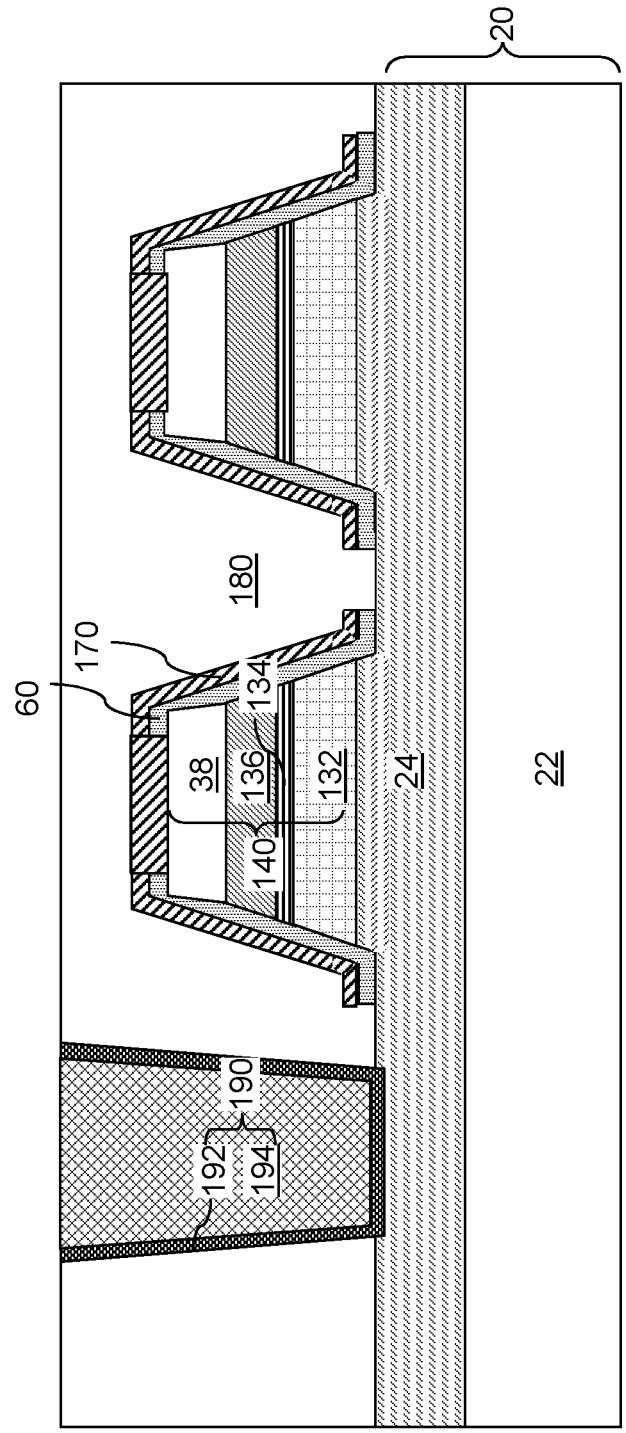

Referring to FIG. 45, a via cavity can be formed through the dielectric matrix layer 180. For example, a photoresist layer (not shown) can be applied over the dielectric matrix layer 180, and can be lithographically patterned to form an opening therethrough. An anisotropic etch process can be performed to etch through the dielectric matrix layer 180 until a surface of the buffer layer 24 is physically exposed to form the via cavity. A plurality of via cavities may be formed such that each light emitting diode to be subsequently formed has a respective contact via structure. The photoresist layer can be subsequently removed, for example, by ashing.

At least one conductive material can be deposited in each via cavity. The at least one conductive material can include, for example, a metallic liner material such as TiN, TaN, or WN and a metallic fill material such as W, Cu, Mo, Al, Ag, Co, Au, Ni, Sn, other elemental metals, and/or alloys or combinations thereof. A CMP process and/or a selective recess etch can be performed to remove portions of the at least one conductive material from above the top surface of the dielectric matrix layer 180. A contact via structure 190 is formed within each via cavity. Each contact via structure 190 can include a metallic liner 192 that includes a remaining portion of the metallic liner material and a metallic fill material portion 194 that includes a remaining portion of the metallic fill material. Each contact via structure 190 vertically extends through the dielectric matrix layer 180 and contacts the buffer layer 24.

Figure 46:
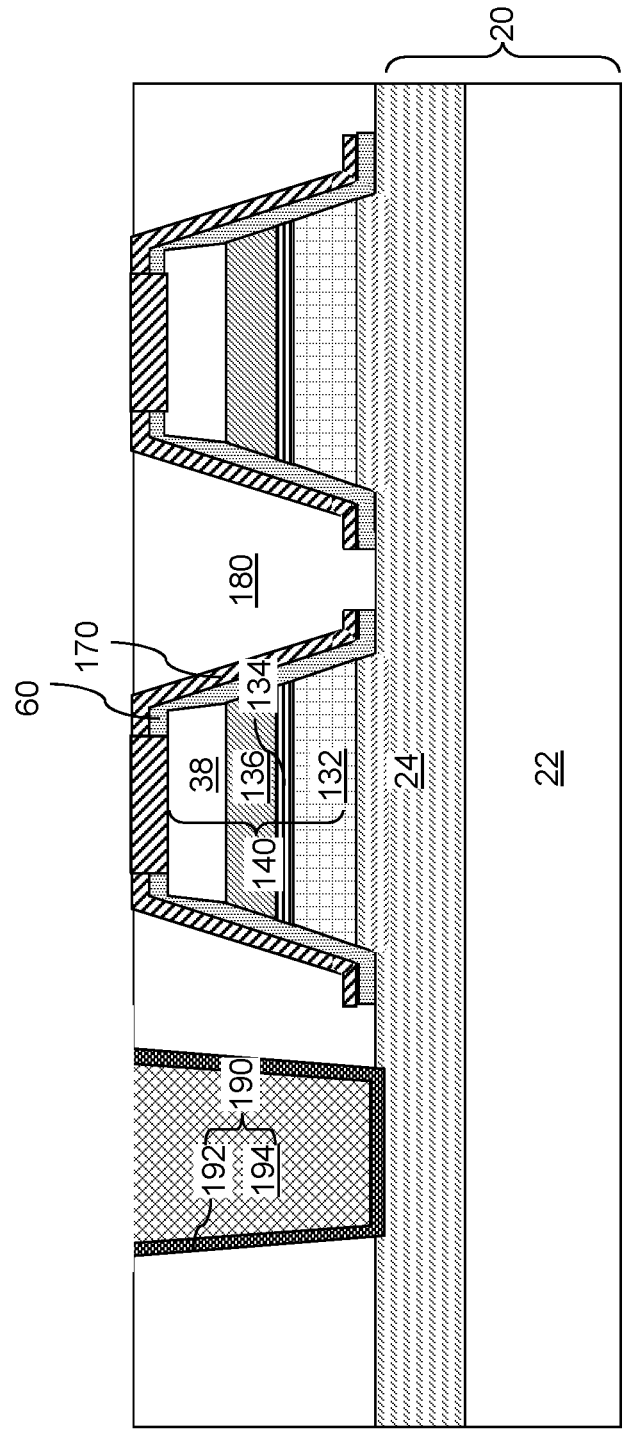

Referring to FIG. 46, the top surface of the dielectric matrix layer 180 and the contact via structure 190 can be vertically recessed by a CMP process and/or an etch process, to expose the upper surface of the reflector layers 170 located over each mesa structure 140. For example, the same or different CMP process from the CMP process shown in FIG. 45 may be used in this step.

Figure 47:
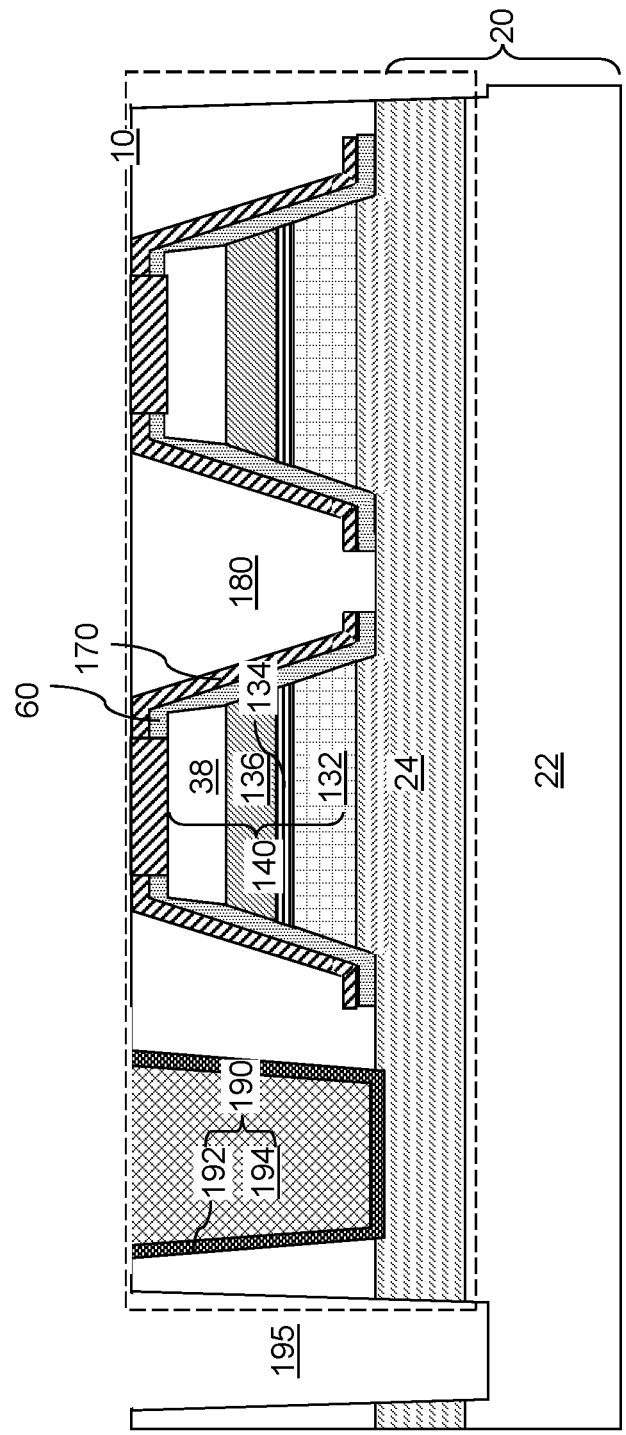

Referring to FIG. 47, isolation trenches 195 can be formed through the dielectric matrix layer 180, the buffer layer 24, and optionally into an upper portion of the support substrate 22. For example, a photoresist layer (not shown) can be applied over the dielectric matrix layer 180, and can be lithographically patterned to form openings between each neighboring pair of light emitting diodes 10. An anisotropic etch process can be performed to etch through portions of the dielectric matrix layer 180 and the buffer layer 24 that are not masked by the patterned photoresist layer. The isolation trenches 195 can be formed as channels that laterally separate neighboring pairs of light emitting diodes 10. Each light emitting diode 10 may contain one or more mesa structures 140, such as two or more, such as two to ten mesa structures 140, and at least one contact via structure 190. Thus, either plural mesas 140 or only one mesa 140 may be located between adjacent isolation trenches 195. Optionally, the light emitting diodes 10 may be singulated, for example, by scribing. Alternatively, the combination of the support substrate 22 and the light emitting diodes 10 may be retained as a unit structure.

Figure 48:
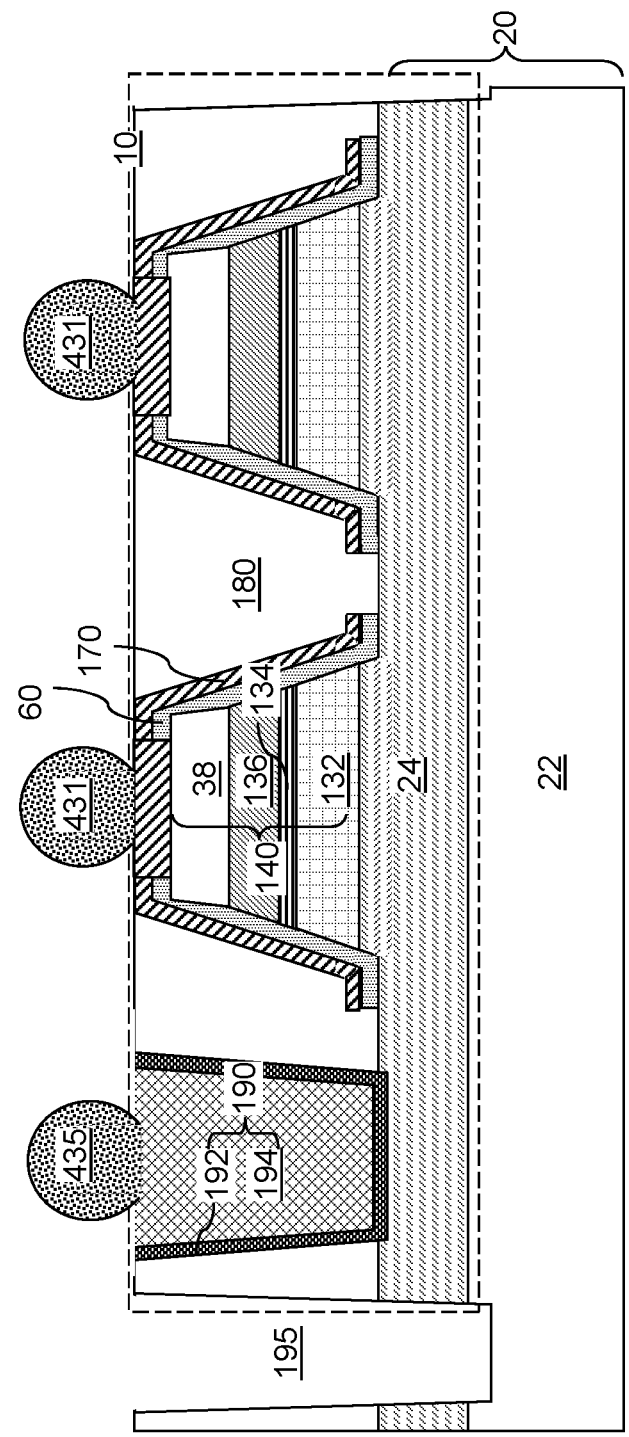

Referring to FIG. 48, conductive bonding structures (431, 435) can be formed on the reflector layers 170 and the contact via structures 190. The conductive bonding structures (431, 435) can include first conductive bonding structures 431 that are formed in electrical contact with to a respective one of the reflector layers 170, and second conductive bonding structures 435 that are formed in electrical contact with a respective one of the contact via structures 190. The conductive bonding structures (431, 435) can have the same material composition as the conductive bonding structures 431 that are described above.

Figure 49:
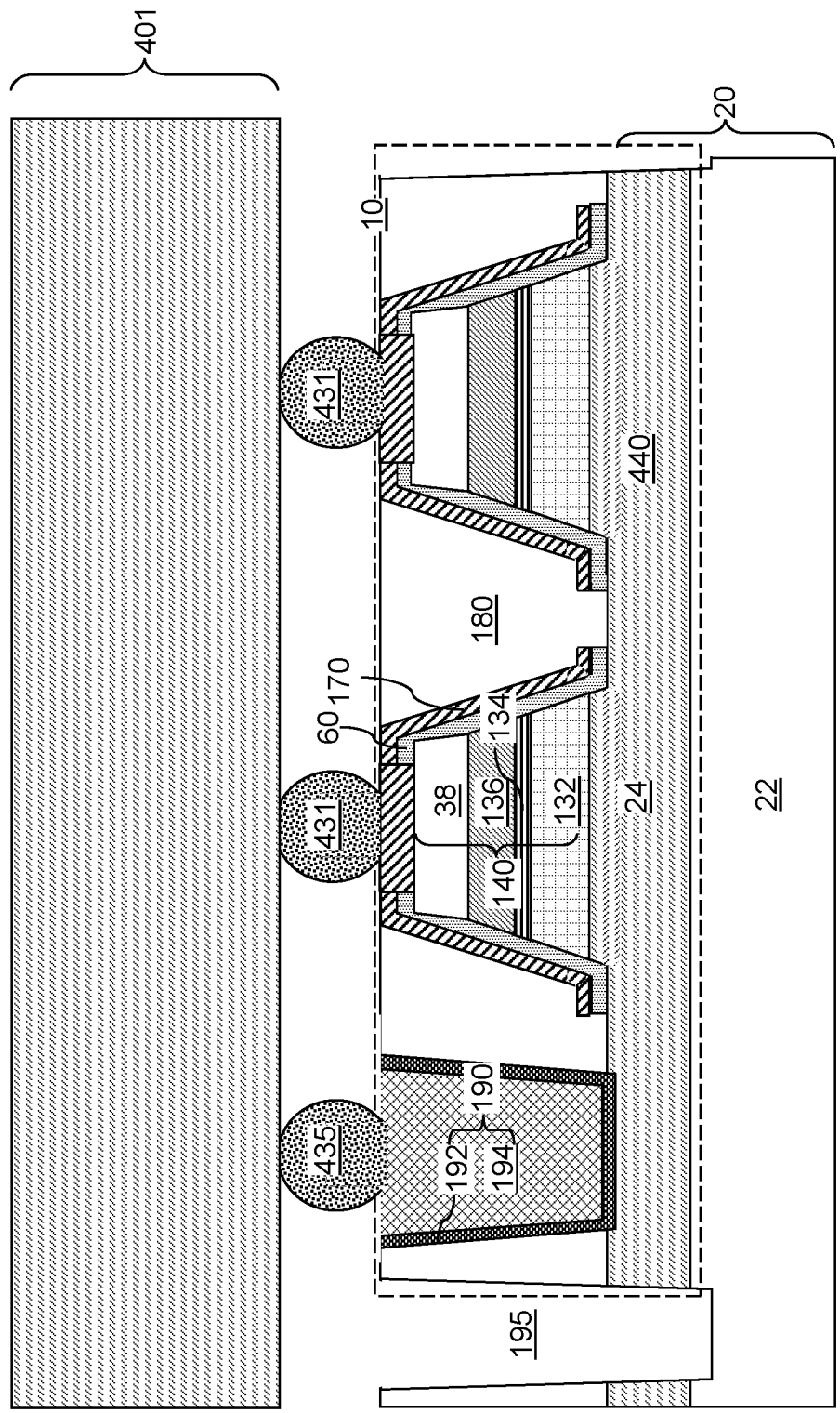

Referring to FIG. 49, the conductive bonding structures (431, 435) may be attached to the backplane 401 described above. The conductive bonding structures (431, 435) may be bonded to bonding pads or to bonding structures (e.g., solder balls) located on the backplane. In this embodiment, each light emitting diode 10 may emit the same color light (e.g., have the same peak emission wavelength). Plural light emitting diodes 10 formed on separate support substrates 22 may be electrically connected to the backplane to form a multicolor direct view display device. If desired, the support substrate 22 may be removed after bonding the light emitting diode 10 to the backplane 401 or the support substrate 22 may be retained in the final light emitting device.

Referring to all drawings and according to various embodiments of the present disclosure, a light emitting device is provided, which comprises a substrate 20 including a doped compound semiconductor layer (as embodied as a buffer layer 24); a mesa structure 140 located on the doped compound semiconductor layer 24 and comprising a first-conductivity-type compound semiconductor layer 132, an active layer stack 134 configured to emit light at a peak wavelength, a second-conductivity-type compound semiconductor layer 136, and a transparent conductive oxide layer 38; and a dielectric material layer 60 laterally surrounding the mesa structure 140 and including an upper portion that overlies a peripheral region of the mesa structure 140 and extending above the transparent conductive layer, wherein an opening 60A in the upper portion of the dielectric material layer 60 is located over a center region of the mesa structure 140.

In one embodiment, the dielectric material layer 60 comprises a bottom horizontal portion including a horizontal top surface and a horizontal bottom surface, which contacts a top surface of the doped compound semiconductor layer 24. In one embodiment, a reflector layer 170 laterally surrounds, and contacts an outer sidewall of, the dielectric material layer 60. In one embodiment, the reflector layer 170 is located in the opening 60A in the upper portion of the dielectric material layer 60, and electrically contacts the transparent conductive oxide layer 38 through the opening 60A in the upper portion of the dielectric material layer 60. In one embodiment, an outer sidewall of the reflector layer 170 that is located outside an area of the mesa structure 140 is vertically coincident with an outer sidewall of the bottom horizontal portion of the dielectric material layer 60.

In one embodiment, a conductive bonding structure 431 overlies, and is electrically connected to, the transparent conductive oxide layer 38 and overlies the opening through the upper portion of the dielectric material layer 60. In one embodiment, the conductive bonding structure 431 comprises a solder ball.

In one embodiment, a reflector layer 170 laterally surrounds the mesa structure 140 and contacts an outer sidewall of the dielectric material layer 60 and is electrically isolated from the conductive bonding structure 431. In one embodiment, a reflector layer 170 laterally surrounds the mesa structure 140 and contacts an outer sidewall of the dielectric material layer 60 and the conductive bonding structure 431.

In one embodiment, a dielectric matrix layer 180 laterally surrounds the dielectric material layer 60, and a contact via structure 190 vertically extends through the dielectric matrix layer 180 and electrically contacting the doped compound semiconductor layer 24. A second conductive bonding structure 435 overlies and is electrically connected to the contact via structure 190. In one embodiment, the device also includes a backplane 401 electrically connected to the first and second conductive bonding structures (431, 435).

In one embodiment, each layer within the mesa structure 140 comprises a sidewall that contacts an inner sidewall of the dielectric material layer 60. In one embodiment, each light emitting diode 10 can include a single mesa structure 140 or a plurality of mesa structures 140.

In one embodiment, plural mesa structures 140 are located on the doped compound semiconductor layer 24, and isolation trenches 195 are located between the plural mesa structures 140 and extending through the doped compound semiconductor layer 24. In one embodiment, the light emitting diode 10 includes plural mesa structures 140 located between adjacent isolation trenches 195.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device, comprising:
  a substrate including a doped compound semiconductor layer;
  a mesa structure located on the doped compound semiconductor layer and comprising a first-conductivity-type compound semiconductor layer, an active layer stack configured to emit light at a peak wavelength, a second-conductivity-type compound semiconductor layer, and a transparent conductive oxide layer, wherein the mesa structure comprises a tapered or curved sidewall that continuously extends from a top surface of the mesa structure to a top surface of the doped compound semiconductor layer; and
  a dielectric material layer laterally surrounding the mesa structure and including an upper portion that overlies a peripheral region of the mesa structure and extending above the transparent conductive oxide layer, wherein an opening in the upper portion of the dielectric material layer is located over a center region of the mesa structure.

2. The light emitting device of claim 1, wherein plural mesa structures are located on the doped compound semiconductor layer.

3. The light emitting device of claim 2, further comprising isolation trenches located between the plural mesa structures and extending through the doped compound semiconductor layer.

4. The light emitting device of claim 3, wherein a light emitting diode includes plural mesa structures located between adjacent isolation trenches.

5. The light emitting device of claim 1, wherein:
  the mesa structure comprises a patterned growth mask layer; and
  the tapered or curved sidewall includes a sidewall of the patterned growth mask layer, a sidewall of the first-conductivity-type compound semiconductor layer, a sidewall of the active layer stack, a sidewall of the second-conductivity-type compound semiconductor layer, and a sidewall of the transparent conductive oxide layer.

6. The light emitting device of claim 5, wherein the mesa structure further comprises a top contact electrode contacting a top surface of the transparent conductive oxide layer.

7. The light emitting device of claim 6, further comprising a first conductive bonding structure overlying and electrically connected to the transparent conductive oxide layer and overlying the opening through the upper portion of the dielectric material layer and contacting a top surface of the top contact electrode.

8. The light emitting device of claim 7, wherein the first conductive bonding structure comprises a solder ball.

9. The light emitting device of claim 6, wherein the tapered or curved sidewall of the mesa structure includes a sidewall of the top contact electrode.

10. The light emitting device of claim 6, wherein the top contact electrode comprises a diffusion barrier layer comprising titanium, titanium-tungsten, titanium-platinum or tantalum.

11. The light emitting device of claim 1, further comprising:
  a dielectric matrix layer laterally surrounding the dielectric material layer; and
  a contact via structure vertically extending through the dielectric matrix layer and electrically contacting the doped compound semiconductor layer.

12. The light emitting device of claim 11, further comprising a second conductive bonding structure overlying and electrically connected to the contact via structure.

13. The light emitting device of claim 12, further comprising a backplane electrically connected to the first and the second conductive bonding structures.

14. The light emitting device of claim 1, wherein the dielectric material layer comprises a bottom horizontal portion including a horizontal top surface and a horizontal bottom surface which contacts a top surface of the doped compound semiconductor layer.

15. The light emitting device of claim 14, further comprising a reflector layer laterally surrounding and contacting an outer sidewall of the dielectric material layer.

16. The light emitting device of claim 1, further comprising a reflector layer laterally surrounding and contacting an outer sidewall of the dielectric material layer and contacting a center portion of a top surface of the transparent conductive layer through the opening in the upper portion of the dielectric material layer.

17. The light emitting device of claim 16, wherein all surfaces of the transparent conductive layer is in contact with a respective one of a top surface of the second-conductivity-type compound semiconductor layer, a surface of the dielectric material layer, or a surface of the reflector layer.

18. The light emitting device of claim 1, wherein each layer within the mesa structure comprises a sidewall that contacts an inner sidewall of the dielectric material layer.

19. A light emitting device, comprising:
  a substrate including a doped compound semiconductor layer;
  a mesa structure located on the doped compound semiconductor layer and comprising a first-conductivity-type compound semiconductor layer, an active layer stack configured to emit light at a peak wavelength, a second-conductivity-type compound semiconductor layer, and a transparent conductive oxide layer;
  a dielectric material layer laterally surrounding the mesa structure and including an upper portion that overlies a peripheral region of the mesa structure and extending above the transparent conductive oxide layer, wherein an opening in the upper portion of the dielectric material layer is located over a center region of the mesa structure; and
  a reflector layer laterally surrounding and contacting an outer sidewall of the dielectric material layer,
  wherein the dielectric material layer comprises a bottom horizontal portion including a horizontal top surface and a horizontal bottom surface which contacts a top surface of the doped compound semiconductor layer, and wherein the reflector layer is located in the opening in the upper portion of the dielectric material layer, and electrically contacts the transparent conductive oxide layer through the opening in the upper portion of the dielectric material layer.

20. A light emitting device, comprising:

a substrate including a doped compound semiconductor layer;

a mesa structure located on the doped compound semiconductor layer and comprising a first-conductivity-type compound semiconductor layer, an active layer stack configured to emit light at a peak wavelength, a second-conductivity-type compound semiconductor layer, and a transparent conductive oxide layer;

a dielectric material layer laterally surrounding the mesa structure and including an upper portion that overlies a peripheral region of the mesa structure and extending above the transparent conductive oxide layer, wherein an opening in the upper portion of the dielectric material layer is located over a center region of the mesa structure; and a reflector layer laterally surrounding and contacting an outer sidewall of the dielectric material layer, wherein the dielectric material layer comprises a bottom horizontal portion including a horizontal top surface and a horizontal bottom surface which contacts a top surface of the doped compound semiconductor layer, and wherein an outer sidewall of the reflector layer that is located outside an area of the mesa structure is vertically coincident with an outer sidewall of the bottom horizontal portion of the dielectric material layer.

21. A method of forming a light emitting device, comprising:

forming a doped compound semiconductor layer on a substrate;

forming a mesa structure over the doped compound semiconductor layer, wherein the mesa structure comprises a first-conductivity-type compound semiconductor layer, an active layer stack configured to emit light at a peak wavelength, a second-conductivity-type compound semiconductor layer, and a transparent conductive oxide layer;

forming a dielectric material layer laterally surrounding the mesa structure and including an upper portion that overlies a peripheral region of the mesa structure;

forming an opening through the upper portion of the dielectric material layer over a center region of the mesa structure to expose the transparent conductive oxide layer;

forming a continuous reflector layer over the continuous dielectric material layer and in the opening such that the continuous reflector layer electrically contacts the transparent conductive oxide layer; and patterning the continuous reflector layer to form a reflector layer that laterally surrounds the mesa structure and the dielectric material layer.

22. The method of claim 21, further comprising:

forming a dielectric matrix layer laterally surrounding the dielectric material layer; and forming a contact via structure vertically extending through the dielectric matrix layer and contacting the doped compound semiconductor layer.

23. The method of claim 22, further comprising forming isolation trenches located between the plural mesa structures and extending through the doped compound semiconductor layer and through the dielectric matrix layer.

24. The method of claim 21, further comprising forming a conductive bonding structure on a physically exposed surface of the reflector layer.

25. The method of claim 21, wherein an outer sidewall of the reflector layer that is located outside an area of the mesa structure is vertically coincident with an outer sidewall of the bottom horizontal portion of the dielectric material layer.

26. The method of claim 21, further comprising:

forming a layer stack comprising a continuous first-conductivity-type compound semiconductor layer, a continuous active layer stack, a second-conductivity-type compound semiconductor layer, and a continuous transparent conductive oxide layer;

forming a patterned photoresist layer that masks portion of the layer stack; and etching portions of the layer stack that are not masked by the patterned photoresist layer, wherein a remaining patterned portion of the layer stack comprises the mesa structure.

\* \* \* \* \*